United States Patent
Ooishi et al.

(10) Patent No.: US 6,618,319 B2
(45) Date of Patent: *Sep. 9, 2003

(54) SYNCHRONOUS SEMICONDUCTOR MEMORY DEVICE ALLOWING CONTROL OF OPERATION MODE IN ACCORDANCE WITH OPERATION CONDITIONS OF A SYSTEM

(75) Inventors: Tsukasa Ooishi, Hyogo (JP); Masatoshi Ishikawa, Hyogo (JP); Shigeki Tomishima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/209,894

(22) Filed: Aug. 2, 2002

(65) Prior Publication Data

US 2003/0147298 A1 Aug. 7, 2003

Related U.S. Application Data

(60) Continuation of application No. 09/641,901, filed on Aug. 18, 2000, now Pat. No. 6,438,066, which is a division of application No. 09/305,748, filed on May 6, 1999, now Pat. No. 6,125,078.

(30) Foreign Application Priority Data

Nov. 27, 1998 (JP) .......................................... 10-337799

(51) Int. Cl.[7] ............................... G11C 8/00; G11C 7/00
(52) U.S. Cl. ......................................... 365/233; 365/194
(58) Field of Search ....................... 365/230.03, 230.06, 365/194, 233

(56) References Cited

U.S. PATENT DOCUMENTS

| | | | |
|---|---|---|---|
| 5,384,735 A | 1/1995 | Park et al. | 365/230.06 |
| 5,497,355 A | 3/1996 | Mills et al. | 365/189.05 |
| 5,892,730 A | 4/1999 | Sato et al. | 365/233 |
| 5,920,511 A | 7/1999 | Lee et al. | 365/233 |
| 5,923,613 A | 7/1999 | Tien et al. | 365/233 |
| 5,991,232 A | 11/1999 | Matsumura et al. | 365/233 |
| 6,111,807 A | 8/2000 | Ooishi | 365/230.03 |
| 6,144,617 A | 11/2000 | Takai | 365/233 |
| 6,147,926 A | 11/2000 | Park | 365/233 |
| 6,151,272 A | 11/2000 | La et al. | 365/233 |

*Primary Examiner*—Trong Phan
(74) *Attorney, Agent, or Firm*—McDermott, Will & Emery

(57) ABSTRACT

For a write operation, a synchronous semiconductor memory device in a single-data-rate SDRAM operation mode selects a memory cell column in accordance with a column select signal produced from a write clock produced in synchronization with an external clock signal without shifting the write clock. In a double-data-rate SDRAM operation mode, the synchronous semiconductor memory device selects the memory cell column in accordance with the column select signal produced from the write clock produced in synchronization with the external clock signal and shifted by selected clocks.

4 Claims, 46 Drawing Sheets

FIG. 23 OPERATION WAVEFORM OF DDR-SDRAM (BURST LENGTH = 8, CAS LATENCY = 2, NORMAL MODE)

INPUT CONTROL CIRCUIT

OUTPUT CONTROL CIRCUIT

SYNCHRONOUS SEMICONDUCTOR MEMORY DEVICE ALLOWING CONTROL OF OPERATION MODE IN ACCORDANCE WITH OPERATION CONDITIONS OF A SYSTEM

RELATED APPLICATIONS

This application is a Continuation of U.S. Patent Application Ser. No. 09/641,901, filed Aug. 18, 2000 now U.S. Pat. No. 6,438,066; which is a Divisional of Application Ser. No. 09/305,748, filed May 6, 1999, now U.S. Pat. No. 6,125,078.

BACKGROUND OF THE INVENTION

1. Field of the Invention

The present invention relates to a semiconductor memory device, and particularly a structure of a data I/O (input/output) portion of a synchronous semiconductor memory device which operates in synchronization with an external clock signal.

2. Description of the Background Art

As a result of increase in operation speed of microprocessors (which will be referred to as "MPUs" hereinafter) in recent years, fast access to DRAM (Dynamic Random Access Memory) used as main storage devices has been desired or demanded. For meeting such demands, synchronous DRAMs (which will be referred to as "SDRAMs" hereinafter) or the like operating in synchronization with clock signals have been used.

The internal operation of the SDRAM or the like is divided into a row-related operation and a column-related operation for control.

For allowing further fast operations, the SDRAM has employed a bank structure, in which a memory cell array is divided into banks operating independently of each other. In this structure, the operation of each bank is divided into a row-related operation and a column-related operation which are controlled independently of each other.

However, some of present systems require further fast operations of the semiconductor memory devices.

Meanwhile, some of other systems do not require such fast operations. Accordingly, in view of power consumption or the like, it is not desirable to use the above SDRAM, which is designed for the system requiring the maximum operation speed, for the system allowing a lower operation frequency without changing the specifications for the fastest operation.

In some systems, the synchronous operation of the whole system is performed in such a manner (unidirectional manner) that a reference clock signal for synchronous operation is issued only from a controller side. Another manner (bidirectional manner) may also be employed, in which case synchronous clock signals are equally distributed to a control device and a semiconductor memory device forming the system.

Accordingly, it may be necessary to change the operation mode of the SDRAM itself for the faster operations in the above two cases in view of an influence of skew in clock signals and others.

For the above change, different designs may be employed for the specific purposes, respectively. However, this increases cost for such designs and manufacturing.

As already described, increase in throughput of the DRAM is a major factor in improving the performance of system. For this reason, the SDRAM which performs input/output of data in synchronization with an externally supplied clock has become mainstream instead of an EDO type which is the previous mainstream of DRAMs.

In this SDRAM type, data, addresses and various commands are supplied to a chip in synchronization with rising edges of the externally supplied clock. Also, internal processing of the memory chip is partially performed in synchronization with the clock, and output is performed in synchronization with edges of the external clock.

However, it has been pointed out that further higher throughput is required in systems used for handling data such as image data at a high speed.

As a new input/output method of the DRAM for the above purpose, a double-data-rate synchronous DRAM, which will be referred to as a "DDR-SDRAM" hereinafter, has been proposed. The DDR-SDRAM is externally supplied with a strobe clock for data, and takes in the data in synchronization with both the rising and falling edges. Further, it internally produces and sends a strobe clock in synchronization with the data output.

A kind of DDR-SDRAM is shown in a block diagram of FIG. 48. FIG. 48 shows data input/output through only one data I/O terminal.

In a data write operation, data which is supplied from a pad 9000 in synchronization with a strobe clock is sent through an input buffer to an input register, and is temporarily held therein. In this operation, data supplied at the time of rising of the clock and data supplied at the time of falling of the clock are held in different input registers 9002 and 9003.

Depending on even and odd addresses, an input control circuit changes a connection in a connection switch 9004 between the data bus and registers.

After a latency of a data strobe clock, the data is issued onto an internal data bus in synchronization with the clock. The latency of data strobe is usually equal to two clocks. A memory array is divided in accordance with the even and odd addresses, and the divided portions receive data from the corresponding data buses for storing the data in the corresponding memory cells, respectively. In the operation of continuously writing the data, address counters 9006 and 9007 issue required addresses to the memory arrays.

In this operation, address counters 9006 and 9007 issue different patterns depending on whether the corresponding memory array is assigned even addresses or odd addresses.

A data read operation is performed in accordance with the addresses sent to the memory array from address counters 9006 and 9007, and data is read from the corresponding memory cells onto the data bus.

An output control circuit 9008 changes the connection between the data bus and output registers depending on whether the address is even or odd, and thereby stores the data in the corresponding register. In accordance with the latency already set, the output control circuit changes a state of a switch 1012 on the output side for alternately issuing the data latched in output registers 9009 and 9010 in synchronization with the rising and falling edges of the clock.

According to the above system, it is necessary to prepare different chips for the SDRAM of the single data rate type (which will be referred to as the "SDR-SDRAM" hereinafter) and the DDR-SDRAM due to difference in output method, although many similarities exist between chip internal operations of these SDRAMs.

In the operation mode of the DDR-SDRAM described above, the data which was written is externally read in the immediately subsequent read operation in some cases. In this case, an efficiency of data output is low if the operation is performed such that the data which was once written into the memory cell array is read out by accessing the memory cell in accordance with the externally supplied address signal.

SUMMARY OF THE INVENTION

An object of the invention is to provide a synchronous semiconductor memory device, which allows flexible control of a margin in chip operation with respect to an external clock signal in accordance with requirements by a system.

Another object of the invention is to provide a synchronous semiconductor memory device, which can selectively achieve a single-data-rate SDRAM and a double-data-rate SDRAM on the same chip.

Yet another object of the invention is to provide a synchronous semiconductor memory device, which can reduce a time required between data writing and subsequent data reading, and can increase an operation efficiency without requiring increase in chip area.

In summary, the invention provides a synchronous semiconductor memory device for receiving an address signal and a control signal in synchronization with an external clock signal, including a memory cell array, a first internal synchronous signal generating circuit, a second internal synchronous signal generating circuit, a control signal input circuit, a memory cell select circuit, a plurality of data I/O nodes, an interface circuit, a gate circuit and a write timing control circuit.

The memory cell array has a plurality of memory cells arranged in rows and columns. The first internal synchronous signal generating circuit generates a first internal clock signal synchronized with the external clock signal and having a higher frequency than the external clock signal. The second internal synchronous signal generating circuit generates a second internal clock signal synchronized with the external clock signal.

The control signal input circuit takes in the address signal and the control signal in synchronization with the second internal clock signal. The memory cell select circuit selects the memory cell in accordance with the address signal. The plurality of data I/O nodes are supplied with write data to be written into the memory cells.

The interface circuit is arranged between the memory cells selected by the memory cell select circuit and the data I/O nodes, and the receives the write data. The interface circuit includes a data I/O circuit for receiving the write data from each of the plurality of data I/O nodes in synchronization with the second internal clock signal in a first operation mode, and receiving the write data from each of the plurality of data I/O nodes in synchronization with the first internal clock signal in a second operation mode.

The gate circuit selectively applies the write data to a selected memory cell column. The writing timing control circuit changes timing for activating the gate circuit after the control signal instructs the write operation, depending on whether the operation is in the first operation mode or the second operation mode.

According to another aspect of the invention, a synchronous semiconductor memory device for receiving an address signal and a control signal in synchronization with an external clock signal, includes a control circuit, a memory cell array, a first internal synchronous signal generating circuit, a control signal input circuit, a memory cell select circuit, a plurality of data I/O nodes and a plurality of interface circuits.

The control circuit controls an operation of the synchronous semiconductor memory device. The memory cell array has a plurality of memory cells arranged in rows and columns.

The first internal synchronous signal generating circuit generates a first internal clock signal synchronized with the external clock signal. The control signal input circuit takes in the address signal and the control signal. The memory cell select circuit selects the memory cell in accordance with the address signal. The plurality of data I/O nodes are supplied with data for transmission to and from the memory cells.

The plurality of interface circuits are arranged between the memory cells selected by the select circuit and the data I/O nodes for transmitting the write data, respectively.

Each of the interface circuits includes a first latch circuit, a second latch circuit and a transfer circuit.

The first latch circuit is controlled by the control circuit to receive and hold, in synchronization with the first internal clock signal, the plurality of data supplied in time series to the corresponding I/O node, and to send the held data to the selected memory cells as parallel data.

The second latch circuit is controlled by the control circuit to receive and hold the plurality of data read out from the selected memory cells, and to convert the held data into time-series data in synchronization with the first internal clock signal for applying the time-series data to the corresponding I/O node.

The transfer circuit is controlled in the write operation by the control circuit for transferring the data held in the first latch circuit to the second latch circuit.

The control circuit converts the data transferred to and held in the second latch circuit into time-series data in synchronization with the first internal clock signal, and applies the time-series data to the corresponding I/O node when the control circuit receives an instruction for the read operation and a read address matching with an address applied in the immediately preceding read operation or the immediately preceding write operation.

According to still another aspect of the invention, a synchronous semiconductor memory device for receiving an address signal and a control signal based on mutually complementary first and second external clock signals includes a memory cell array, a control circuit, a memory cell select circuit, a plurality of data I/O nodes and an interface circuit.

The memory cell array has a plurality of memory cells arranged in rows and columns. The memory cell array includes a plurality of memory cell blocks.

The control circuit controls an operation of the synchronous semiconductor memory device in synchronization with the first and second external clock signals.

The memory cell select circuit is provided correspondingly to each of the memory cell blocks for selecting the plurality of memory cells at a time in accordance with the address signal. The plurality of data I/O nodes are supplied with read data from the memory cells.

The interface circuit is arranged between the memory cells selected by the memory cell select circuit and the data I/O nodes for transmitting the read data.

The interface circuit includes a plurality of holding circuit pairs and a data I/O circuit.

The plurality of holding circuit pairs are provided correspondingly to the pairs of the memory cell blocks, respectively, and hold the read data read from the plurality of memory cells.

The data I/O circuit applies the read data held in the holding circuit pairs alternatively to the corresponding data I/O nodes in synchronization with the activation edges of the first and second external clock signals in a first operation mode, and applies the read data held in one of the paired holding circuits to the corresponding data I/O node in synchronization with one of the first and second external clock signals in a second operation mode.

Accordingly, a major advantage of the invention is that a margin in the write operation can be adjusted flexibly in accordance with specifications of a system.

Another advantage of the invention is that the interface circuit operates as a cache memory, and therefore fast reading can be performed without requiring increase in chip area.

Still another advantage of the invention is that a latency or a waiting time before start of the read operation can be reduced even when the read operation is to be performed immediately after the write operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

Figure 1:
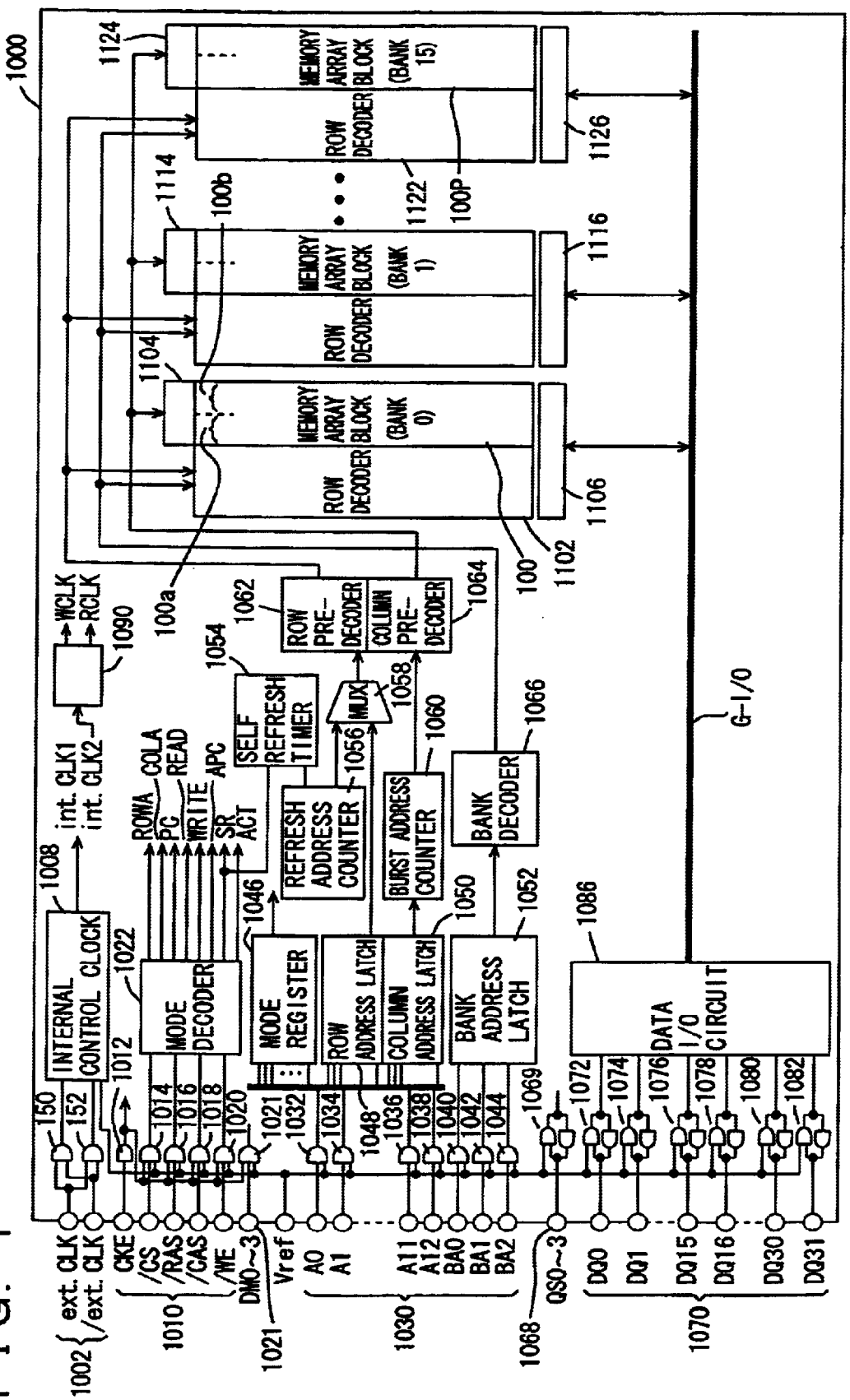
FIG. 1 is a schematic block diagram showing a structure of a synchronous semiconductor memory device 1000 of an embodiment 1 of the invention.

FIG. 1 is a schematic block diagram showing a structure of a synchronous semiconductor memory device 1000 of an embodiment 1 of the invention.

SDRAM 1000 includes an external clock signal input terminal 1002 receiving mutually complementary clock signals ext.CLK and ext./CLK which are externally supplied, clock input buffers 150 and 152 buffering the clock signals supplied to external clock terminal 1002, an internal control clock producing circuit 1008 which receives outputs of clock buffers 150 and 152, and produces first and second internal clock signals int.CLK1 and int.CLK2, and a mode decoder 1022 receiving external control signals, which are supplied to external control signal input terminals 1010, through input buffers 1012–1020 operating in accordance with second internal clock signal int.CLK2.

Internal control signal input terminals 1010 receive a signal CKE, a chip select signal/CS, a row address strobe signal /RAS, a column address strobe signal /CAS, a write enable signal /WE and data mask signals DM0–DM3.

Signal CKE is a signal for instructing enabling of input of the control signal to the chip. Unless this signal is activated, input of the control signal is not enabled, and operation as the chip does not start.

Signal /CS is a signal for determining whether a command signal is input or not. While signal /CS is active ("L" level), a command is identified in accordance with combinations of levels of other control signals at the rising edge of the clock signal.

Signal /RAS is a signal for instructing operations of row-related circuits, and signal /CAS is a signal for instructing activation of operations of column-related circuits. Signal /WE is a signal for discrimination between the write operation and the read operation.

Signals DM0–DM3 are signals which instruct masking of data transmission to and from data I/O terminals DQ0–DQ7, DQ8–DQ15, DQ16–DQ23 and DQ24–DQ31, respectively.

Mode decoder 1022 issues internal control signals for controlling operations of internal circuits of SDRAM 1000 in accordance with these external control signals. Mode decoder 1022 issues, for example, signal ROWA, COLA, ACT, PC, READ, WRITE, APC and SR as the internal control signals. Signal ROWA indicates that the row-related access is to be performed. Signal COLA indicates that the column-related access is to be performed. Signal ACT instructs activation of word lines.

Signal PC instructs the precharge operation, and instructs termination of operations of the row-related circuits. Signal READ instructs the read operation to the column-related circuits, and signal WRITE instructs the write operation to the column-related circuits.

Signal APC instructs an automatic precharge operation. When the automatic precharge operation is instructed, the precharge operation automatically start upon ending of a burst cycle. Signal SR instructs a self-refresh operation. Upon start of the self-refresh operation, a self-refresh timer starts, and the word lines will be activated to start the refresh operation upon elapsing of a predetermined time.

SDRAM 1000 further includes a self-refresh timer 1054 which starts the operation when signal SR instructs the self-refresh mode, and will instruct activation of the word lines, i.e., start of the refresh operation upon elapsing of a predetermined time, and a refresh address counter 1056 which generates the address for the refresh operation in accordance with the instruction sent from self-refresh timer 1054.

SDRAM 1000 further includes a reference potential input terminal 1022 receiving a signal VREF, based on which "H" and "L" level of the input signal are determined, a mode register 1046 which holds information relating to predetermined operation modes (e.g., data for the burst length, and information relating actually designated mode between the single-data-rate operation and the double-data-rate operation which will be described later) in accordance with combinations of the foregoing external control signals and the address signals applied through address signal input terminals 1030, a row address latch 1048 which receives the address signals through address signal input buffers 1032–1038 operating in accordance with second internal clock signal int.CLK2, and holds the supplied row address in accordance with the timing of input of the row address, a column address latch 1050 which receives address signals A0–A12, and holds the column address in accordance with the timing of input of the column address, a multiplexer 1058 which receives outputs of refresh address counter 1056 and row address latch 1048, and makes a selection to select the output of row address latch 1048 in the normal operation and to select the output of the refresh address counter 1056 in the self-refresh operation, a row predecoder 1062 which receives the output of multiplexer 1058, and predecodes the row address, a burst address counter 1060 which produces an internal column address in accordance with data of the burst length sent from mode register 1046 based on the column address held in column address latch 1050, a column predecoder 1064 which receives the output of burst address counter 1060, and predecodes the corresponding column address, a bank address latch 1052 which receives bank addresses BA0–BA2 applied to the address input terminals through input buffers 1040, 1042 and 1044 operating in accordance with internal clock signal int.CLK2, respectively and holds the designated band address value, and a bank decoder 1066 which receives the output of bank address latch 1052, and decodes the bank address.

The address signal applied to the address signal input terminals 1030 is used when operation mode information is written into the mode register, and more specifically is used for writing data into the mode register in accordance with a combination of some bits of the same. For example, set values of burst length BL and CAS latency CL are determined in accordance with the combination of a predetermined number of bits of the address signal.

Bank address signals BA0–BA2 indicate the access bank in each of the row-related and column-related access operations. More specifically, in each of the row-related and column-related access operations, bank address signals BA0–BA2 applied to address signal input terminals 1030 are taken into bank address latch 1052, and will be transmitted to the respective memory array block (banks) after being decoded by bank decoder 1066.

SDRAM 1000 further includes memory array blocks 100a–100p operating as banks 0–15, respectively, each of which can perform read/write operations independently of the others, row decoders 1102, 1112 and 1122 which select the rows (word lines) in the corresponding banks in accordance with the outputs of bank decoder 1066 and row predecoder 1062, respectively, column decoder 1104, 1114 and 1124 which select the columns (bit line pairs) in the corresponding banks in accordance with the output of column predecoder 1064, I/O ports 1106, 1116 and 1126 which apply to global I/O bus G-I/O the data read from the selected memory cells in the selected banks during the read operation, and apply to the corresponding banks the write data transmitted through bus G-I/O during the write operation, a data I/O circuit 1086 which holds the externally applied write data in the write operation, and holds the read data transmitted through bus G-I/O in the read operation, and bidirectional I/O buffers 1072–1082 for transmitting I/O data DQ0–DQ31 between data I/O circuit 1086 and data I/O terminals 1070.

Columns decoders 1104, 1114 and 1124 as well as I/O ports 1106, 1116 and 1126 operate in synchronization with a write clock signal WCLK and a read clock signal RCLK, which are produced by a timing control circuit 1090 based on terminal clock signal int.CLK2.

Bidirectional I/O buffers 1072–1082 operated in accordance with the operation mode data held in mode register 1046 as will be described later. For example, bidirectional I/O buffers 1072–1082 operate in accordance with first internal clock signal int.CLK1 in the DDR-SDRAM operation mode, and operate in accordance with second internal clock signal int.CLK2 in the SDR-SDRAM operation mode.

Signals QS0–QS3, which are transmitted to or from an I/O terminal 1068 through a bidirectional I/O buffer 1069, are signals indicating timing of data transmission to and from corresponding data I/O terminals DQ0–DQ7, DQ8–DQ15, DQ16–DQ23, and DQ24–DQ31, respectively.

In the SDR-SDRAM operation mode to be described later, signals QS0–QS3 are generally referred to as signals QS. In the DDR-SDRAM operation mode, signals QS0–QS3 are generally referred to as signals DQS.

Figure 2:
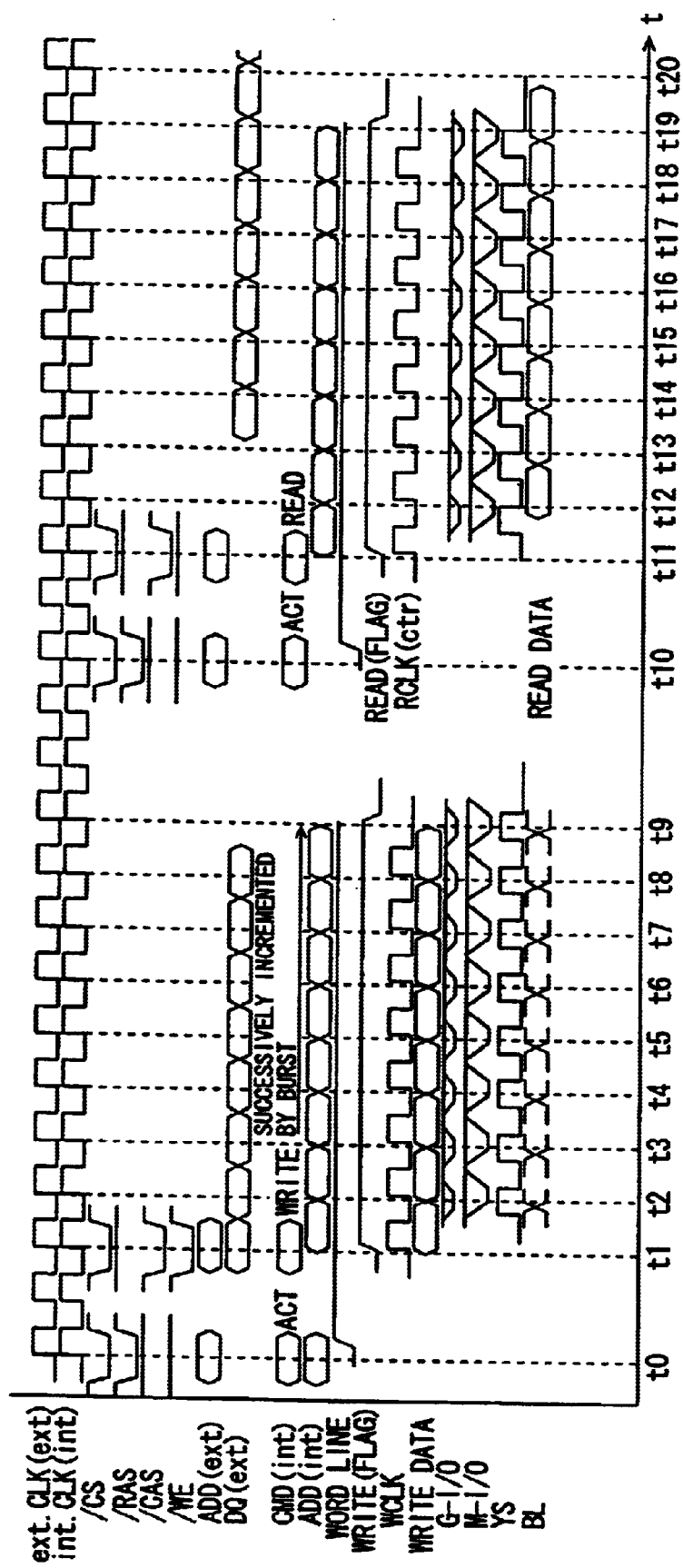
FIG. 2 is a timing chart showing a single-data-rate operation of SDRAM 1000.

FIG. 2 is a timing chart showing the single-data-rate operation of SDRAM 1000 shown in FIG. 1.

FIG. 2 shows the operation in the case where the burst length is 8, and the CAS latency of the read operation is 3.

[Write Operation in the SDR-SDRAM Mode]

A time t0, i.e., at the time of rising of external clock signal ext.CLK, signals /CS and /RAS are active ("L" level), and the bank address to be activated is designated, whereby the operation of the corresponding bank is activated.

In accordance with the address signal applied at time t0, the corresponding row is selected.

At subsequent time t1, i.e., at the time of rising of external clock signal ext.CLK, the write operation is designated in accordance with the active state ("L" level) of signals /CS, /CAS and /WE. In accordance with the address signal applied at time t1, writing of continuous data (burst write operation) is performed. Thus, signal WRITE instructing the write operation in SDRAM 1000 becomes active ("H" level), and burst address counter 1060 issues an internal address ADD(int) corresponding to the designated burst length.

In accordance with this, the write data which is applied to data I/O terminal DQ (arbitrary one of data I/O terminals 1070 will be referred to as "data I/O terminal DQ" hereinafter) at time t1 is latched in data I/O circuit 1086 in SDRAM 1000, and is transmitted to the selected memory array block through global I/O bus G-I/O.

The write data which is transmitted through an I/O line pair M-I/O in the memory array block is transmitted to bit line BL at time t2 in accordance with write clock signal WCLK produced in SDRAM 1000 and in response to activation of column select signal YS corresponding to the memory cell column selected by internal address signal ADD(int).

In accordance with the above, the data is written into the selected memory cells.

Thereafter, the data which are successively applied to data I/O terminal DQ at times t3–t9 are likewise written successively into the selected memory cells.

[Read Operation in SDR-SDRAM Operation Mode]

In the read operation, signals /CS and /RAS are activated when external clock signal ext.CLK rises at time t10, and thereby the bank selected by the bank address signal is activated.

Further, the row corresponding to the address signal applied at time t10 is selected.

At subsequent time t11 of rising of external clock signal ext.CLK, the read operation is designated in accordance with the active state ("L" level) of signals /CS and /CAS, and the column corresponding to the address signal applied at time t11 is selected. In accordance with the address signal applied at time t11, burst address counter 1060 successively outputs the burst addresses corresponding to the designated address length of 8.

In response to read clock signal RCLK produced in SDRAM 1000, the corresponding memory cell is selected, and the read data is read to data I/O circuit 1086 through I/O line pair M-I/O and global I/O bus G-I/O, and is held therein. The read data corresponding to the column address applied at time t11 is issued to data I/O terminal DQ at time t14 after three clocks from time t11.

Thereafter, the data read from burst addresses designated by burst address counter 1060 are likewise applied successively to data I/O terminal DQ at times t15–t21 (not shown).

Figure 3:
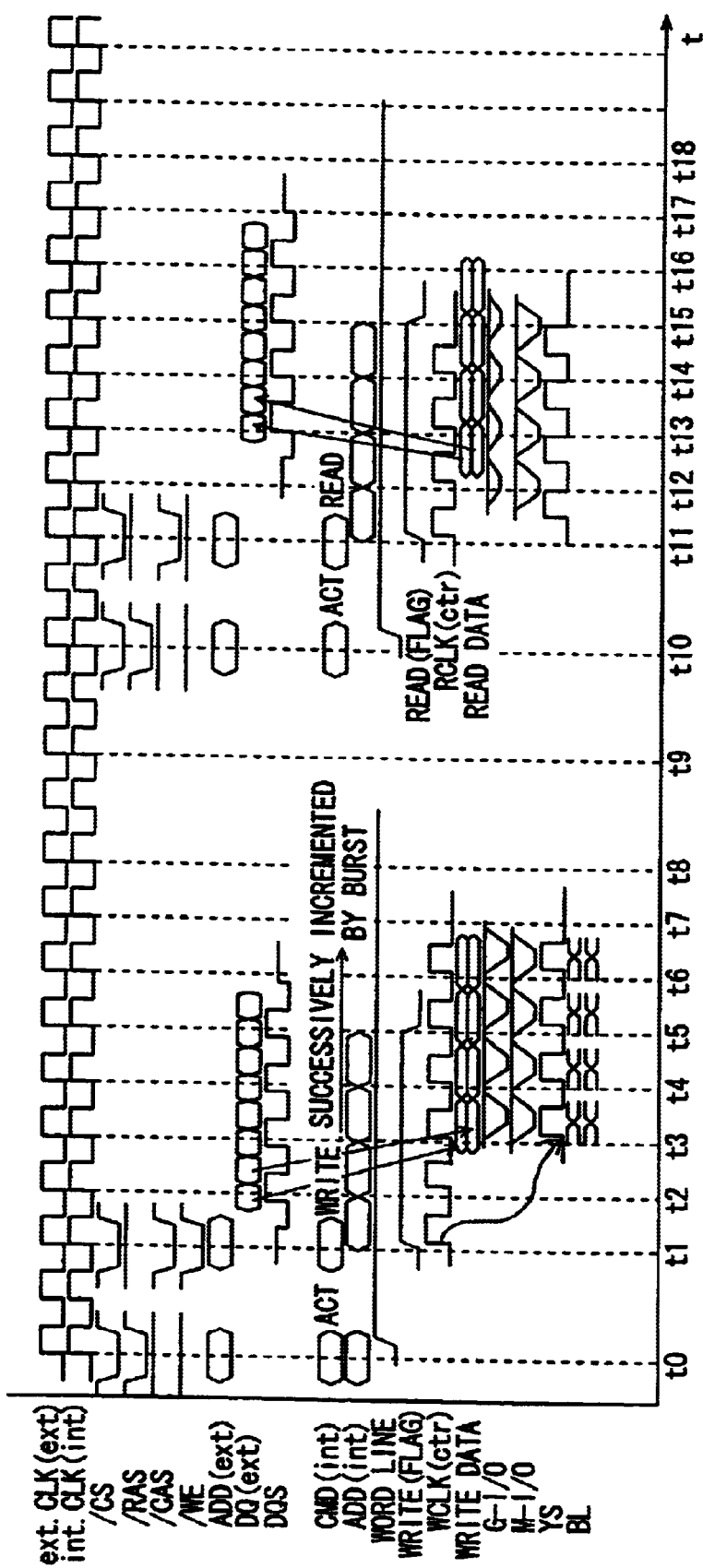
FIG. 3 is a timing chart schematically showing a double-data-rate operation of SDRAM 1000.

FIG. 3 is a timing chart schematically showing the double-data-rate operation of SDRAM 1000 shown in FIG. 1.

FIG. 3 shows the operation in the case where the burst length is 8, and the CAS latency in the read operation is 2.

In the operation shown in FIG. 3, the burst length is 8, and the CAS latency in the read operation is 2. The fact that the CAS latency is 2 means that the data output starts after two clocks from input of the command.

[Write Operation in DDR-SDRAM Mode]

Referring to FIG. 3, Activation of the SDRAM is instructed in response to the active states of signals /CS and /RAS at time t0, i.e., at the rising edge of external clock signal ext.CLK.

At time t0, the row address and the bank address are taken in, and are held in row address latch 1048 and bank address latch 1052, respectively.

at subsequent time t1, the write operation is instructed in response to the active states of signals /CS and /CAS at the edge of activation of internal clock signal int.CLK. At this time, the column address is input, and column address latch 1050 holds the value thereof. At time this, the operation mode of burst write is set, whereby the write operation after this cycle will be performed while automatically incrementing the column address in SDRAM 1000 by burst address counter 1060.

As a result of designation of the write operation, signal WRITE, which is a flag signal for instructing the internal write operation, changes to the active state.

Thereafter, the write data is taken in while externally changing the write data in synchronization with signal DQS applied to SDRAM 1000.

The data written in serial is converted by data I/O circuit 1086 into parallel data two bits at a time, and will be written into the selected memory cells at times t4–t6 after time t3.

[Read Operation in DDR-SDRAM Mode]

In the read operation, an ACT command for activating the word lines are input at time t10 in accordance with the active states of signals /CS and RAS at the rising edge of external clock signal ext.CLK. At this time, the address designating the word line is also input.

At subsequent time t11, the read operation is designated in response to the active states of signals /CS and /CAS. At this time, the column address is designated, and is held in column address latch 1050. Based on the column address held in column address latch 1050, burst address counter 1060 produces the internal address. The word lines are activated, and data are read two bits at a time in parallel from the selected memory cells. The data thus read is amplified by sense amplifiers, and is read out in synchronization with read clock RCLK produced in SDRAM 1000.

The data which is read two bits at a time in parallel is held in data I/O circuit 1086, and is converted into serial data, which will be successively sent to data I/O terminal 1070 from time t13.

If setting is already performed for the operation mode of burst read, the read operation at and after t14 will be performed while internally and automatically incrementing the column address. In this read operation, parallel reading of two bits and conversion into the serial data are successively performed for sending the data to the data I/O terminal.

At the same time, SDRAM 1000 issues signal DQS in synchronization with the data output so that SDRAM 1000 externally applies timing of data output.

As described above, when the column-related access is performed, the address signals are taken into column address latch 1050. The column address changes at the time of burst in an interleaving manner or a sequential manner. The manner to be selected between these manners is designated by a combination of the address signals, which is stored as operation information in mode register 1046. In accordance with the control by mode register 1046, burst address counter 1060 operates in different manners.

In the DDR-SDRAM operation mode, it is necessary to output the data two times in one cycle of the external clock signal. Accordingly, the internal circuits operate in the DDR-SDRAM operation mode such that two data are read from the selected memory array block in one clock cycle. Therefore, the address signal issued from the burst address counter 1060 is required to designate two addresses at one time for reading these two data.

In this case, consideration must be given to the fact that intended production of the burst address cannot be performed by merely and successively incrementing the address from the input address because the externally applied column address is not restricted to the even address or the odd address.

For example, it is assumed that "1" is externally supplied as the column address signal. In this case, the internal column address to be generated correspondingly thereto is (1, 2) in the sequential mode, and is (1, 0) in the interleave mode.

Accordingly, a location where the column selection is performed (i.e., the column for which column select signal is activated) with the even address is different from a location where the column selection is performed with an odd address paired with the even address.

In SDRAM 1000, therefore, each memory cell array block is divided into a region corresponding to the even addresses and a region corresponding to the odd addresses, and the decoder for the column select signals corresponding to the even addresses is separated from the decoder for the column select signals corresponding to the odd addresses for independent operations.

For example, memory cell array bank 0 is divided into a region 1100a corresponding to the even addresses and a region 1100b corresponding to the odd addresses.

In view of the above, the foregoing write and read operations in the DDR-SDRAM operation mode can also be considered as follows.

The address signal in the first column access cycle is transmitted to column predecoder 1064 while keeping the externally input value.

In the next burst cycle, the signal is transmitted to column-related predecoder 1064 after being subjected to the processing corresponding to the address counter for the even address and the address counter for the odd address.

When the device operates as the DDR-SDRAM, the data input operation is performed in synchronization with the externally supplied DQS clock in the case of the bidirectional synchronization (i.e., in the mode which will be referred to as the "bidirectional mode" hereinafter) as described before.

The data output operation is performed in synchronization with the synchronous clock which is produced in internal control clock producing circuit 1008 in SDRAM 1000.

In the write operation, the command and the first address are initially input. The data is input with double the frequency of the external clock in accordance with timing slightly delayed from the input of these command and first address. Although there is a slight delay from the external clock, this delay does not cause a problem if the operation of receiving the data is performed in accordance with timing determined by the externally supplied DQS clock.

When input of the write command is recognized, mode decoder 1022 activates write flag WRITE, and internal control clock generating circuit 1008 generates write clock signal WCLK correspondingly to internal clock signal int.CLK2. Since the data is input with a slight delay, signal YS controlling the column select operation must be correspondingly delayed.

In FIG. 3, signal YS is activated with a phase delayed from the external clock signal by about two clock signals in view of a certain margin. The write data is taken into data I/O circuit 1086 through data I/O terminal 1070 in synchronization with internal clock signal int.CLK1 having double the frequency of the external clock signal. The write data thus taken is transmitted two bits (for the even address and the odd address) at a time through global I/O bus G-I/O and an array of main I/O line pairs M-I/O in synchronization with write clock signal WCLK. In response to activation of the column select signal for the predetermined column in the selected memory array block, the data is written into the memory cells through the selected bit line pair. In and after the second access operation in the burst cycle, burst address counter 1060 issues the internal column address signal which varies in accordance with the type of burst, and the write data is successively written two bits at a time in accordance with write clock signal WCLK.

In the read operation, the command and the first address are input, and mode decoder 1022 recognizes the input of read command so that mode decoder 1022 activates read flag READ. Thereby, read clock signal RCLK is issued in response to internal clock signal int.CLK2 having the same frequency as the external clock signal produced from internal control clock producing circuit 1008. In accordance with read clock signal RCLK, column select signal TS is activated, and two bits of the data (for the even address group and the odd address group) are simultaneously read from the sense amplifiers.

The data of two bits thus read is transmitted, as the read data, to data I/O circuit 106B through main I/O line pair M-I/O and global I/O bus B-I/O, and is latched therein. In data I/O circuit 1086, the read data of two bits which is input in parallel is subjected to serial conversion, and then is issued from internal control clock producing circuit 1008 in synchronization with internal clock signal int.CLK1, which varies with double the frequency of the external clock signal, and in accordance with clock timing slightly earlier than timing of the CAS latency.

In and after the second access operation in the burst cycle, burst address counter 1060 issues the internal column address signal which changes in accordance with the type of the burst address. In accordance with this, the read data is successively read out from the memory cell block (bank) selected in accordance with the read clock signal RCLK.

Figure 4:
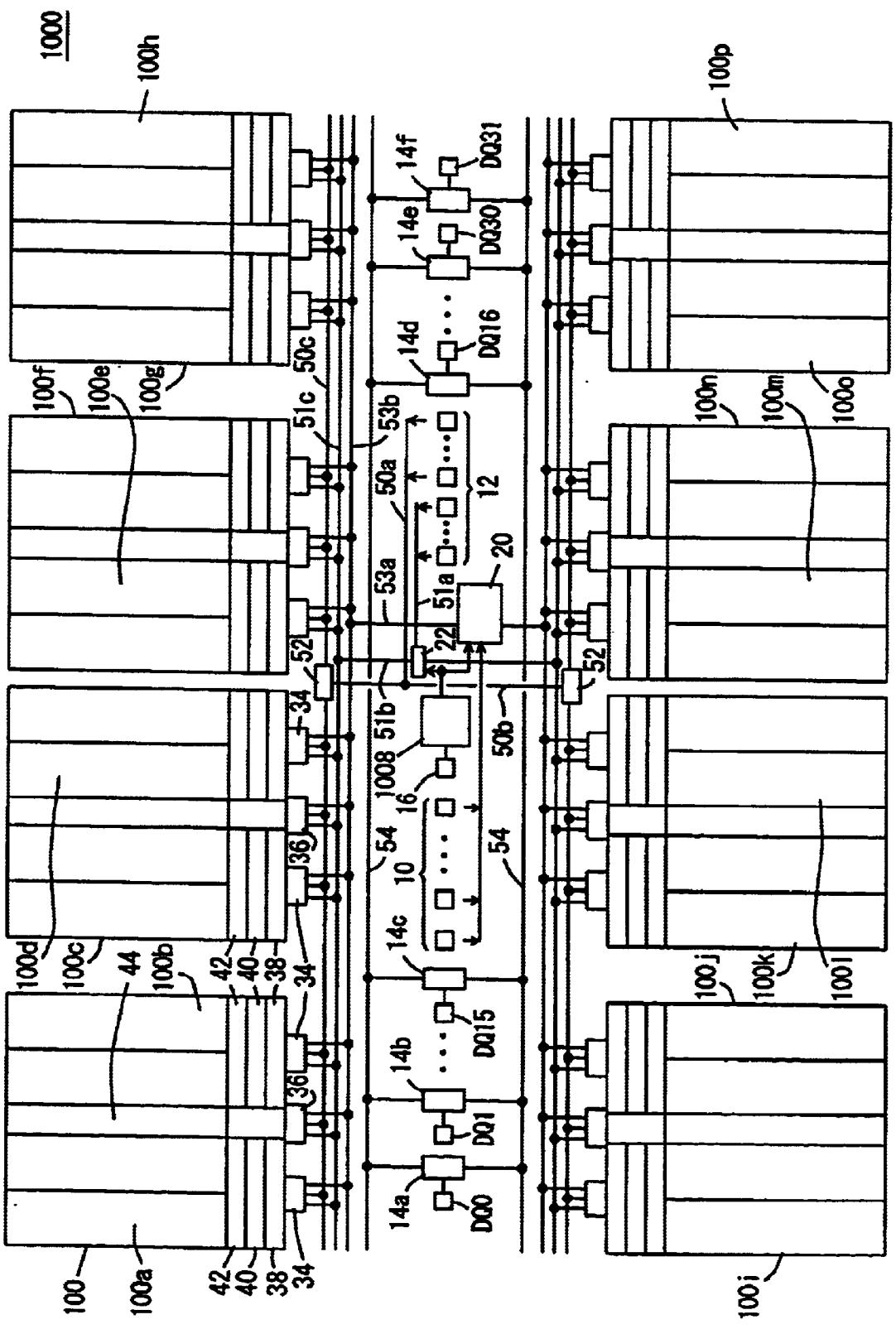
FIG. 4 is a schematic block diagram showing more specifically the structure of SDRAM 1000 shown in FIG. 1.

FIG. 4 is a schematic block diagram showing more specifically the structure of SDRAM 1000 shown in FIG. 1.

Referring to FIG. 4, SDRAM 1000 includes a control circuit 20 which receives external control signals /RAS, /CAS, /WE, /CS and others through external control signal input terminal group 10, and decodes them to generate the internal control signals CMD, command data buses 53a and 53b which transmit the internal control signals sent from control circuit 20, and a memory cell array 100 having memory cells arranged in rows and columns.

The memory cell array 100 is divided into memory cell blocks 100a–100b of 16 in total number as shown in FIG. 4. For example, if SDRAM 1000 has a storage capacity of 1 Gbits, each memory cell block has a capacity of 64 Mbits. Each block has a structure allowing independent operation as a bank.

SDRAM 1000 further includes internal control clock producing circuit 1008, which receives mutually complementary external clock signals ext.CLK and /ext.CLK applied through clock signal input terminals 16a and 16b, and starts the synchronizing operation to issue internal clock signals int.CLK1 and int.CLK2 under the control by control circuit 20.

External address signals A0–Ai (i: natural number) applied through an address signal input terminal group 12 are taken into SDRAM 1000 in synchronization with second internal clock signal int.CLK2 under the control by control circuit 20.

Data of a predetermined number of bits among external address signals A0–Ai is applied to a bank decoder 22 through an address bus 51a. From bank decoder 22, decoded bank addresses B0–B7 are transmitted through address buses 51b and 51c to each bank.

Other external address signals applied to address signal input terminal group 12 are transmitted to address drivers 52 through address buses 50a and 50b. From address driver 52, the address signals are transmitted to the respective banks (memory cell blocks) through an address bus 50c.

SDRAM 1000 further includes row predecoders 36, which are provided correspondingly to pairs of the memory cell blocks, respectively, and perform latching and predecoding of the row addresses transmitted through address bus 50c under the control by control circuit 20, row decoders 44 for selecting the rows (word lines) in the memory cell blocks which are selected based on the outputs of row precoders 36, column predecoders 34 which are provided correspondingly to the memory cell blocks, respectively, and perform latching and predecoding of the column addresses transmitted through address bus 50c under the control by control circuit 20, column predecoder lines 40 which transmit the outputs of predecoders 34, respectively, and column decoders 42 which select the columns (bit line pairs) in the selected memory cell blocks based on the outputs from column predecoder lines 40.

SDRAM 1000 is provided with data I/O terminals DQ0–DQ15 and DQ16–DQ31 arranged in regions, respectively, which extend through a central area of the chip along its long side, and are located outside the region including external control signal input terminal group 10 and address signal input terminal group 12, I/O buffer circuits 14a–14f which are provided correspondingly to data I/O terminals DQ0–DQ31, respectively, data buses 54 for transmitting the data between the I/O buffers and the corresponding memory cell blocks, and read/write amplifiers 38 which are arranged correspondingly to memory cell blocks 100a–100b, respectively, for transmitting the data between data buses 54 and the selected memory cell columns.

Each of I/O buffer circuits 14a–14f has a structure similar to that of the data I/O buffer of the embodiment 1, and transmits the data to and from memory cells 100 through data I/O circuit 1086 (not shown in FIG. 4) having a similar structure to that of the embodiment 1.

Signal /RAS applied to external control signal input terminal group 10 is a row address strobe signal, which starts the internal operation of synchronous semiconductor memory device 1000, and determines the active period of the internal operation. In accordance with activation of signal /RAS, the circuits such as row decoder 44, which are related to the operation of selecting the row in memory cell array 100, are activated.

Signal /CAS applied to external control signal input terminal group 10 is a column address strobe signal, and activates the circuits provided for selecting the column in memory cell array 100.

Signal /CS applied to external control signal input terminal group 10 is a chip select signal indicating the fact that SDRAM 1000 is to be selected. Signal /WE is a signal instructing the write operation of SDRAM 1000.

The operations of receiving signals /CS, /RAS, /CAS and /WE are performed in synchronization with internal clock signal int.CLK2.

The operation of receiving the address signal applied to address signal input terminal group 12 is performed in synchronization with the second internal clock signal.

Transmission of the data through data I/O terminals DQ0–DQ31 is performed in synchronization with first or second internal clock signal int.CLK1 or int.CLK2 depending on whether the operation is in the SDR-SDRAM operation mode or the DDR-SDRAM operation mode. Further, the operation of receiving data may be performed in synchronization with externally supplied signal DQS depending on the operation mode.

Figure 5:
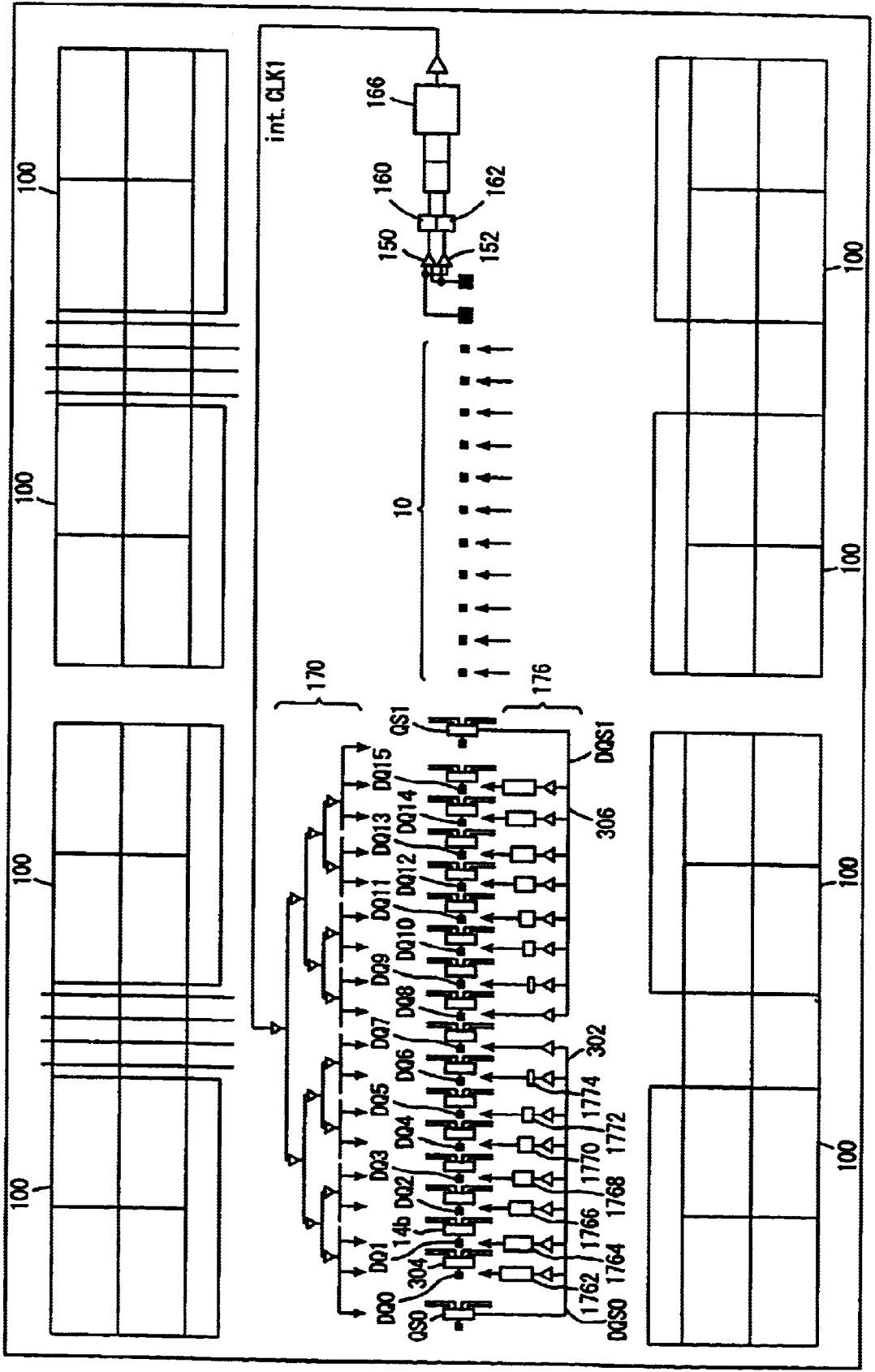
FIG. 5 is a schematic block diagram showing structures of clock trees 170 and 176.

FIG. 5 is a schematic block diagram showing structures of clock trees 170 and 176.

Clock tree 170 governing the data output has the following structure. A synchronous mirror delay circuit 166 receives complementary external clock signals ext.CLK and /ext.CLK, and issues clock signal int.CLK1, which has double the frequency of external clock signal ext.CLK, to clock tree 170. In clock tree 170, clock signal int.CLK thus supplied is successively divided into two in a tree form by a clock tree 168 which ultimately issues sixteen divided internal clock signals. These divided internal clock signal are distributed to corresponding data I/O terminals DQ0–DQ7 and DQ8–DQ15.

Further, the divided signals are also distributed to data strobe terminals QS through the dummy delay circuit having the same delay time. In the case where data strobe terminal QS is located near data I/O terminal DQ0 or DQ15, it is possible to ignore a difference in phase between the clock signal applied to the foregoing data I/O terminal and the clock signal applied to the DQS signal I/O terminal. Therefore, the structure for the above dummy circuit can be eliminated. The data output operation can be controlled in accordance with internal clock signal int.CLK1 thus distributed.

Description will now be given on the structure of clock tree 176, which distributes the clocks when the data input is performed in the bidirectional mode or the like.

Clock tree 176 includes elements 1762–1774 which receive externally supplied signal DQS0 and are arranged such that they can transmit the signals to respective I/O terminals with an equal delay, respectively. More specifically, element 1762 having a large delay control amount is arranged on the distribution path nearest to DQS signal input terminal QS0, and other elements 1764–1774 are arranged to provide the delay control amounts in the descending order. Signal DQS0 is supplied through delay elements 1762–1774 to the corresponding data I/O terminals.

In the structure shown in FIG. 5, signal DQS0 is transmitted to data I/O terminals DQ0–DQ7 through a bus 302. Signal DQS0 transmitted through bus 302 is applied to corresponding data I/O terminal DQ0 through buffer circuit 304 and delay element 1762 having the largest delay amount.

Signal DQS0 is also transmitted to data I/O terminals DQ1–DQ7 through the delay elements having delay amounts in the descending order, respectively.

The externally supplied signal DQS1 is distributed to data I/O terminals DQ8–DQ15 through a similar structure.

Figure 6:
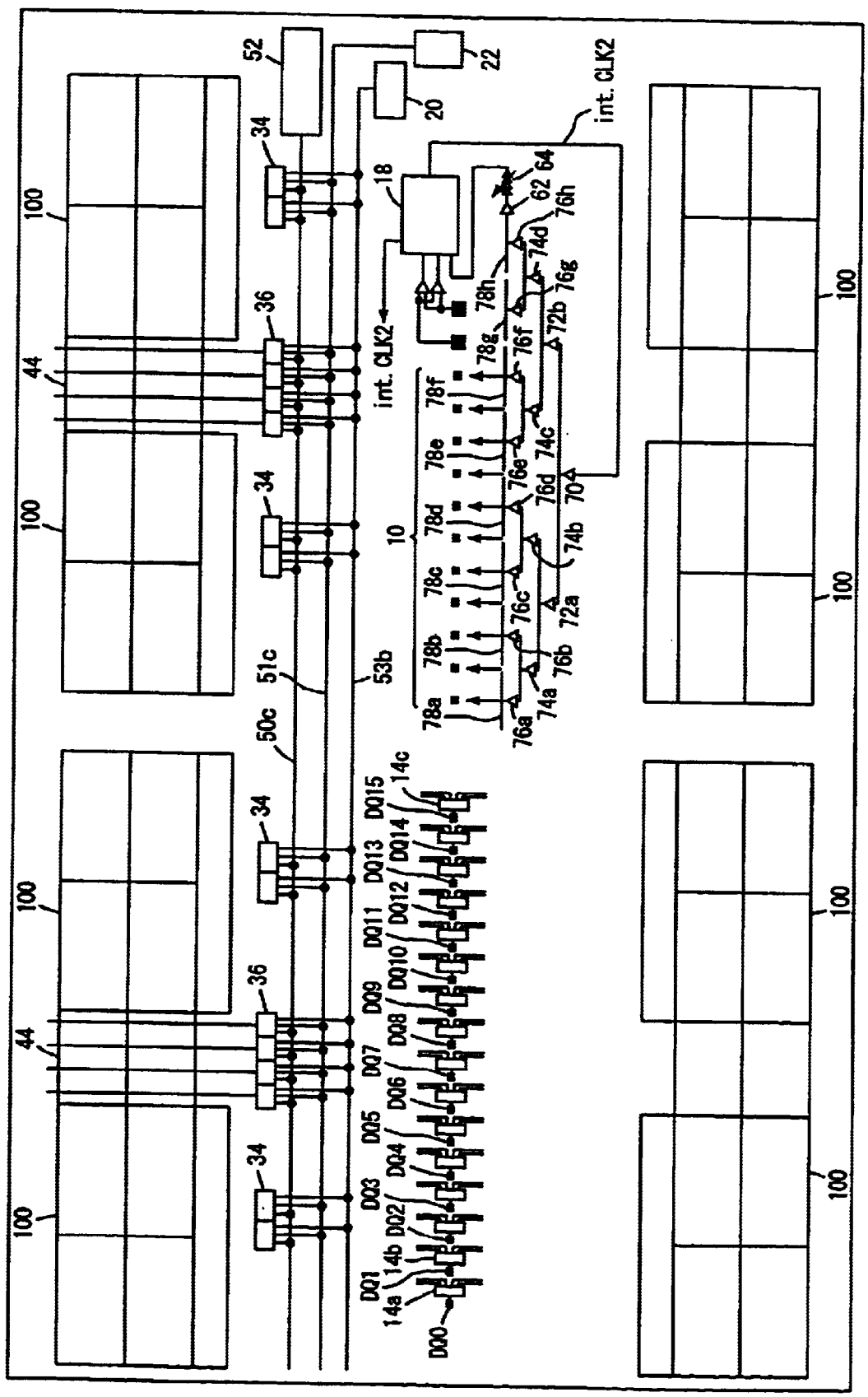
FIG. 6 conceptually shows a structure for distributing an internal clock signal to input terminals in an external control signal input terminal group 10.

FIG. 6 conceptually shows a structure for distributing second internal clock signal int.CLK2 to the input terminals of external control signal input terminal group 10 in SDRAM 1000 shown in FIG. 4.

Referring to FIG. 6, external clock signals ext.CLK and /ext.CLK applied to the clock input terminal are sent to internal control clock producing circuit 1008 through buffer circuits 150 and 152, respectively.

Internal clock signal int.CLK2 issued from internal control clock producing circuit 1008 is first applied to buffer circuit 70.

The output of buffer circuit 70 is divided into two, which are applied to buffer circuits 72a and 72b, respectively.

The output of buffer circuit 72a is further divided into two, which are applied to buffer circuits 74a and 74b, respectively.

The output of buffer circuit 72b is further divided into two, which are applied to buffer circuits 74c and 74d, respectively.

Each of the outputs of buffer circuits 74a, 74b, 74c and 74d is further divided into two, which are applied to corresponding buffer circuits 76a and 76b, 76c and 76d, 76e and 76f, and 76g and 76h, respectively.

Thus, the output of buffer circuit 70 is successively divided into two to produce ultimately eight clock signals. The eight clock signals are applied to interconnections 78a–78h, respectively. The operation of receiving the external control signal sent from external control signal input terminal group 10 is performed in synchronization with the clock signals which are supplied from ends of interconnections 78a–78b, respectively.

The clock signal sent from the end of interconnection 78h is applied to internal control clock producing circuit 1008 through a replica buffer circuit 62 and a delay control circuit 64. Internal control clock producing circuit 1008 produces second internal clock signal int.CLK2 in synchronization with the output of delay control circuit 64 and the phase of external clock signal ext.CLK sent from buffer circuit 150.

Assuming that delay control circuit 64 is not present, buffer circuit 150 and replica buffer circuit 62 have similar structures. Therefore, control or adjustment is performed such that external clock signal ext.CLK applied to buffer circuit 150 has the phase equal to that of the clock signal on interconnection 78h applied to replica buffer circuit 62. In this structure, the phase of the clock signal on interconnection 78h is equal to those of the clock signals on other interconnections 78a–78g.

Thus, the operation of receiving the external control signal is performed in synchronization with external clock signal ext.CLK.

The delay control circuit 64 is provided for the following reason. Since the amplitude level of external clock signal ext.CLK as well as a ratio of its active period with respect to the period of the clock signal and others are different from those of internal clock signal int.CLK. Therefore, adjustment or control of them is required. Delay control circuit 64 is performed for this purpose.

In FIG. 6, description has been given on the structure for distributing internal clock signal int.CLK2 to external control signal input terminal group 10. A similar structure is provided correspondingly to address signal input terminal group 12. Owing to the similar structure, the operation of receiving the address signal is performed in synchronization with external clock signal ext.CLK.

Figure 7:
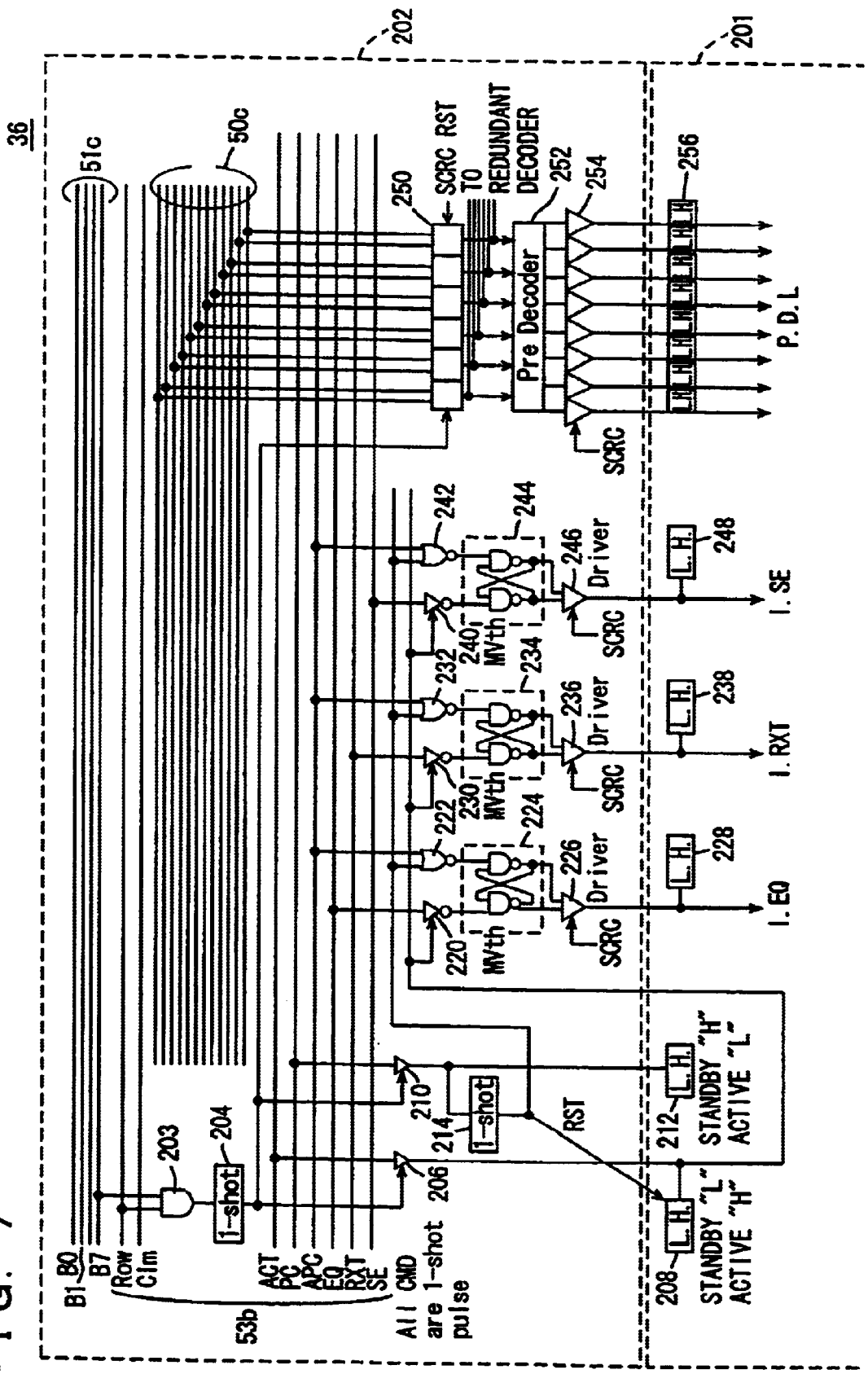
FIG. 7 is a schematic block diagram showing a structure of a row predecoder 36.

FIG. 7 is a schematic block diagram showing the structure of row predecoder 36.

Column address bus 53b transmits signals such as a signal Row instructing activation of operations of the row-related circuits, a signal Clm instructing activation of operations of the column-related circuits, a signal ACT instructing activation of operations of the internal circuits, a signal PC instructing reset (precharge) of the bank, a signal AP indicating precharge of all the banks, a signal EQ which instructs releasing of equalizing of the bit lines and others as well as an operation for isolating the unused bit lines from the sense amplifiers, a signal RXT instructing activation of the word lines, and signal SE instructing activation of the sense amplifier.

Bank address bus 51c transmit bank address signals B0–B7 decoded by bank decoder 22. Address bus 50c transmits the address signal sent from address driver 52.

When bit data (e.g., B7) in the bank address signal becomes active and signal Row becomes active, AND circuit 203 issues the active signal, and thereby a one-shot pulse generating circuit 204 issues an active one-shot pulse.

In response to the above, a driver circuit 206 is activated to receive the level of signal ACT, and this level is held in a level holding circuit 208.

Likewise, a driver circuit 210 is activated to receive the level of signal PC in response to the signal sent from one-shot pulse generating circuit 204, and a level holding circuit 212 holds the received level. A one-shot pulse generating circuit 214 issues a reset signal RST to level holding circuit 208. Inverter 220 is activated to receive and issue signal EQ in accordance with the output signal sent from level holding circuit 208. An NOR circuit 222 receives signal APC and the signal sent from one-shot pulse generating circuit 214, and issues a result of logical NOR between them. A flip-flop circuit 224 is set in accordance with the output of inverter 220, and is reset in accordance with the output of NOR circuit 222. A driver circuit 226, which is activated in accordance with a hierarchical power supply control signal SCRC to be described later, receives and outputs the output of flip-flop circuit 224. The output level of driver circuit 226 is held by a level holding circuit 228. The output level of level holding circuit 228 is applied, as a signal I.EQ, to the corresponding memory cell block.

Likewise, a flip-flop circuit 234 is set by an output of an inverter 230, which is activated in accordance with the signal sent from level holding circuit 208 and receives as an input, a level of a signal RXT transmitted through command data bus 53b. Flip-flop circuit 234 is reset by an output of an NOR circuit 232, which receives the output of one-shot pulse generating circuit 214 and signal APC transmitted through command data bus 53b.

A driver circuit 236 receives the output of flip-flop circuit 234, and is activated by hierarchical power supply control signal SCRC. The output level of driver circuit 236 is held by a level holding circuit 238, and the output level of level holding circuit 238 is issued, as a signal I.RXT, to the corresponding memory cell block.

A flip-flop circuit 244 receiving a signal SE transmitted through command data bus 53b is set by the output of inverter 240, which is activated in accordance with the output level of level holding circuit 208, and is reset in accordance with the output of an NOR circuit 242 receiving the output signal of one-shot pulse generating circuit 214 and the level of signal APC transmitted through command bus 53b. A driver circuit 246 receives the output of flip-flop circuit 244, and is activated by hierarchical power supply control signal SCRC. The output level of driver circuit 246 is held by level holding circuit 244, and the output level of level holding circuit 244 is applied, as a signal I.SE, to the corresponding memory cell block.

Latch circuit 250 is reset in accordance with activation of hierarchical power supply control signal SCRC, is activated in response to activation of one-shot pulse generating circuit 204, and thereby holds the address signal transmitted through address data bus 50c. The output of latch circuit 250 is transmitted to a redundant address decoder (not shown), and is also applied to a predecoder 252, which sends a result of predecoding to a driver circuit 254, which is activated in response to hierarchical power supply control signal SCRC.

The outputs of driver circuit 254 are held by a level holding circuit 2256, and are issued therefrom onto the corresponding row precoder lines P.D.L., respectively.

In the structure of row precoder 36 shown in FIG. 7, a region 201 contains level holding circuits, 208, 212, 228, 238 and 248 as well as level holding circuit 256 and the corresponding memory cell blocks. This region 201 is not controlled by the hierarchical power supply control signal, and always uses a power supply potential Vcc and a ground potential Vss as its power supply potentials for its operation during both the active state and standby state.

In contrast to this, a region 202 in row precoder 36 is controlled by hierarchical power supply control signal SCRC, and receives power supply potential Vcc and ground potential Vss for its operation while signal SCRC is active. Also, region 202 receives a potential lower than power supply potential Vcc and a potential higher than ground potential Vss for its operation while hierarchical power supply control signal SCRC is inactive (at "L" level).

Figure 8:
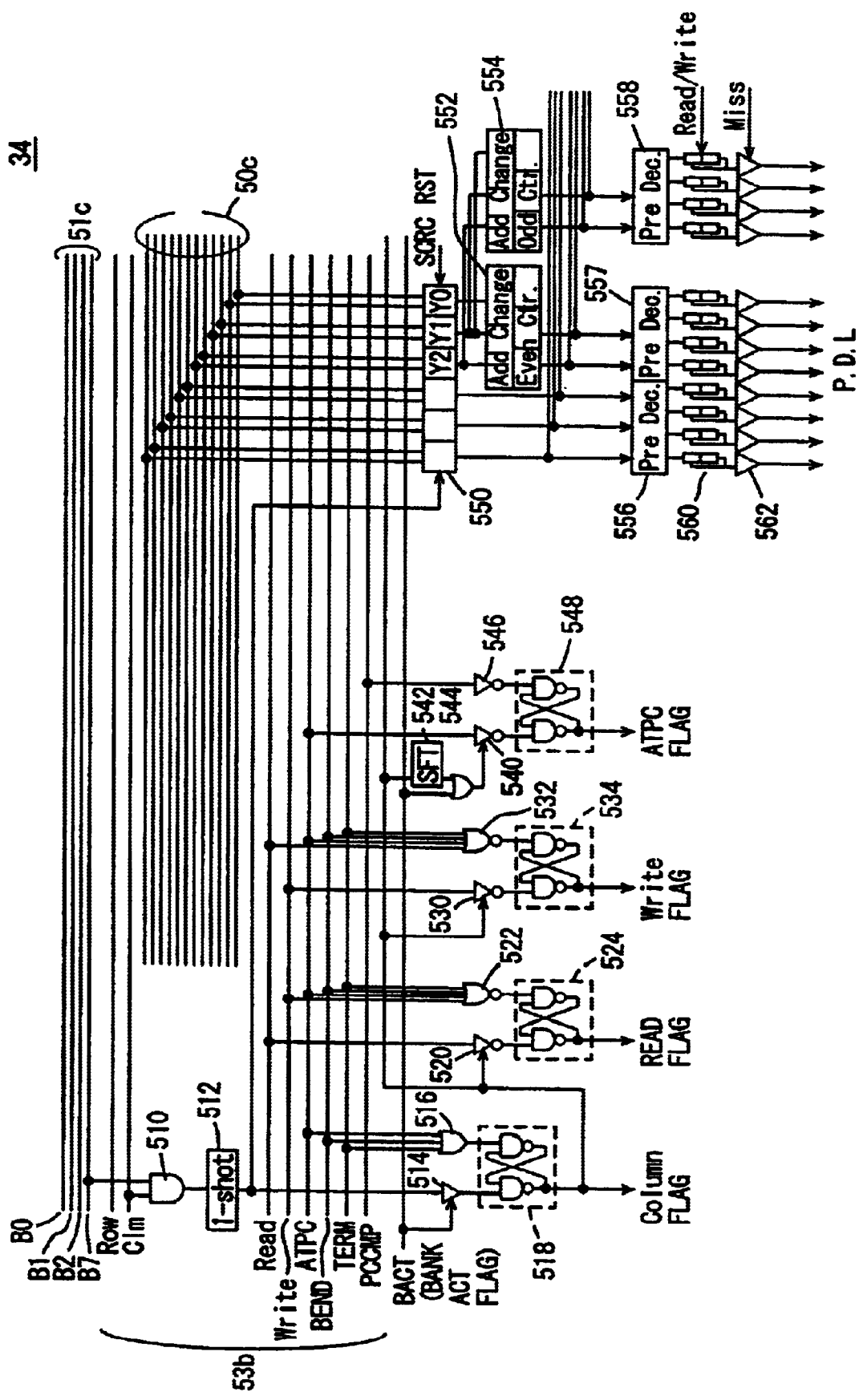
FIG. 8 is a schematic block diagram showing a structure of a column predecoder 34.

FIG. 8 is a schematic block diagram showing a structure of column precoder circuit 34.

Referring to FIG. 8, control circuit 20 sends through command data bus 53b read-related access identification signal READ for instructing the read operation, write-related access identification signal WRITE for instructing the write operation, automatic precharge identification signal ATPC for instructing the automatic precharging, a burst end identification signal BEND for instructing the ending of the burst operation to each of the banks, a termination identification signal TERM for instructing forced termination of the column select operation when another bank is selected during the column selecting operation, and a pre-charge operation identification signal PCCM for instructing the ending of the precharge operation.

A signal BACT is a flag signal which is held in level holding circuit 208 in accordance with selection of the bank.

Column predecoder circuit 34 includes an AND circuit which receives signal Clm transmitted through command data bus 53b and bank address signal B7, a one-shot pulse producing circuit 512 which issues a one-shot pulse signal in accordance with activation of the output of AND circuit 510, a drive circuit 514 which is activated in response to activation of flag signal BACT, and drives the output of one-shot pulse producing circuit 512, an OP circuit 516 which receives signals ATPC, BEND and TERM, and a flip-flop circuit 518 which is set by the output of drive circuit 514, is reset by the output of OR circuit 516, and issues a column flag signal Col.FLAG indicating the fact that the column-related operations are activated.

Column precoder circuit 34 further includes an inverter circuit 520 which is activated in response to activation of a column flag signal Col.FLG, and thereby drives signal READ transmitted from command data bus 53b, an OR circuit 522 which receives signals WRITE, ATPC, BEND and TERM, and a flip-flop circuit 524 which is set by the output of inverter circuit 520, is reset by the output of OR circuit 522 and issues a read flag signal READ.FLAG indicating the fact that the read operation is activated.

Column predecoder circuit 34 further includes an inverter circuit 530 which is activated in response to the activation of column flag signal Col.FLAG, and drives signal WRITE transmitted from command data bus 53b, an OR circuit 532 which receives signals READ, ATPC, BEND and TERM, and a flip-flop circuit 524 which is set by the output of inverter circuit 530, is reset by the output of OR circuit 532 and issues a write flag signal WRITE.FLAG indicating the fact that the write operation is activated.

The column predecoder circuit 34 further includes a shift circuit 542 which receives and delays column flag signal Col.FLAG by a predetermined clock time, an OR circuit 540 which receives flag signal BACT and the output of a shift circuit 542, an inverter circuit 544 which is activated in response to the activation of OR circuits 540, and drives signal ATPC transmitted through command data bus 53b, an inverter circuit 546 which receives a signal PCCMP transmitted through command data bus 53b, and a flip-flop circuit 548 which is set by the output of inverter circuit 544, is reset by the output of inverter circuit 546 and issues an automatic precharge flag signal ATPC.FLAG indicating the fact that the automatic precharge operation is activated.

Column predecoder circuit 34 further includes a latch circuit 550 which is activated in accordance with the output signal of one-shot pulse generating circuit 512, and takes in the clock signal transmitted through address bus 50c. Latch circuit 550 is reset in response to the activation of signal SCRC.

Column precoder 34 further includes an even bit adjusting circuit 552 and an odd bit adjusting circuit 554 which are responsive to the lower bits of the column address held in latch circuit 550, and adjust the lower bits of the address signal corresponding to the column select line (not shown) to be activated, a predecoder 556 which predecodes the upper bit data sent from latch circuit 550, a predecoder 557 which predecodes the lower bit data sent from even bit adjusting circuit 552, a predecoder 558 which predecodes the lower bit data sent from odd bit adjusting circuit 554, a shift circuit 560 which delays the predecode signals sent from predecoders 556, 557 and 558 by a predetermined number of clocks (e.g., two clocks), and issues the same, and a drive circuit 562 which is activated in response to a signal Miss indicating the fact that the address sent from a redundant decoder (not shown) does not correspond to a defective address, receives the output of shift circuit 560 and drives the level of the column predecode line in response to the output signal of shift circuit 560.

[Specific Structures of Data I/O Portion]

FIG., 9 is a circuit diagram showing a structure of an I/O circuit 2000 corresponding to data I/O terminal DQ0.

Figure 9:
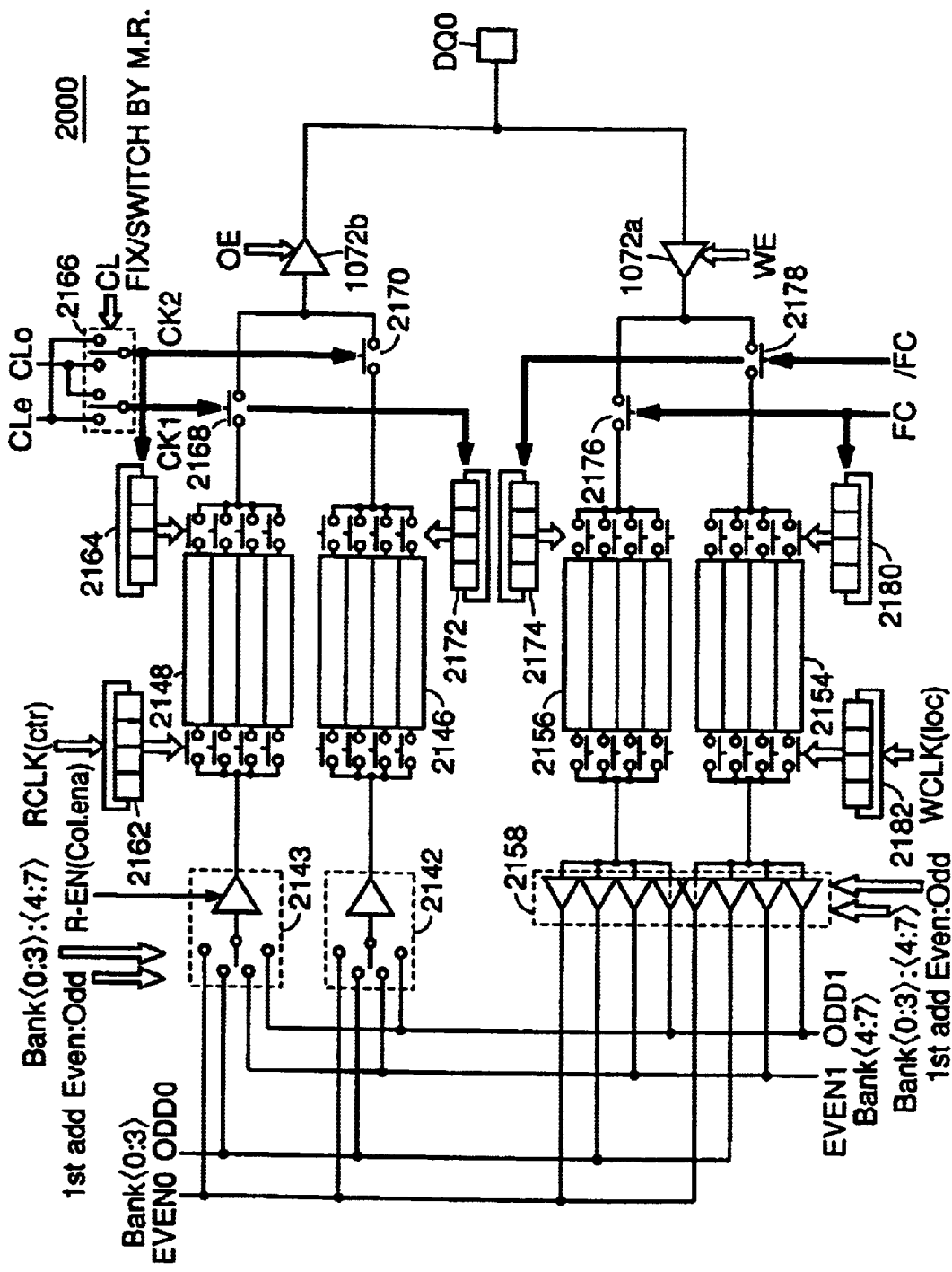
FIG. 9 is a circuit diagram showing a structure of an I/O circuit 2000 corresponding to a data I/O terminal DQ0.

Referring to FIG. 9, an address bus EVEN0 is a data bus connected to even address regions in banks 0–3. An address bus ODD0 is a data bus connected to odd address regions in banks 0–3. An address bus EVEN1 is a data bus connected to even address regions in banks 4–7. An address bus ODD1 is a data bus connected to odd address regions in banks 4–7.

I/O circuit 2000 includes read receiver circuits 2142 and 2143, each of which selects one of address buses EVEN0, ODD0, EVEN1 and ODD1 in response to whether the address corresponding to the selected bank and the data to be issued first are even or odd, and issues the data transmitted through the selected address bus in accordance with a receiver activating signal R-EN, a shift register 2162 which performs the shift operation and issues the select signal in accordance with a read clock RCLK(ctr), and latch circuits 2146 and 2148 which internally receive the data issued from read data receivers 2142 and 2143 in accordance with the select signal issued from shift register 2162, respectively.

I/O circuit 2000 further includes a switch 2166 which receives, in the DDR-SDRAM mode, a clock signal CLe formed by extracting active portions in even-numbered positions from the clock signal of double the frequency of the external clock signal as well as a clock signal CLo formed by extracting active portions in odd-numbered positions of the same for transmitting them into the I/O circuit as data output clocks (i.e., clocks for data output) CK1 and CK2 in accordance with setting of the mode register and the CAS latency, a shift register 2164 for shifting the data in accordance with output clock CK2, and a shift register 2172 for shifting the data in accordance with output clock CK1. Latches 2146 and 2148 select and output the data latched therein in accordance with the outputs of shift registers 2172 and 2164, respectively.

Input circuit 2000 further includes an output buffer 1072*b* which is activated by enable signal OE, and issues the data to a terminal DQ0, a switch 2168 which sends the output of latch 2148 to output buffer 1072*b* in accordance with activation of output clock CK1, and a switch 2170 which sends the output of latch 2146 to output buffer 1072*b* in accordance with activation of output clock CK2.

I/O circuit 2000 further includes an input buffer 1072*a* receiving the data, which is externally supplied to terminal DQ0 and is amplified, in accordance with enable signal WE, switches 2176 and 2178 which internally transmit the output of input buffer 152 in accordance with signals FC and /FC, respectively, a shift register 2174 which receives signal /FC as a shift clock, and issues a select signal, a shift register 2180 which receives signal FC as a shift clock, and issues a select signal, a latch 2156 which takes in the signal sent through switch 2176 in accordance with the select signal issued from shift register 2174, and a latch 2154 which takes in the signal sent from switch 2178 in accordance with the select signal issued from shift register 2180.

I/O circuit 2000 further includes a shift register 2182 which receives a write clock WCLK(loc) as a shift clock, and issues a select signal, and a multiplexer circuit 2158 which receives the data sent from latches 2154 and 2156 in accordance with the select signal issued from shift register 2182. Multiplexer circuit 2158 distributes the data to data buses EVEN0, ODD0, EVEN1 and ODD1, and drives the selected bus depending on whether the received data is to be written into the even bank or odd bank, and whether the address for initially writing the externally supplied data is the even address or the odd address.

The operations will be briefly described below. The data coming from the even and odd address regions in banks 0–3 or the data coming from the even and odd regions in banks 4–7 are selected by four-points switches arranges in the input portions of receivers 2142 and 2143, and are take into them.

Each switch is supplied with a signal for making a distinction between upper and lower positions of the banks as well as a signal indicating whether the first address in the burst read operation is an even address or an odd address. A path provided with receiver 2143, latch 2148 and switch 2168 is a path through which the data is output for a first time, and a path provided with receiver 2142, latch 2146 and switch 2170 is a path through which the data is output for a second time.

The data passed through the switches in the input portions of receivers 2143 and 2142 are amplified by amplifiers, and are sent to selector portions in input portions of latches 2148 and 2146, respectively. Each selector selects one of four paths included in the latch. The path selected by the selector is successively shifted in accordance with internal clock RCLK(ctr) for reading which is applied to shift register 2162 sending the select signal to the latch, and the supplied data is successively latched.

The data stored in the latch is issued based on a clock different from the clock which is used when inputting the data into the latch. The path selected in the output side of the latch is successively shifted in accordance with the select signals issued from shift registers 2164 and 2172, which perform the shift operation in accordance with clock signals CLe and CLo on the output side. Among the output data, the data to be issued at the odd-numbered times are stored in latch 2148, and the data issued at the odd-numbered times are stored in latch 2146. Therefore, clock CLe or CLo to be selected as the control signal supplied to switch 2168 depends on the latency before the data is externally output after read clock RCLK(ctr) at which the read command was recognized. Switch 2170 is supplied with the other clock as the control signal. If the latency is, e.g., 1.5, clock CLo is supplied as the control signal to switch 2168, and clock CLe is supplied as the control signal to switch 2170.

In the write operation, the data which is externally supplied for the first time is unconditionally transferred to latch 2156, and the data supplied for the second time is unconditionally transferred to latch 2154. Thereafter, the data are transferred alternately to latches 2156 and 2154.

The latched data is transmitted to multiplexer circuit 2158 in accordance with internal clock signal WCLK(loc) for writing. Multiplexer circuit 2158 issues the data to the data bus corresponding to the bank address and the first address of the burst data.

As described above, the read data is temporarily taken into registers 2146 and 2148 before being externally output.

Also, the write data is temporarily taken into registers 2154 and 2156 before being supplied to the memory cell array. Owing to the structure performing these operations, the internal circuits can operate based on the clock of the same frequency in either of the SDR-SDRAM operation mode and the DDR-SDRAM operation mode by employing different frequencies of clock signals CK1 and CK2 or different frequencies of clock signals FC and /FC depending on the operation modes.

[Structure for Changing the Internal Clock Signals for DDR-SDRAM and SDR-SDRAM Operation Modes]

Figure 10:
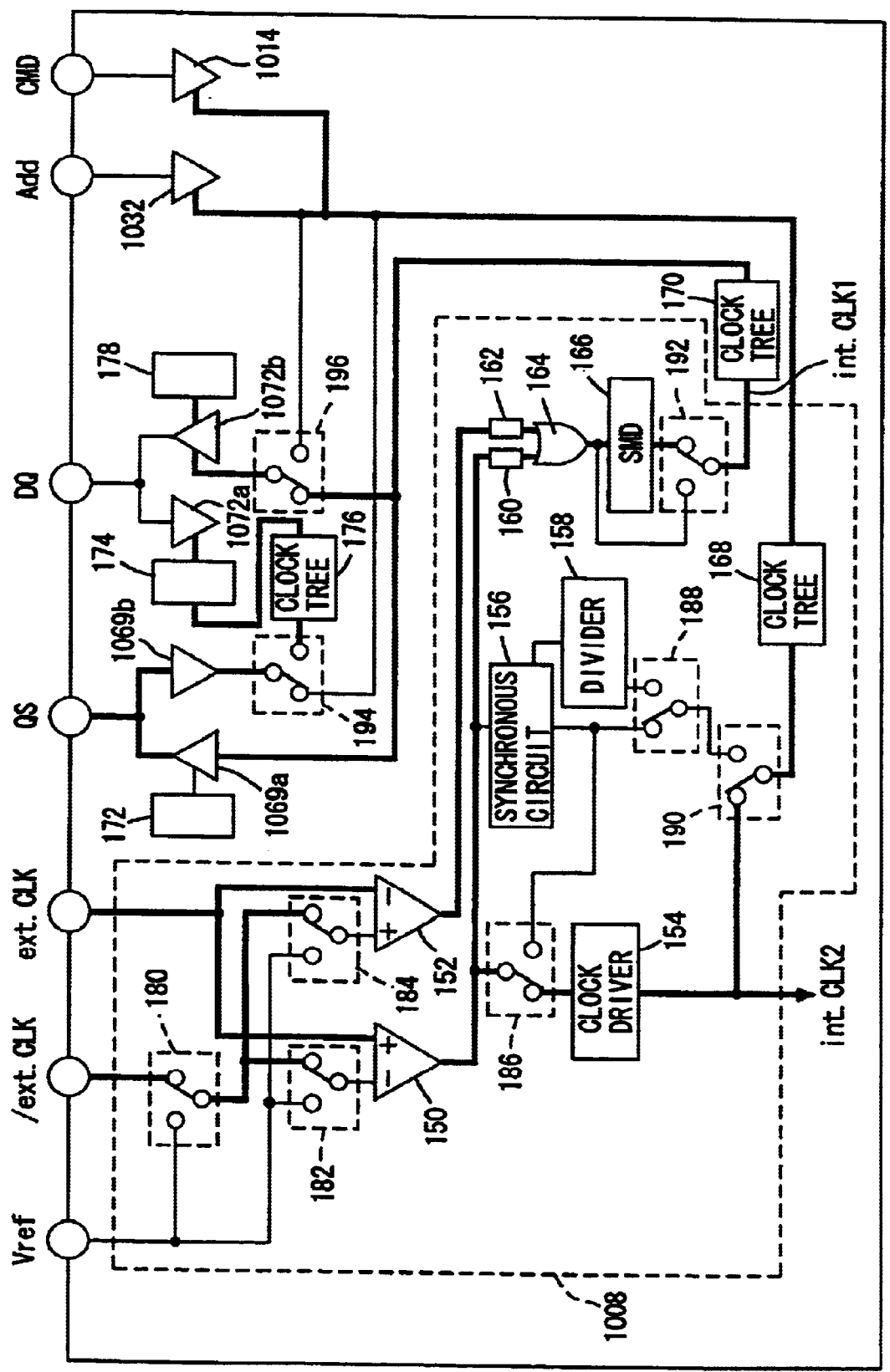
FIG. 10 is a schematic block diagram showing more specifically a structure of an internal clock producing circuit 1008.

FIG. 10 is a schematic block diagram showing more specifically the structure of internal clock producing circuit 1080 shown in FIG. 4.

Internal clock producing circuit 1008 changes the frequencies of internal clock signals int.CLK1 and int.CLK2 issued therefrom as well as its operation synchronized with external clock signal ext.CLK in accordance with the operation mode data applied to mode register 1046 and depending on whether the device is in the DDR-SDRAM operation mode of the DDR-SDRAM operation mode.

The structures and operations will now be described below.

Internal control clock producing circuit 1008 includes a switching circuit 180 which receives reference potential Vref and inverted external clock signal /ext.CLK, and is controlled in accordance with the operation mode data, a switching circuit 182 which receives reference potential Vref and the output of switching circuit 180, and is controlled in accordance with the operation mode data, a switching circuit 184 which receives reference potential Vref and the output of switching circuit 180, and is controlled in accordance with the operation mode data, a differential amplifier 150 which receives external clock signal ext.CLK on its positive input node, and also receives the output of switching circuit 182 on its negative node, a differential amplifier 152 which receives the output of switching circuit 184 on its positive node, and also receives external clock signal ext.CLK on its negative node, a synchronous circuit 156 which receives the output of differential amplifier 150, and selectively issues synchronizing signals for a DLL operation mode and a PLL operation mode in accordance with the data held in mode register 1046, a switching circuit 186 which receives the outputs of differential amplifier 150 and synchronous circuit 156, and is controlled by the operation mode data, and a clock driver 154 which receives the output of switching circuit 186, and buffers the same for issuing internal clock signal int.CLK2.

Internal clock signal int.CLK2 issued from clock driver 154 is an internal clock signal for controlling operations of internal circuits of SDRAM 1000 such as operations of selecting the row and column in the memory array block (bank) and reading the data from the memory array block (bank) to I/O ports 1106–1126.

Internal control clock producing circuit 1008 further includes a dividing circuit 158 which receives the output of synchronous circuit 156 and executes n-fold division on the same, a switching circuit 188 which receives the outputs of synchronous circuit 156 and dividing circuit 158, and is controlled in accordance with the operation mode data, and a switching circuit 190 which receives the outputs of switching circuit 188 and clock driver circuit 154, and is controlled in accordance with the operation mode data.

Internal control clock producing circuit 1008 further includes a one-shot pulse producing circuit 160 which receives the output of differential amplifier 150, and issues a one-shot pulse signal in response to an edge of activation thereof, a one-shot pulse producing circuit 162 which receives the output of differential amplifier 152, and issues a one-shot pulse signal in response to an edge of activation thereof, an OR circuit 164 receiving the outputs of one-shot pulse producing circuits 160 and 162, a synchronous mirror delay circuit 166 which receives the output of OR circuit, and issues a signal synchronized with the received output, and a switching circuit 192 which receives the outputs of synchronous mirror delay circuit 166 and OR gate 164, and is controlled in accordance with the operation mode data.

FIG. 10 shows, as typical examples, one of address signal input terminals 1030, i.e., the address signal input terminal receiving address signal A0, one of control signal input terminals 1010, i.e., the external control signal input terminal receiving chip select signal /CS, and one of data I/O terminals 1070, i.e., the data I/O terminal transmitting data DQ0.

The output of switching circuit 190 is applied to address input buffer 32 and an external control signal buffer 14 through clock tree 168, which is provided for supplying the clock signals of frequencies matched with each other to the address signal input terminal group and the external control signal input terminal group.

The output of switching circuit 192 is applied to switching circuits 194 and 196 through clock tree 170, which is provided for supplying the internal clock signals of frequencies matched with each other to the data I/O terminals included in the data I/O terminal group.

The output of clock tree 170 is supplied to an output buffer 1069a, which is controlled by an output control circuit 172, and issues clock signal QS to the signal QS I/O terminal. The signal sent from clock signal QS input terminal is applied to switching circuit 194 through an input buffer 1069b.

The output of switching circuit 194 is applied to a data reception control circuit 174 through a clock tree 176 provided for supplying the clock signals, which is based on the signal sent from switch circuit 194 and have frequencies matched with each other, to the respective data I/O terminals included in data I/O terminal group 1070. Input buffer 1072a receives the write data applied to data I/O terminal 1070 under the control by data reception control circuit 174.

Data output buffer 1072b for the data I/O terminal outputs the read data in accordance with the output of switching circuit 196, which receives the outputs of clock trees 170 and 168, and is controlled by the operation mode data. The operation of output buffer 1072b is controlled by a data output control circuit 178.

Referring to FIG. 10, more specific description will now be given on operations of switching circuits 180–196 in the DDR-SDRAM operation mode.

In FIG. 10, thick lines represent transmission paths of active signals in such a case that the operation is in the DDR-SDRAM operation mode, the synchronous mirror delay circuit (SMD circuit) is used, synchronous circuit 156 is not used, complementary clock signals are used as the input clock signals, and the bidirectional mode is selected as the mode for the data input/output operation. In FIG. 10, thin lines represent transmission paths of inactive signals in the above case.

More specifically, switching circuit 180 is set on a side for receiving inverted clock signal /ext.CLK and issuing the same to switching circuits 182 and 184. Switching circuit 182 is set on a side for receiving the output of switching circuit 180, and applying the same to the negative input node of differential amplifier 150. Switching circuit 184 is set on a side for receiving the output of switching circuit 180, and applying the same to the positive input of differential amplifier 152.

Switching circuit 186 is set on a side for receiving the output of differential amplifier 150, and applying the same to clock driver 154.

Switching circuit 188 is set on a side for receiving the output of synchronous circuit 156, and applying the same to switching circuit 190. Switching circuit 190 is set on a side for receiving the output of clock driver 154, and applying the same to clock tree 168. Switching circuit 192 is set on a side for receiving the output of synchronous mirror delay circuit 166, and applying the same to clock tree 170.

Switching circuit 194 is set on a side for receiving the output of QS signal input buffer 1069b, and applying the same to clock tree 176. Switching circuit 196 is set on a side for receiving the output of clock tree 170, and applying the same to data output buffer 74.

Owing to the above setting of switching circuits 182–196, the following DDR-SDRAM operation mode is set.

In this operation mode, signals produced by synchronous mirror delay circuit 166 are used as synchronous clock signals CLe and CLo for data output. By using the clock signals produced by synchronous mirror delay circuit 166, appropriate data input/output operation can be performed in such situations that SDRAM 1000 is operating with a high frequency and a skew in the clock signal may cause a problem in control of output of the clock from the input buffer to data I/O terminal 1070, and that the controller side is required to receive the data in accordance with the same timing as the external clock.

On the other hand, the output signal of, e.g., synchronous circuit 156 operating as the DLL circuit is not used for the input data control.

In this case, the external clock signals supplied to the device are complementary signals ext.CLK and /ext.CLK.

Further, the device has the structure allowing the bidirectional mode, in which signal QS is issued from the QS signal output terminal during the data output operation, and the data is taken into the device in accordance with signal QS applied from the controller side during the data read operation.

Internal clock signal int.CLK2 controlling the operations of internal circuits are produced by clock driver 154 in accordance with the output of differential amplifier 150. Internal clock signal int.CLK2 issued from clock driver 154 is transmitted to address signal input terminal group 1030 and external control signal input terminal group 1010 through clock tree 168, and is used for control of input timing of these signals.

One-shot pulse producing circuits 160 and 162 produce the one-shot pulses in accordance with the activation edges of the output signals of differential amplifiers 150 and 152, and OR circuit 164 issues the signal of double the frequency of external clock signal ext.CLK. In accordance with the output signal sent from OR circuit 164, synchronous mirror delay circuit 166 produces internal clock signal int.CLK1 having double the frequency of external clock signal ext.CLK.

Internal clock signal int.CLK1 thus produced is applied to data output buffer 1072b and QS signal output buffer 1069a through clock tree 170.

In the foregoing description, first internal clock signal int.CLK1 has double the frequency of external clock signal ext.CLK. However, the invention is not restricted to this. In general, first internal clock signal int.CLK1 has a frequency which is larger by N times than that of external clock signal ext.CLK.

Figure 11:
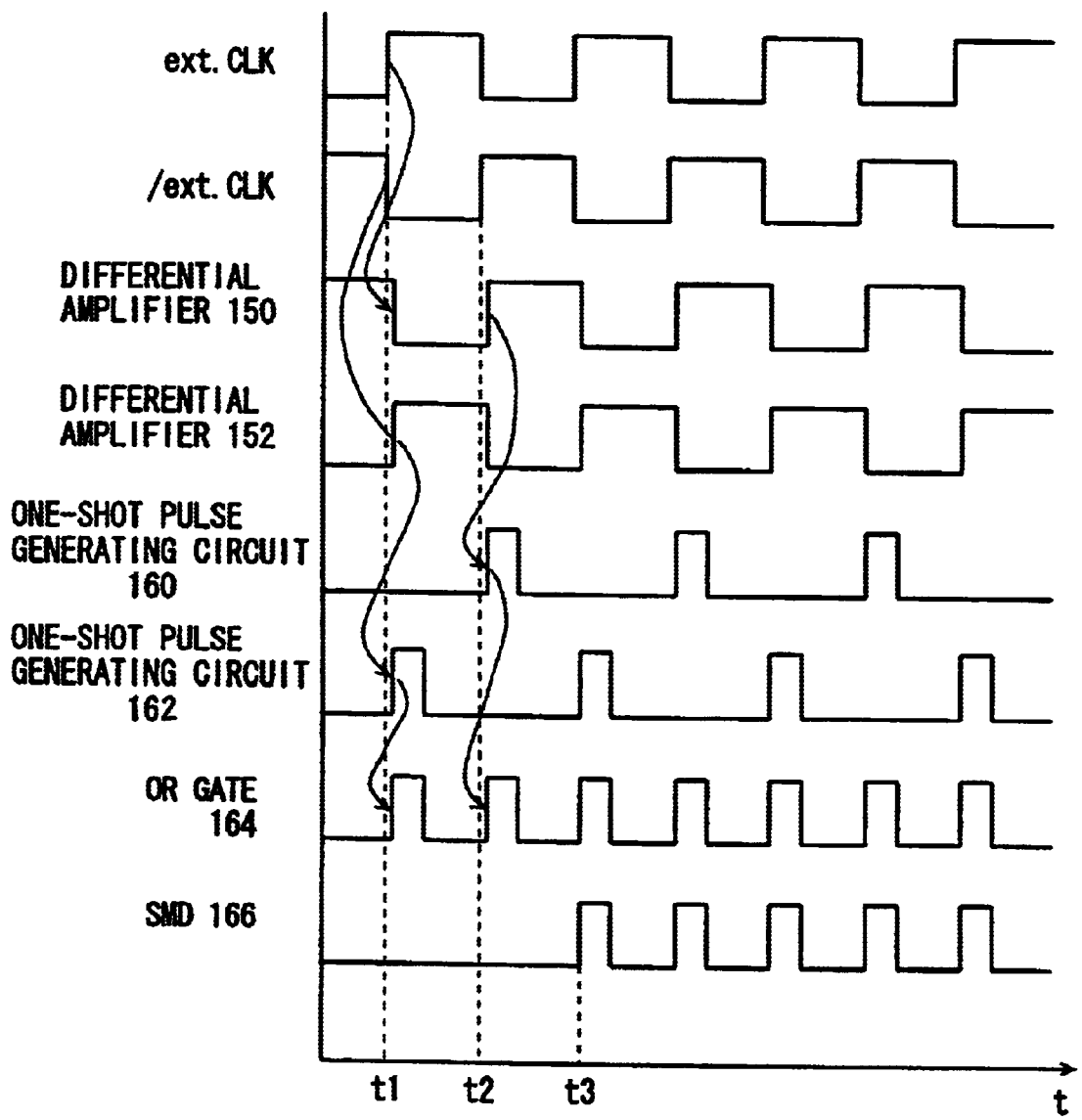
FIG. 11 is a timing chart showing an operation of a synchronous mirror delay circuit 166.

FIG. 11 is a timing chart showing operations of differential amplifiers 150 and 152, and one-shot pulse producing circuits 160 and 162 as well as OR gate 164 and synchronous mirror delay circuit 166.

At time t1, external clock signal ext.CLK rises to the active level ("H" level), and signal /ext.CLK falls to the inactive level ("L" level). In response to this, the output level of differential amplifier 152 changes to "H" level, and the output level of differential amplifier 152 changes to "L" level. In response to the rising of output level of differential amplifier 152 to "H" level, one-shot pulse generating circuit 162 issues a one-shot pulse, and OR gate 164 receiving this one-shot pulse issues a corresponding one-shot pulse.

At time t2, signal ext.CLK falls to "L" level, and signal /ext.CLK rises to "H" level. In response to this, the output level of differential amplifier 150 attains "H" level. In response to this, one-shot pulse generating circuit 160 issues a one-shot pulse, and OR gate 164 issues a corresponding one-shot pulse signal.

Thereafter, OR gate 164 issues the one-shot pulse in response to each of the rising edges of external clock signal ext.CLK and inverted external clock signal /ext.CLK.

Synchronous mirror delay circuit 166 receiving the output of OR gate 164 starts to issue internal clock signal int.CLK, which is synchronized with external clock signal ext.CLK and has double the frequency of external clock signal ext.CLK. at time t3, i.e., at second cycle after output of the first one-shot pulse from OR gate 164.

Figure 12:
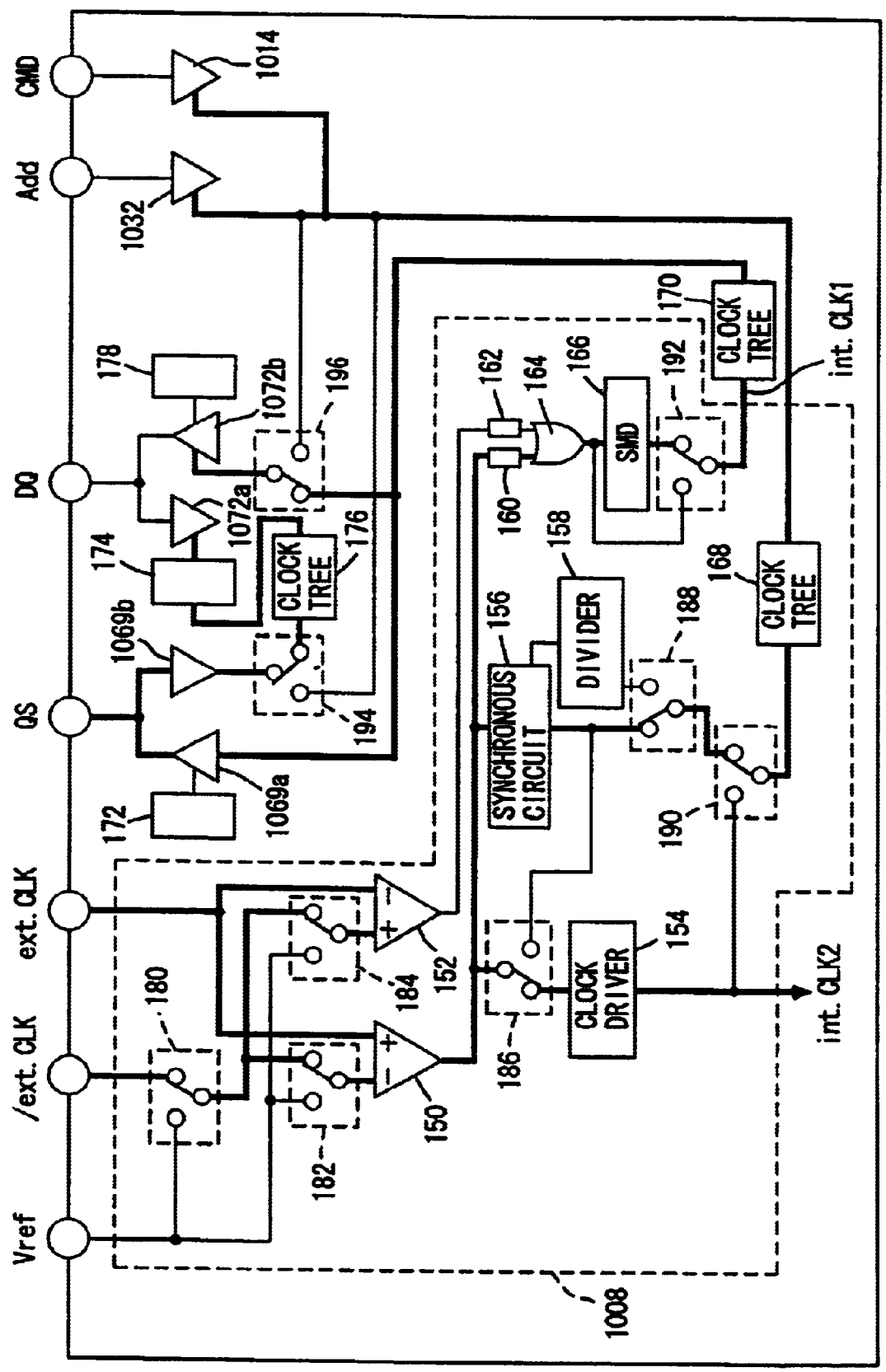
FIG. 12 is a first schematic block diagram showing states of switching circuits 180–196.

FIG. 12 is a schematic block diagram showing states of switching circuits 180–196 in internal control clock producing circuit 1008 of the structure shown in FIG. 10, and particularly the states in the case where the clock signals issued from internal synchronous circuit 156 are used for the operation of receiving the address signal and the external control signal in the DDR-SDRAM operation mode.

In the state shown in FIG. 12, the operation mode of SDRAM 1000 is the DDR-SDRAM operation mode, internal clock signal int.CLK issued from synchronous mirror delay circuit 166 is used for the data output, the signal issued from synchronous circuit 156 is used for input of the address signal and the external control signal, and the signal issued from clock driver 154 is used for the operation of internal circuits.

Further, the output of synchronous mirror delay circuit 166 is applied to QS signal I/O terminal so as to allow the operation in the bidirectional mode.

Owing to the above state and structure, it is possible to suppress, in the DDR-SDRAM operation mode, an influence by a skew in the external clock signal, which may be exerted on the operation of receiving the address signal and the external control signal with a higher operation frequency.

Figure 13:
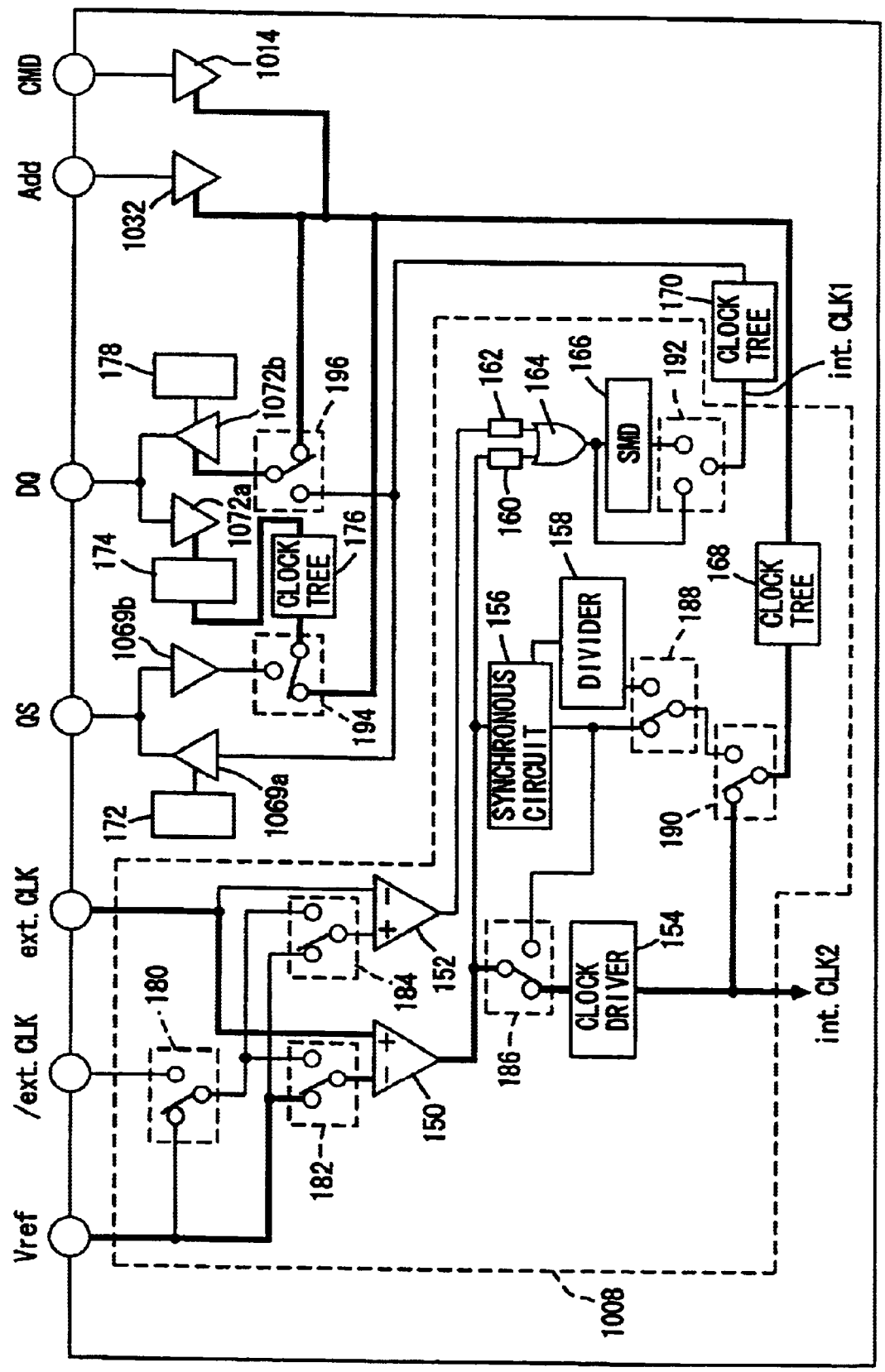
FIG. 13 is a second schematic block diagram showing states of switching circuits 180–196.

FIG. 13 is a schematic block diagram showing the states of switching circuits 180–196 of internal control clock producing circuit 1008 in the case where SDRAM 1000 shown in FIG. 4 operates in the SDR-SDRM operation mode.

In FIG. 13, paths transmitting active signals in the SDR-SDRAM operation mode are likewise depicted by thick lines.

Switching circuits 180, 182 and 184 are on the side for receiving reference potential Vref. Differential amplifier 150 receives reference potential Vref and external clock signal ext.CLK, and issues the signal of the same frequency as external clock signal ext.CLK. Since switching circuit 186 is on the side for receiving the output of differential amplifier 150, clock driver 154 receives the output of differential amplifier 150, and issues internal clock signal int.CLK2 of the same frequency as external clock signal ext.CLK.

Since switching circuit 190 is on the side for receiving the output of clock driver 154, signal int.CLK2 issued from clock driver 154 is applied to the address signal input terminal group and the external control signal input terminal group through clock tree 168.

Further, switching circuits 194 and 196 are on the side for receiving the output of clock tree 168 so that the data input/output operation is controlled by the internal clock signal of the same frequency as external clock signal ext-.CLK.

In this case, switching circuit 194 is not on the side for receiving signal QS, and therefore is in the state not coping with the bidirectional mode.

As described above, the operation mode of internal control clock producing circuit 1008 is switched in accordance with the operation mode data held in mode register 1046, whereby the operation mode can be flexibly selected in accordance with the specifications of the system equipped with SDRAM 1000.

[Structure of I/O Line Pairs for Data Reading]

Figure 14:
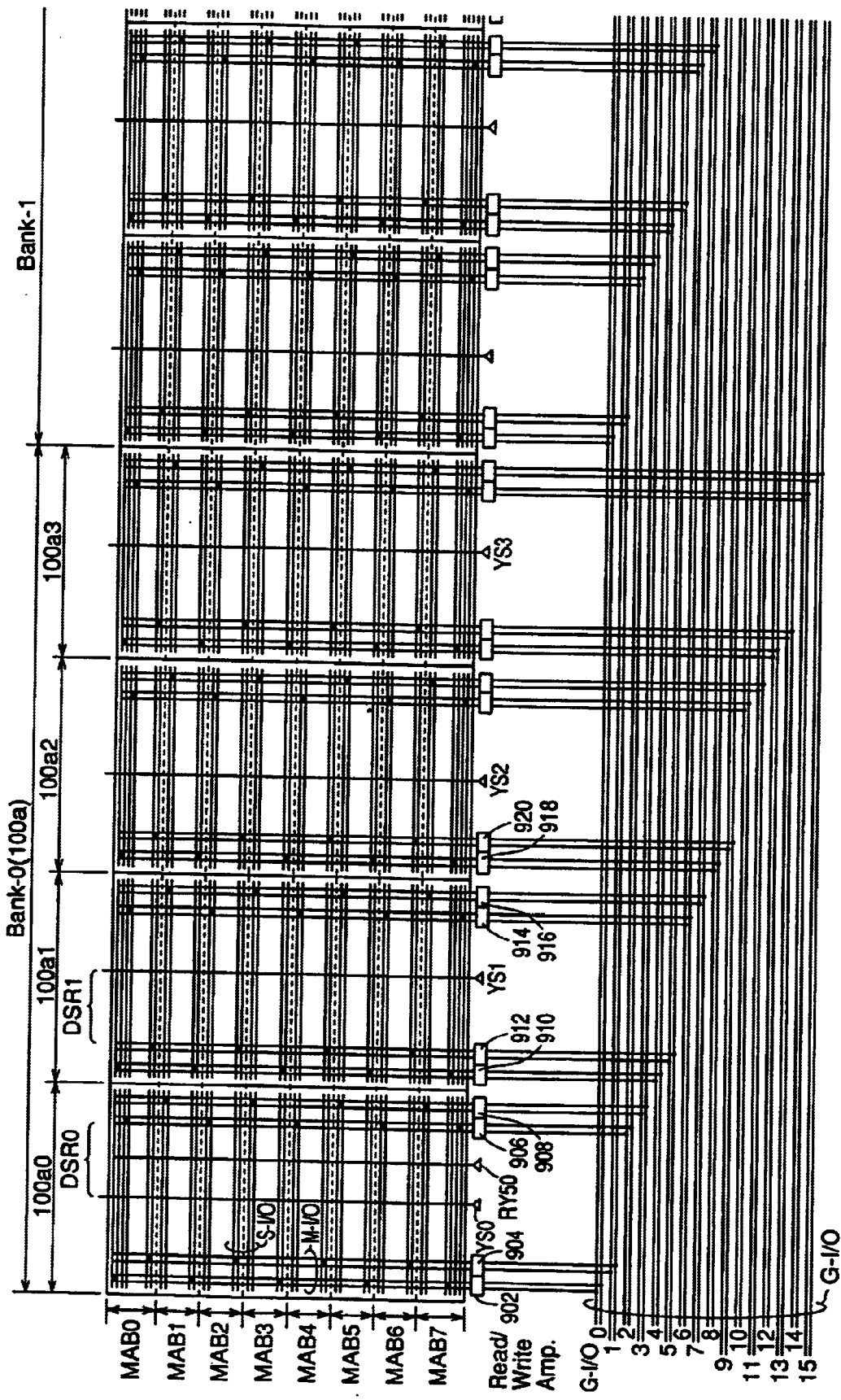
FIG. 14 is a block diagram by way of example arrangement of sub-I/O line pairs S-I/O and main I/O line pairs M-I/O.

FIG. 14 is a block diagram showing by way of example the arrangement of sub-I/O line pairs S-I/O and main I/O line pairs M-I/O for transmitting the data read from the memory array blocks shown in FIG. 4 onto global I/O data bus G-I/O.

In FIG. 14, bank 0 corresponding to memory cell array block 100a in FIG. 4 is divided into four regions 100a0–100a3.

Bank 0 (Bank-0) corresponds to one (i.e., a region of 64 Mbits) among 16 divided portions of memory cell array 100 shown in FIG. 4. In the structure shown in FIG. 4, one of banks 100a, 100b, 100c, 100d, 100i, 100j, 100k and 100l belonging to the left half plane is activated, and the data is issued from corresponding data I/O terminals DQ0–DQ15 in the read operation. Also, one of banks 100e, 100f, 100g, 100h, 100m, 100n, 100o and 100p belonging to the right half plane in FIG. 4 is activated, and the data is output from corresponding data I/O terminals DQ16–DQ31.

As shown in FIG. 14, each of regions 100a0–100a3 is divided into eight memory cell mats MAB0–MAB7 arranged in the column direction. The sense amplifier band (not shown) is provided for each of the regions of each memory array mat for amplifying the data sent from the selected memory cells.

Description will not be given on, e.g., the structure of region 100a0.

For each mat, sub-I/O line pairs S-I/O extend in the word line direction (i.e., along G-I/O in the figure). When a column select line YS selected in accordance with the external address signal is activated, it is connected to the sense amplifier for the corresponding memory cell column so that the read data amplified by the sense amplifier is transmitted onto sub-I/O line pair S-I/O. The sub-I/O line pair S-I/O has a complementary structure in which two line transmit one data.

Main input/output line pairs extend longitudinally (i.e., in a direction perpendicular to G-I/O in the figure, and in other words in the column direction of the memory cell array) through each memory cell array mat. The data transmitted through sub-I/O line pair S-I/O is amplified by a sub-amplifier SUA arranged in the crossing between this sub-I/O line pair S-I/O and main I/O line pair M-I/O, and thereafter is transmitted onto corresponding main I/O line pair M-I/O. The read data transmitted through main I/O line pair M-I/O is amplified by a read/write amplifier 902, 904, 906 or 908, and is transmitted to corresponding global I/O bus G-I/O.

Main I/O line pair has a complementary structure which uses two lines for transmitting one data.

In FIG. 14, a region depicted by a solid square in each crossing between the sub-I/O line pair and the main I/O line pair M-I/O represents the position of a sub-amplifier and a transfer gate making connection between sub-I/O line pair S-I/O and main I/O line pair M-I/O.

In the write operation, the externally supplied data is written into the selected memory cell through a path reverse to the above.

The memory cells which are selected by activation of one column select line are, e.g., four in number.

In this case, 16 data are simultaneously read out in the example shown in FIG. 14 when column select lines YS0, YS1, YS2 and YS3 are activated in regions 100a0, 100a1, 100a2 and 100a3, respectively.

Figure 15:
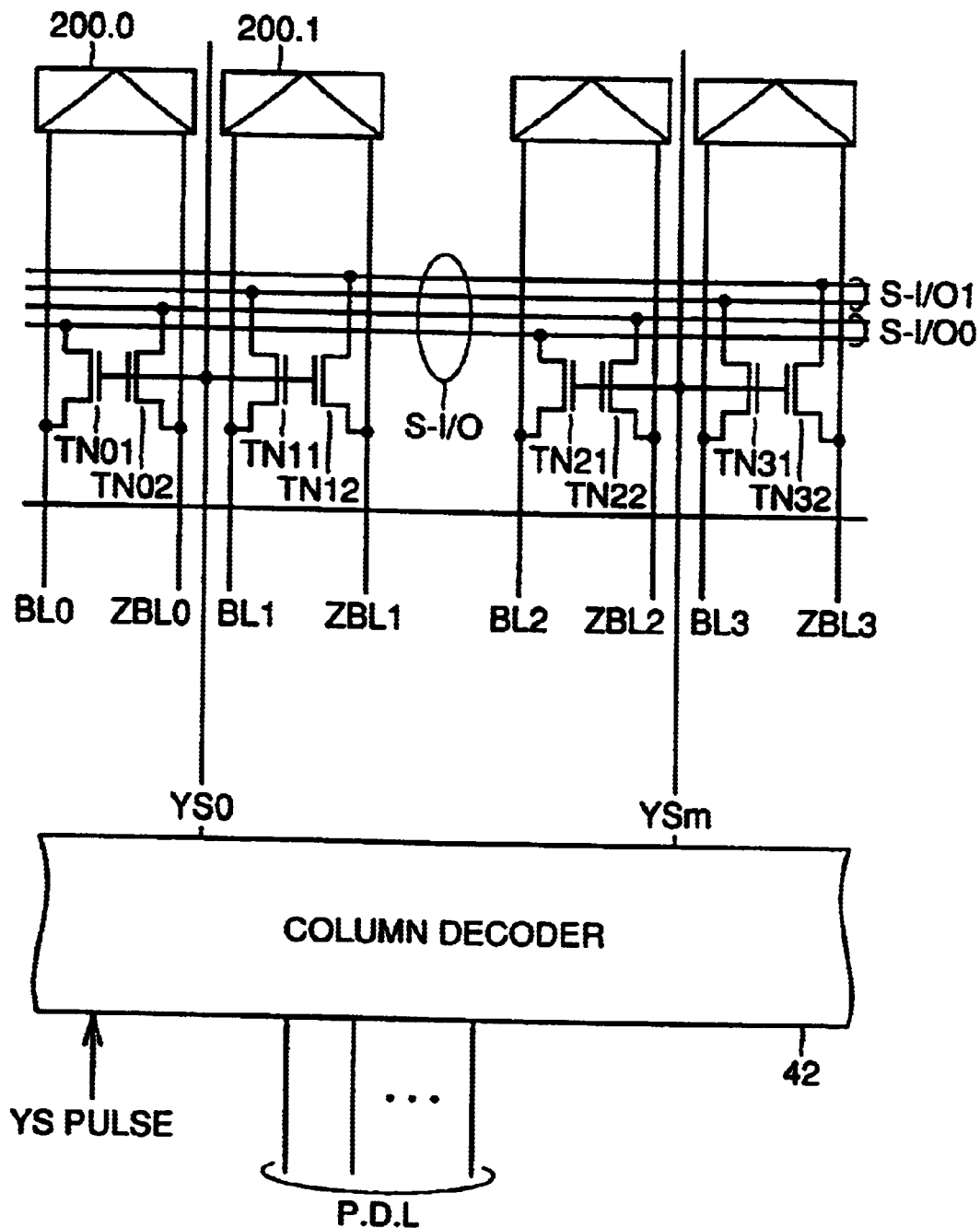
FIG. 15 is a circuit diagram showing a structure of a transfer gate portion.

FIG. 15 is a circuit diagram showing a structure provided, e.g., in memory cell column region 100a0 for transmitting the data from the selected bit line pair onto sub-I/O line pair S-I/O.

FIG. 15 particularly shows a portion of the structure wherein one column select line YS0 connects two memory cell columns to two sub-I/O line pairs S-I/O, respectively.

Referring to FIG. 15, when column select line YS0 is selected, bit line pair BL0 and ZBL0 is connected to sub-I/O line pair S-I/O0 through transfer gate transistors TN01 and TN02. Thereby, the read data amplified by sense amplifier 200.0 is transmitted onto sub-I/O line pair S-I/O0.

Another bit line pair BL1 and ZBL1 is connected to sub-I/O line pair S-I/O1 through transfer gate transistors TN11 and TN12, when column select line YS0 is selected. Thereby, the read data amplified by sense amplifier 200.1 is transmitted onto sub-I/O line pair S-I/O1.

Column decoder 42 responds to activation of signal YS pulse by selecting column select lines YS0 and others based on the signals sent from predecode lines P.D.L.

Figure 16:
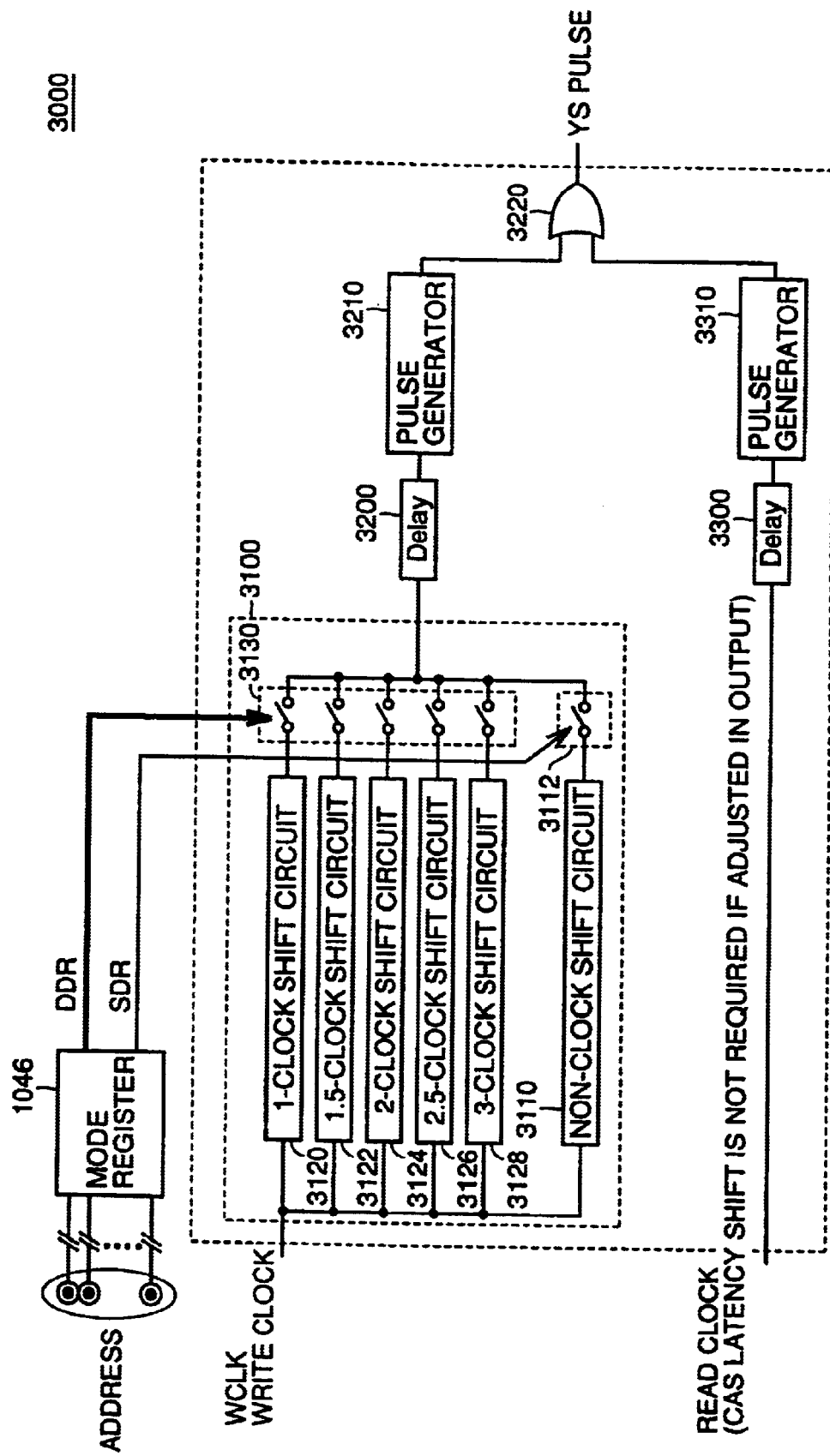
FIG. 16 is a schematic block diagram showing a structure of a column select timing control circuit 3000.

FIG. 16 is a schematic block diagram for showing a structure of a column select timing control circuit 3000, which is provided in SDRAM 1000 of the embodiment 1 of the invention for producing the column select pulse signal YS pulse in FIG. 3 from write clock WCLK issued for controlling the write operation or read clock RCLK issued for controlling the read operation.

Column select timing control circuit 3000 includes a variable shift circuit 3100 which receives write clock WCLK produced within SDRAM 1000 for the write operation, and outputs the same with a delay of a predetermined time, a delay circuit 3200 which receives the output of variable shift circuit 3100, and outputs the same with a delay of a predetermined time, a pulse generating circuit 3210 which receives the output of delay circuit 3200, and generates a pulse signal, a delay circuit 3300 which receives the internal read clock signal generated within SDRAM 1000 in the read operation, and outputs the same with a delay of a predetermined time, a pulse generating circuit 3310 which receives the output of delay circuit 3300, and generates a pulse signal, and an OR circuit 3220 which receives the outputs of pulse generating circuits 3210 and 3310, and outputs the YS pulse signal for selecting the memory cell column.

The variable shift circuit 3100 includes a clock shift circuit 3110 which operates in response to the control signal sent from mode register 1046, and outputs received write clock signal WCLK without shifting the same in the SDR-SDRAM operation mode, a switch circuit 3112 which operates under the control by mode register 1046 to output selectively the output of clock shift circuit 3110 as the output of variable shift circuit 3100 in the SDR-SDRAM operation mode, a 1-clock shift circuit 3120 which receives internal write clock signal WCLK in the DDR-SDRAM operation mode, and outputs the same with a delay of one clock, a 1.5-clock shift circuit 3122 which receives signal WCLK, and outputs the same with a delay of 1.5 clocks, a 2-clock shift circuit 3124 which receives signal WCLK, and outputs the same with a delay of 2 clocks, a 2.5-clock shift circuit 3126 which receives signal WCLK, and outputs the same with a delay of 2.5 clocks, a 3-clock shift circuit 3128 which receives signal WCLK, and outputs the same with a delay of 3clocks, and a switch circuit 3130 which is controlled in accordance with the operation mode data set in mode register 1046, receives the outputs of 1- though 3-clock shift circuits 3120–3128, and selectively outputs one of the received outputs as the output of variable shift circuit 3100.

Thus, the data output portion adjusts the magnitude of CAS latency in the read operation mode, and therefore the YS pulse is produced from read clock signal RCLK without through the shift operation in the read operation mode.

In the write operation, however, a time margin for operations such as serial-parallel conversion of the data and selection the memory cell is required before the data is actually written into the memory cell array after write command WRITE is externally applied. Therefore, the shift operation for the predetermined clock time is performed, and the YS timing is produced in accordance with delayed timing.

As described above, variable shift circuit 3100 produces the YS pulse in accordance with the mode data set in mode register 1046 with a delay of the predetermined clock cycle(s) from internal write clock signal WCLK.

In the above embodiment, the timing of activation of the YS pulse during the write operation in the SDR-SDRAM operation mode corresponds to the activation edge of external clock signal ext.CLK, at which the write command is input. In contrast to this, the column selecting operation in the DDR-SDRAM operation mode is performed in accordance with the activation edge of the clock which is shifted by two clocks from the activation edge of external clock signal ext.CLK, at which the write command is input. According to the above embodiment, the operations in these different manners can be achieved on the synchronous semiconductor memory device on the same chip.

In the structure described above, the amount of delay of the YS pulse changes depending on whether the synchronous semiconductor memory device operates in the SDR-SDRAM operation mode or the DDR-SDRAM operation mode. However, such a structure may be employed that can adjust the timing of the row-related circuit operations such as activation of the word line and activation of the sense amplifier as well as the timing of the column-related circuit operations such as activation of the data bus and input/output of the input/output data in addition to the activation of the YS pulse described above. The above adjustment can be performed by the structure in which the control signals for controlling the respective operations are delayed by predetermined clock cycles from the clock signal forming the reference in accordance with the mode data set in mode register 1046.

By employing the above structure, the device can flexibly meet the intended specifications of the system even if each bank is activated independently of the others, and the address bus and the command data bus are provided commonly to the plurality of banks.

[Embodiment 2]

In SDRAM 1000 of the embodiment 1, the structure performing the serial-parallel conversion by the register circuit shown in, e.g., FIG. 9 is employed in the data I/O portion for allowing switching between the SDR-SDRAM operation mode and the DDR-SDRAM operation mode.

More specifically, in the data write operation of the structure of the embodiment 1, 8 bits of data are alternately written from the data I/O terminal to register circuits 2154 and 2156, and writing of the data into the memory cell array is performed by alternately applying the data from registers 2154 and 2156 onto the data bus in accordance with clock signal WCLK.

In the above operation, the write data is supplied to the register circuits (data latches) in response to input of the write command, and then is successively transferred to the array. In connection with this, such a structure may be employed that, and at the same time as the above transfer of the write data, the write data can be transferred to the latch circuits (registers 2146 and 2148) provided for the output data in accordance with clock WCLK used for the data transfer to the array. According to this structure, registers 2146 and 2148 can be used as cache memories of a certain kind.

Figure 17:
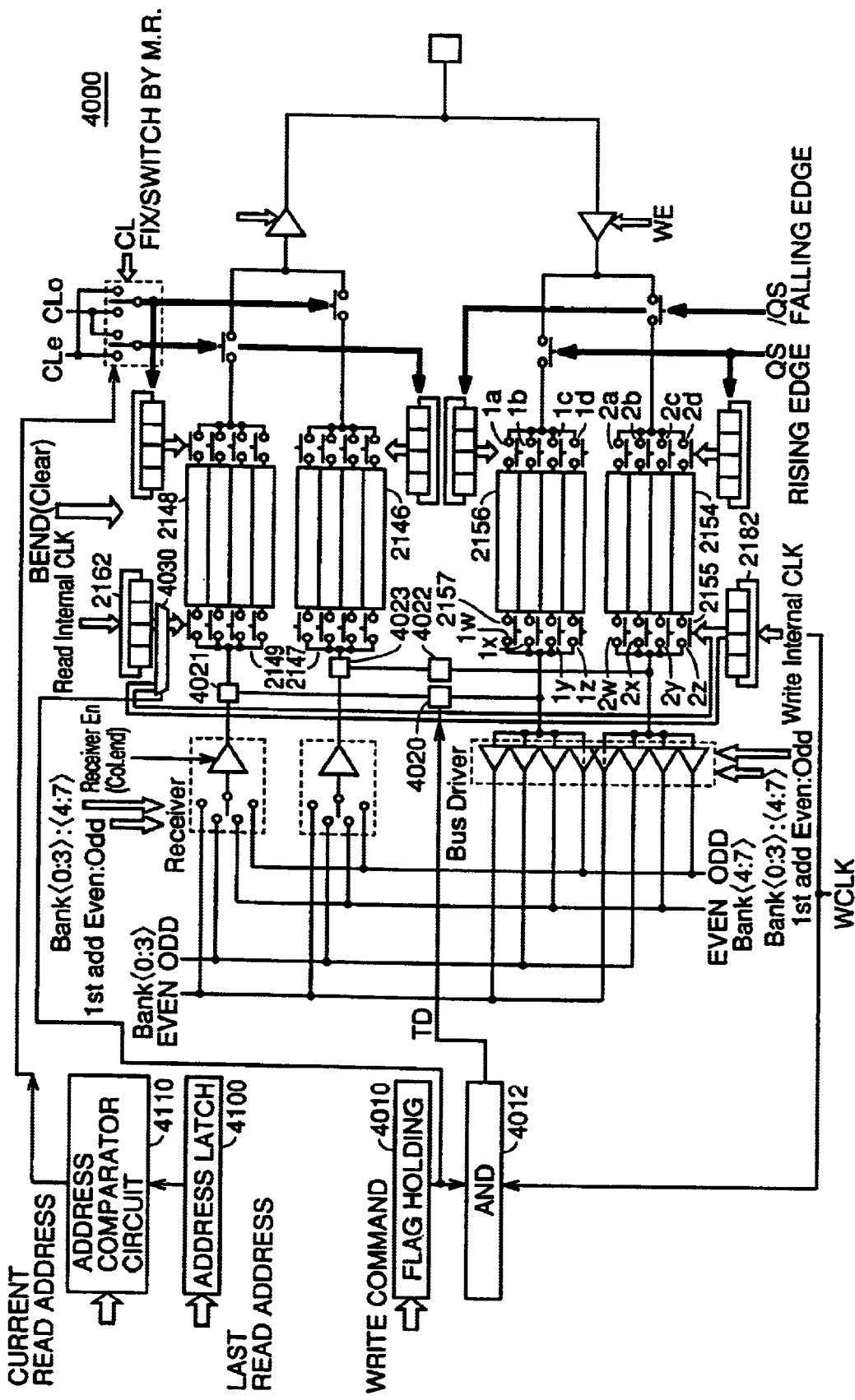
FIG. 17 is a schematic block diagram showing a structure of a data I/O portion 4000.

FIG. 17 is a schematic block diagram showing a structure of a data I/O portion 4000 allowing the above operation, and is comparable to FIG. 9 showing the embodiment 1.

The structure in FIG. 17 differs from the structure of data I/O portion 2000 of the embodiment 1 in the following points.

When the write command is first applied, a flag holding circuit 4010 holds the level of the write flag while the write operation is designated. An AND circuit 4012 receives the output of write flag holding circuit 4010 and write clock signal WCLK, and issues a transfer clock signal TD. A data transfer buffer 4020 operates in accordance with transfer clock TD, and successively transfers the data, which is sent from register 2156 to the memory cell array, to register circuit 2148 provided for data reading. A data transfer buffer 4022 operates in accordance with transfer clock TD, and successively transfers the data, which is sent to the memory cell array from register 2154 provided for data writing, to register 2146 provided for data reading.

Further, during a period over which the data write operation is instructed in accordance with the output of flag holding circuit 4010, a multiplexer circuit 4030 receives an output signal, which is sent from shift register 2182 for controlling selection and output of the data between those sent from register circuits 2156 and 2154, in accordance with clock signal WCLK, and issues the received signal as the signal for controlling switching circuits 2147 and 2149 provided on the memory cell array sides of register circuits 2146 and 2148, respectively. During a period over which the write operation is not instructed, multiplexer circuit 4030 issues the output, which is sent from shift register 2162, as the signal for controlling switching circuits 2147 and 2149.

Furthermore, an address latch circuit 4100 holds the address designated in the last read or write operation, and an address comparator circuit 4110 compares the read address applied in the read operation with the address held in address latch circuit 4100. If there is a match between them, address comparator circuit 4110 activates switching circuit 2166 to issue the data held in register circuits 2146 and 2148 to data I/O terminal DQ0.

The address signal held in address latch circuit 4100 may be the address signal in the last read operation or the address signal in the last write operation.

According to the above structure, when the read operation is instructed to read the data from the same address as that which was designated in the last read operation, the data which has been held in registers 2146 and 2148 is output from data I/O terminal DQ0 and others without accessing the memory cell array.

When the read operation is instructed to read the data at the same address as that in which the data sent from the data I/O terminals was written by the immediately preceding write operation, the data held in registers 2146 and 2148 are likewise output from the corresponding data I/O terminal DQ0 and others without accessing the memory cell array.

In contrast to the above, when the address designated for reading is different from the address which was designated in the immediately preceding read or write operation, the data read from the memory cell array is transferred to register circuits 2146 and 2148. The data thus transferred is successively and alternately supplied to the lowest layer and the layers above them of register circuits 2146 and 2148. In an actual operation, the operation itself of reading the data from the memory cell array is executed simultaneously with the operation of determining match/mismatch between the address signals, and an operation is performed to invalidate the data which is read from the array for output from receivers 2142 or 2143 in the output portion, when the address comparator circuit issues a result indicating the match.

Figure 18:
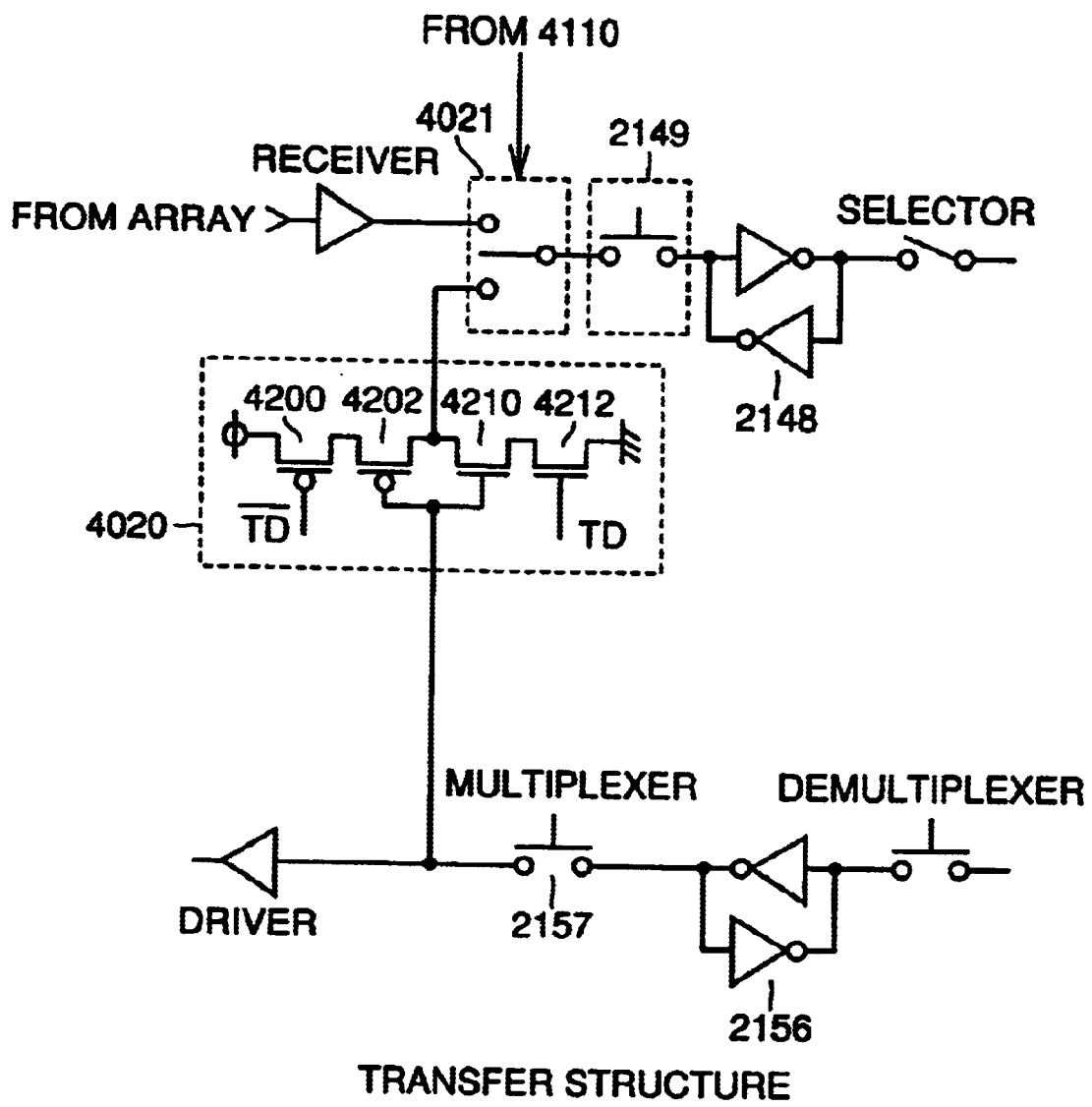
FIG. 18 is a circuit diagram showing a structure of a data transfer buffer 4020.

FIG. 18 is a circuit diagram showing a structure of data transfer buffer 4020 shown in FIG. 17.

Data transfer buffer 4020 includes p-channel MOS transistors 4200 and 4202, and n-channel MOS transistors 4310 and 4212, which are connected in series between power supply potential Vcc and ground potential GND. p- and n-channel MOS transistors 4202 and 4210 receive on their gates an output of a multiplexer 2157 provided for selecting the output of register circuit 2156. p.channel MOS transistor 4200 receives an inverted signal /TD of transfer clock TD, and n-channel MOS transistor 4212 receives transfer clock TD.

The output of data transfer buffer 4020 is applied to demultiplexer 2149 through switching circuit 4021.

In accordance with the output of address comparator circuit 4110, switching circuit 4021 selectively applies the output of receiver 2143 or the output of data transfer buffer 4020 to demultiplexer 2149.

For simplicity reason, FIG. 18 shows by way of example the structure of each of register circuits 2156 and 2148 relating to one bit.

Figure 19:
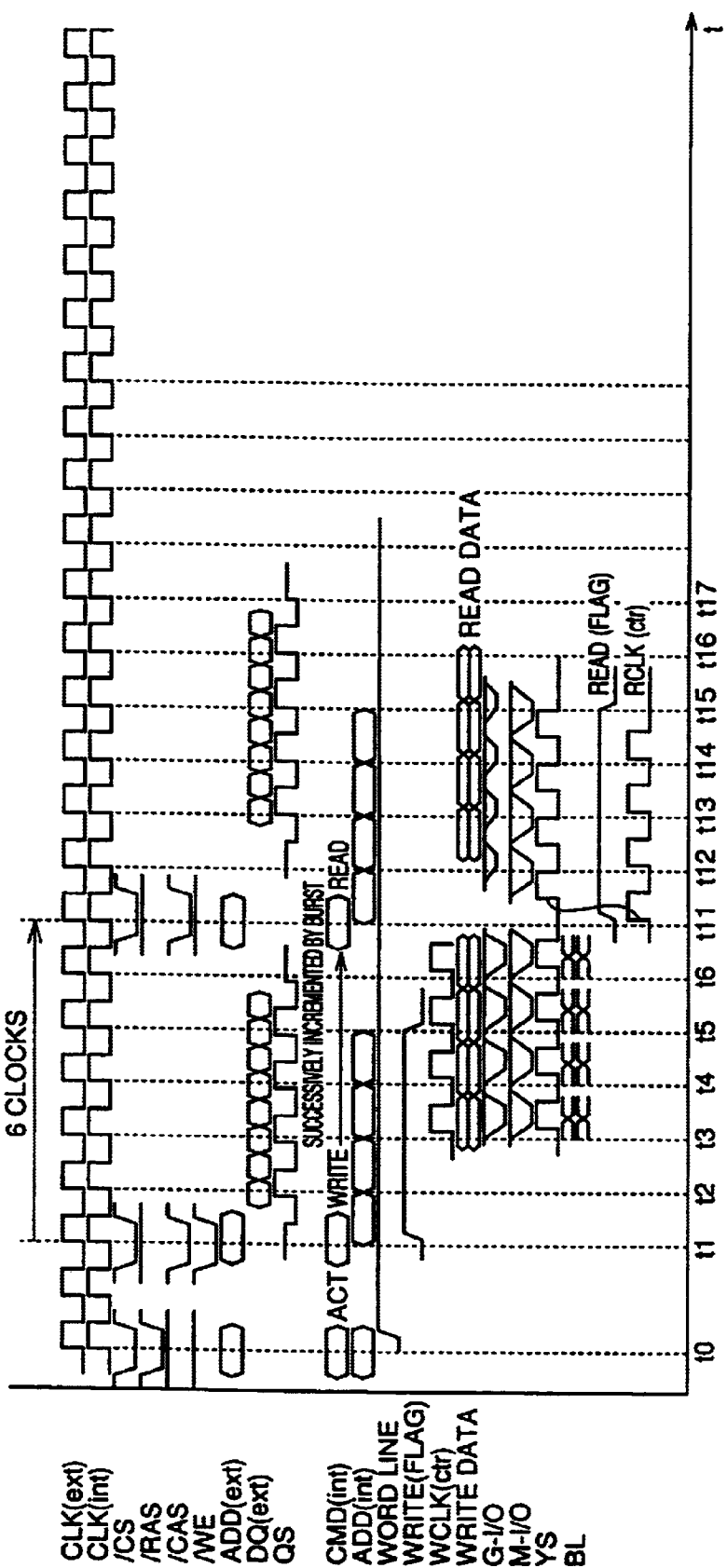
FIG. 19 is a timing chart showing an operation of an SDRAM having a cache function.

FIG. 19 is a timing chart showing an operation of the SDRAM having the cache function already described with reference to FIGS. 17 and 18.

The timing chart of FIG. 19 shows a normal operation of the DDR-SDRAM SDRAM with the burst length of 8, CAS latency of 2 and write latency of 2.

At time t0 in FIG. 19, i.e., at the rising edge of external clock signal ext.CLK, command ACT instructing activation of the SDRAM is designated in accordance with the active states of signals /CS and /RAS.

At time t0, the row address and the bank address are taken and held in row address latch 1048 and bank address latch 1052, respectively.

At subsequent time t1, i.e., at the edge of activation of internal clock signal int.CLK, command WRITE for instructing the write operation is issued in response to the active states of signals /CS, /CAS and /WE.

At the same time, the column address is input, and column address latch 1050 holds the value thereof. At this time, the operation mode of burst write has been set. Therefore, the write operation in and after the next cycle will be performed while automatically incrementing the column address within SDRAM 1000 by burst address counter 1060.

In response to designation of the write operation, flag signal WRITE instructing the internal write operation changes to the active state.

Thereafter, the write data is changed outside SDRAM 1000 in synchronization with signal QS applied to SDRAM 1000, whereby the write data is taken in.

The data which has been written in serial is converted into parallel data two bits at a time by data I/O circuit 1080, and is written into the selected memory cells at time t3 and subsequent times t4–t6. At time t11 after the above, i.e., at the rising edge of internal clock signal int.CLK, command READ for instructing the read operation is designated in response to the fact that signals /CS and /CAS are active and signal /WE is inactive.

In response to this, SDRAM 1000 internally starts production of internal clock signal RCLK instructing the read operation.

The data read from the memory cell column, which is selected at the activation edge of YS pulse activated between times t11 and t12, is applied to data I/O circuit 1086 through main I/O line pair M-I/O and global I/O line pair G-I/O. In the data I/O circuit 1018, the parallel data of two bits, which was read out simultaneously, is converted into the serial data, which is applied to data I/O terminal DQ0 and others in response to signal QS issued from the synchronous mirror delay circuit. Also, signal QS is externally sent from SDRAM 1000 for allowing an external portion such as a memory controller to recognize the output data.

Thereafter, the read data which was read two bits at a time in parallel is converted into the serial data, and is externally read out from SDRAM 1000.

Figure 20:
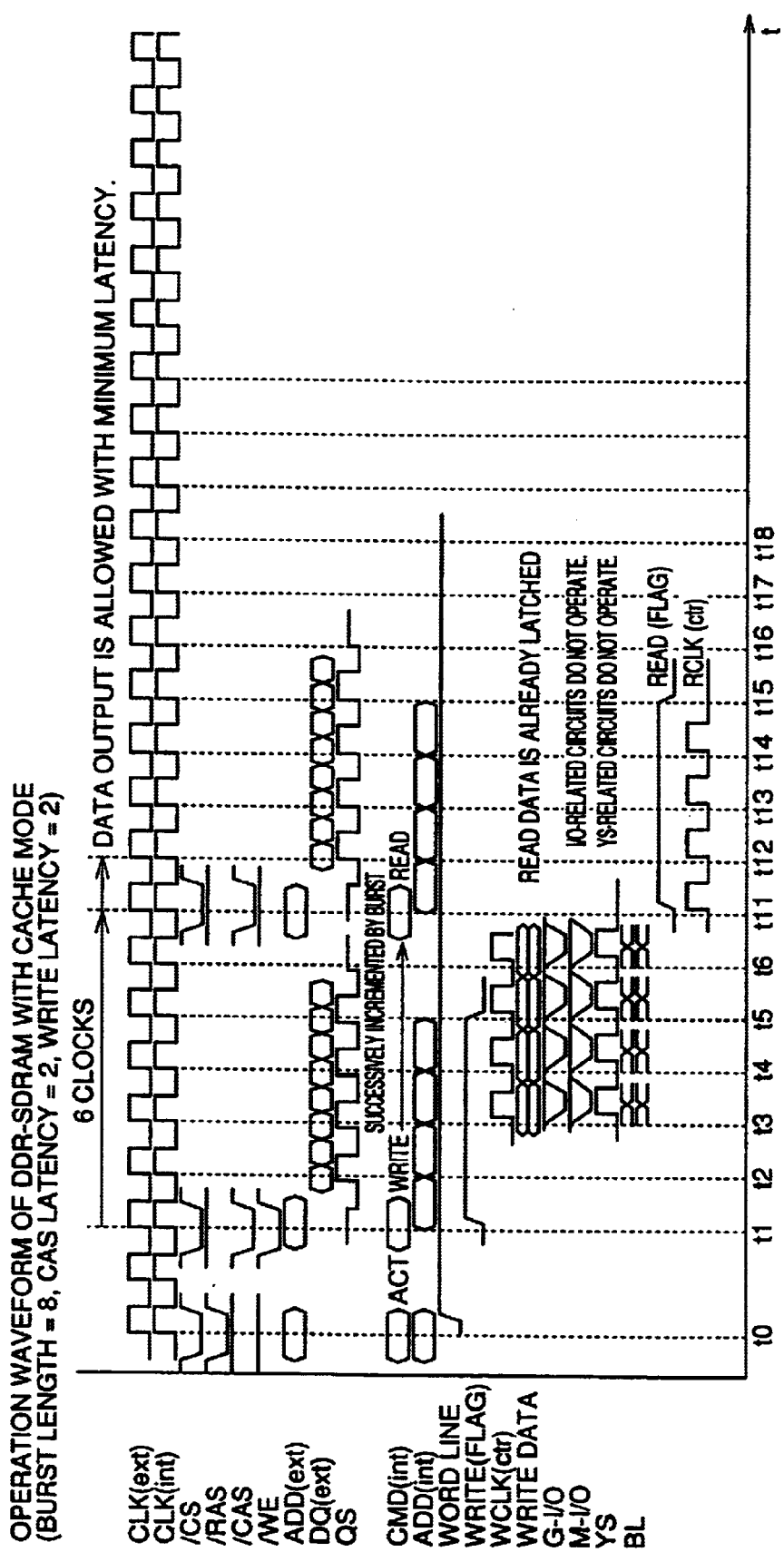
FIG. 20 is a timing chart showing a read operation performed when cache hit occurs in a cache operation mode.

FIG. 20 is a timing chart showing the read operation in the cache operation mode, and particularly the operation of reading out the data of the same address as the data which was written immediately before the reading. FIG. 20 is comparable to FIG. 19.

At time t0, the activation of SDRAM 1000 is instructed. The operation for writing the data into the memory cells during a period from t0 to t6 are similar to those shown in FIG. 22, and therefore will not be discussed below.

At time t11, i.e., at the rising edge of internal clock signal int.CLK, READ command is designated and the address signal is applied. When address comparator circuit 4110 detects that the address designated by this address signal is the same as the address where the data was written at time t1, external output of the read data and signal QS from SDRAM 1000 can starts at time t12 delayed by only one clock from time t11, i.e., with the minimum latency, because the data to be read has already been latched in register circuits 2146 and 2148.

According to the above structure, the register circuits provided in I/O data portion 4000 are used substantially as cache memories. Therefore, the data read speed can be increased in the case where the data is to be read from the same address as that in the immediately preceding write or read operation.

During the above operation in the bidirectional mode, as already described, signal QS is applied to SDRAM 1000 for data writing, and is externally output from SDRAM 1000 for data reading. Therefore, the timing of start of data output from SDRAM 1000 can be recognized on the controller side based on signal QS.

[Modification of Embodiment 2]

In the embodiment 2, eight data registers for latching the data are present for one data I/O terminal. These eight data which are input or output in serial are handled as one set of data, and the operation in the cache mode is performed every time a leading address corresponding to the data set is input.

For executing the operation in the cache mode on the further subdivided data sets, a plurality of sets of address latches may be prepared. In this case, the addresses are successively set in accordance with input of the write commands so that the latch group for outputting the data can be divided into the number equal to that of the sets of the address latches described above. Thereby, the above operation in the cache mode for the further subdivided data sets can be performed.

Figure 21:
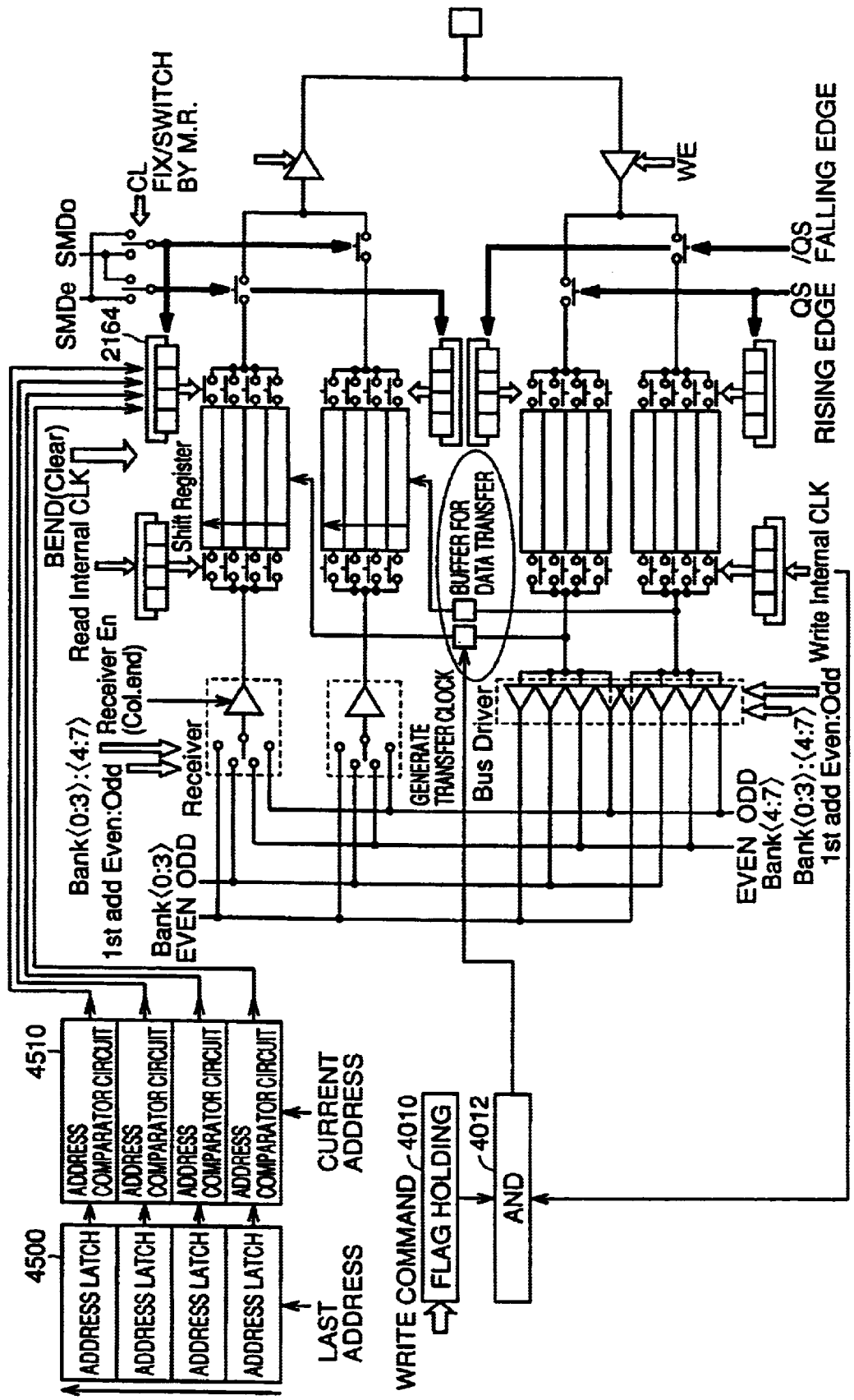
FIG. 21 is a schematic block diagram showing a structure of a data I/O portion 5000.

FIG. 21 is a schematic block diagram showing a structure of a data I/O portion 5000, which can operate in the cache mode for the subdivided data sets as described above.

In the example shown in FIG. 21, two data per one data I/O terminal forms one set. Thus, one data set is formed of two data which are simultaneously transferred to register circuits 2146 and 2148 in accordance with one transfer clock.

Assuming that the whole chip includes 32 data I/O terminals, operation as the cache memory can be executed on sets of 64 data, and in other words, data of 8 bytes can be processed by operating registers 2146 and 2148 as the cache memories.

In the above case, each of register circuits 2146 and 2148 is divided into four by providing one data I/O terminal for two data. Since this structure is present for each of 32 data I/O terminals, 64 data can be externally output from the 32 data I/O terminals in such a manner that the data held in register circuits 2146 and 2148 is externally output rather than the read data read from the memory cell array when a match occurs between the address signal held in one address latch and the address signal compared in the read operation.

In the structure shown in FIG. 21, therefore, address latch circuit 4500 has four sets of latch circuits.

In the structure shown in FIG. 21, the oldest data is erased from registers 2146 and 2148 every time the successive write operation is instructed, and for this purpose, each of registers 2146 and 2148 has a structure of a so-called "first-in first-out (FIFO) memory".

More specifically, in the write operation, the write data is applied from the output sides of write register circuits 2154 and 2156 through data transfer buffers 4020 and 4022 to latch circuits 2146 and 2148, respectively. The write data thus supplied is first stored in the lowermost layers of the FIFO memory. The registers 2146 and 2148 successively shift the stored data to the upper layer every time the data input operation is performed, and the data shifted to the uppermost layer will be erased when the next data input is performed.

Address latch circuit 4500 likewise has a FIFO structure, in which the old address is erased when four new addresses are input. The structure is also provided with four sets of address comparator circuits 4510 corresponding to address latch circuit 4500. Address comparator circuits 4510 compare the read addresses supplied thereto with the four sets of address signals held in address latch circuit 4500. When a match occurs between the input address and the address signal in the address latch, the value of shift register 2164 for output is forcedly rewritten so as to select the output sent from the output data latch which corresponds to the comparator circuit issuing the match signal. Thereby, the data in registers 2146 and 2148, and particularly the data corresponding to the address, which exhibits the match in the address comparator circuit, is applied to the data I/O terminal.

When the applied read address does not match with the address signal in address latch 4500 in the read operation, the data in the memory cell array is transferred to register circuits 2146 and 2148. The data thus transferred is likewise supplied to the lowermost layers of registers 2146 and 2148, i.e., FIFO memories. At the same time, the address signal is set in the lowermost layer of the address latch 4500.

In the actual operation, data reading from the memory cell array is executed in parallel with the operation of determining match/mismatch. If the address comparator circuit 4510 issues a result of comparison exhibiting the match, the data sent from the array to receivers 2142 and 2143 in the output portion is invalidated, and is not written into registers 2146 and 2148.

According to the above structure, it is possible to execute the cache mode operation on the further divided data sets.

[Embodiment 3]

Figure 22:
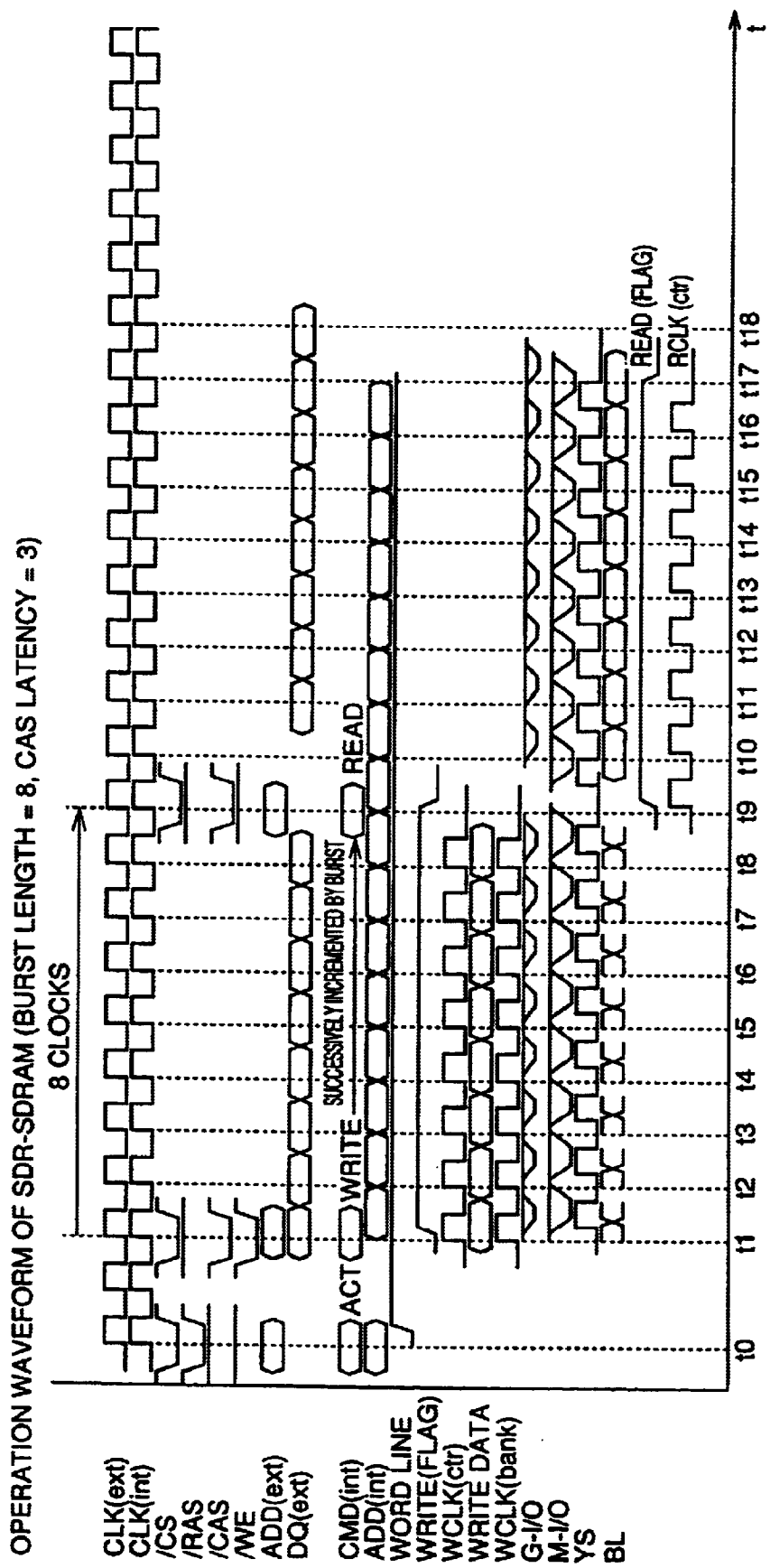
FIG. 22 is a timing chart showing an operation of an SDR-SDRAM.

FIG. 22 is a timing chart showing an operation of an SDR-SDRAM with a burst length of 8 and a CAS latency of 3.

At time t1, the WRITE command is applied, and the burst writing ends. Immediately after this, the READ command is applied at time t9. Except for this operation, the operations in FIG. 22 are basically the same as those of the SDR-SDRAM shown in FIG. 2.

In the SDR-SDRAM operation mode, the WRITE command for instructing the write operation is applied at time t1. Thereafter, the READ command for instructing the subsequent read operation cannot be applied until time t11, i.e., until 8 clocks elapse after time t1.

Figure 23:
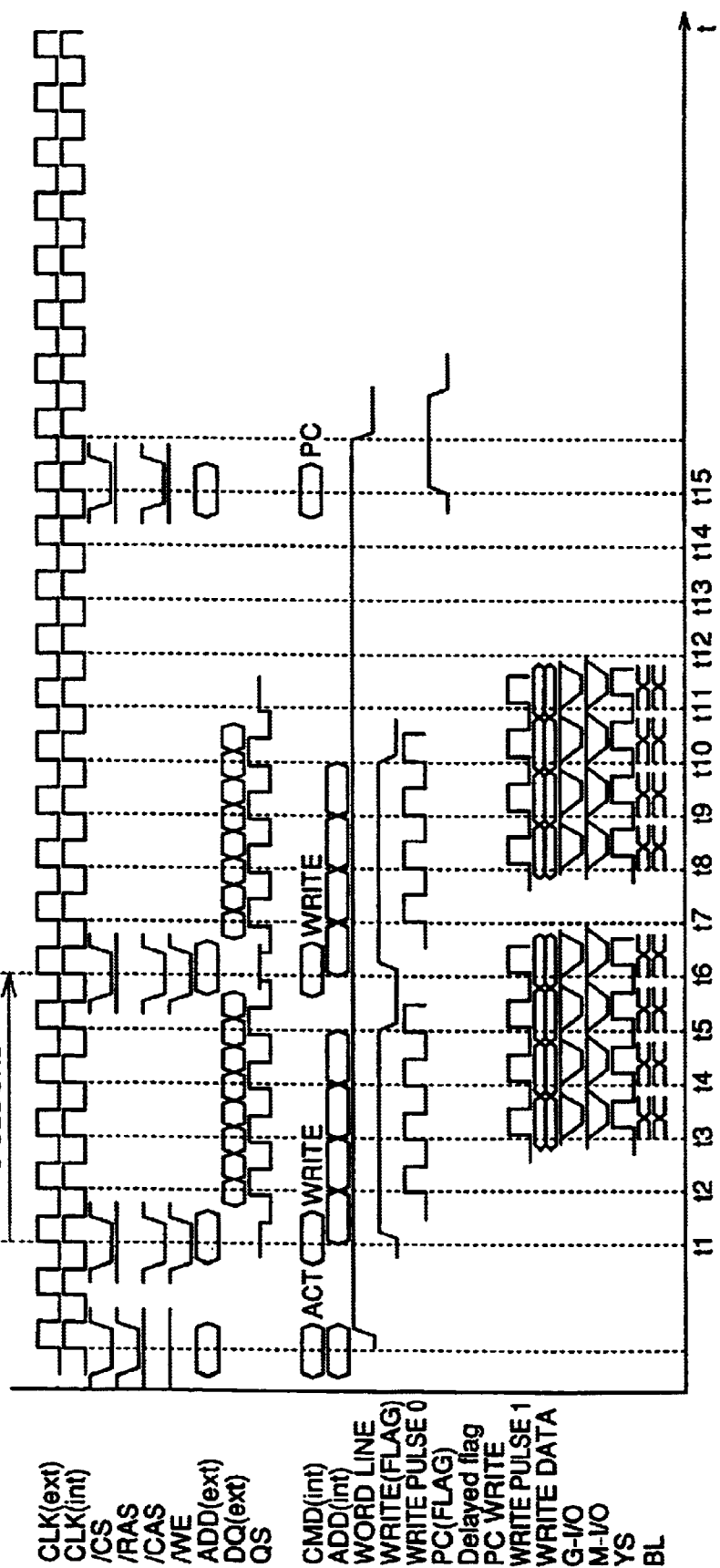
FIG. 23 is a timing chart showing an operation of a DDR-SDRAM.

FIG. 23 is a timing chart showing an operation of the DDR-SDRAM in the case where the burst length is 8 and the CAS latency is 2.

In the DDR-SDRAM operation, data writing is performed at the double data rate. However, the write latency of 2 clocks is present before the data is actually written into the memory cell array after the WRITE command is applied for instructing the write operation. Therefore, application of the WRITE command for designating the write operation subsequently to the application of WRITE command at time t1 cannot be performed until time t7, i.e., until 5 clocks elapses after time t1.

In any one of the cases where the write operation is to be performed subsequently to the last write operation, the operation of writing the data into the memory cell array starts after two clocks elapses from application of the WRITE command. Therefore, as shown in FIG. 23, the WRITE command can be applied when a time of 5 clocks elapses after the first WRITE command is applied.

Figure 24:
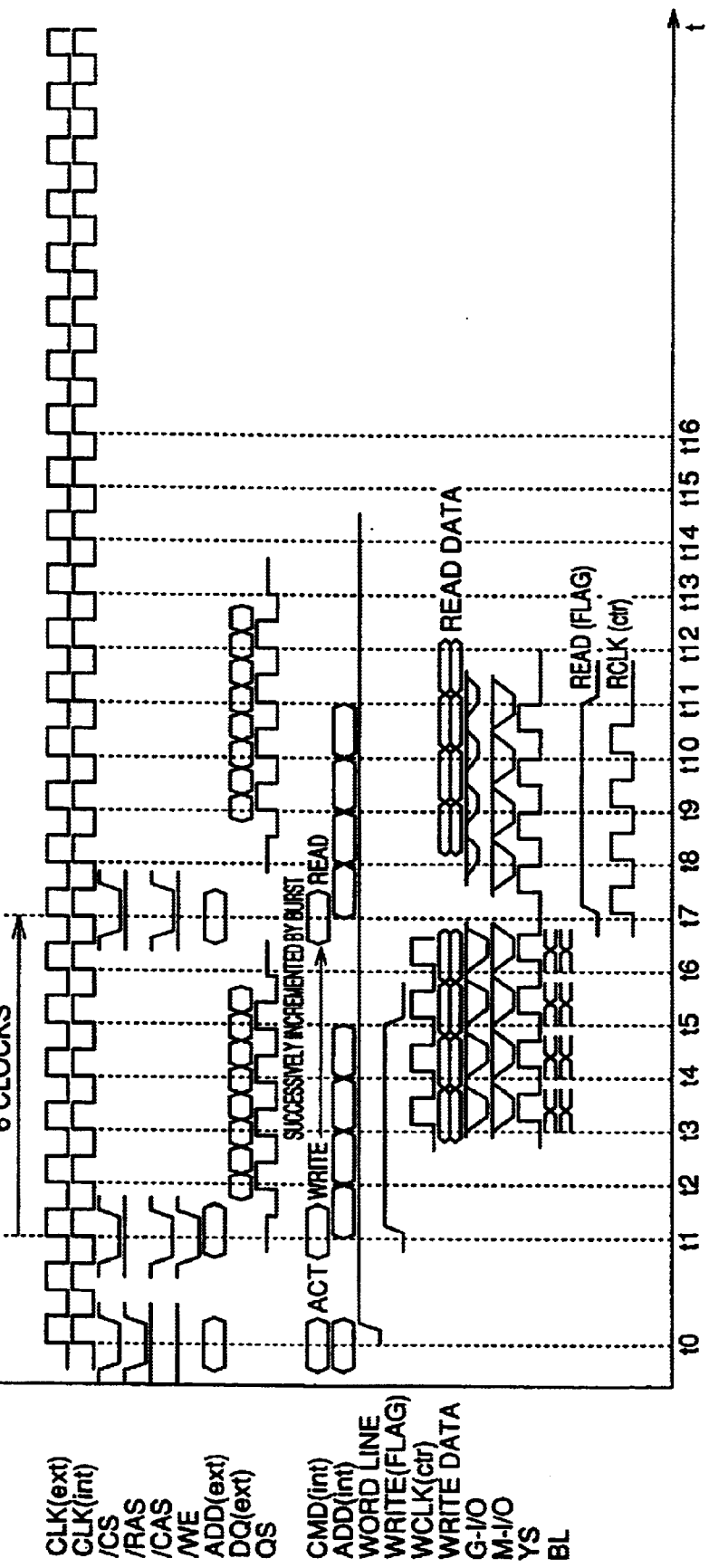
FIG. 24 is a timing chart showing an operation of the DDR-SDRAM for performing reading subsequently to writing.

FIG. 24 is a timing chart showing the operation of the DDR-SDRAM in the case where the read operation is performed subsequently to the write operation.

In FIG. 24, it is likewise assumed that the burst length is 8, the CAS latency is 2 and the write latency is 2.

For starting the write operation subsequently to application of the WRITE command instructing the write operation at time t1, it is necessary to prevent conflict between read data on the main I/O line pair or the like, which may occur when the column selection is performed. Accordingly, the READ command instructing the read operation must be applied to the SDRAM after the write operation is completely ended.

More specifically, if the WRITE command was applied at time t1, the READ command for designating the write operation cannot be applied until time t7, i.e., until the time of 6 clocks elapses after time t1.

Accordingly, in the case of the DDR-SDRAM operation mode with the double data rate, such a problem arises that a specific time required until the read operation can be started immediately after the write operation cannot be sufficiently reduced in spite of the fact that the data rate for writing and reading the data is twice as large as that in the SDR-SDRAM of the single data rate.

In the SDRAM of the embodiment 3, the following structure is employed for overcoming the above problem. Thus, the data, which is to be written in parallel during the last clock period in the data write operation of the burst processing, is written in the next data write cycle or the cycle of the precharge operation. Owing to this structure, the SDRAM can reduce the specific time required before the READ command is applied after application of the WRITE command even in the case where the read operation is performed subsequently to the write operation.

Figure 25:
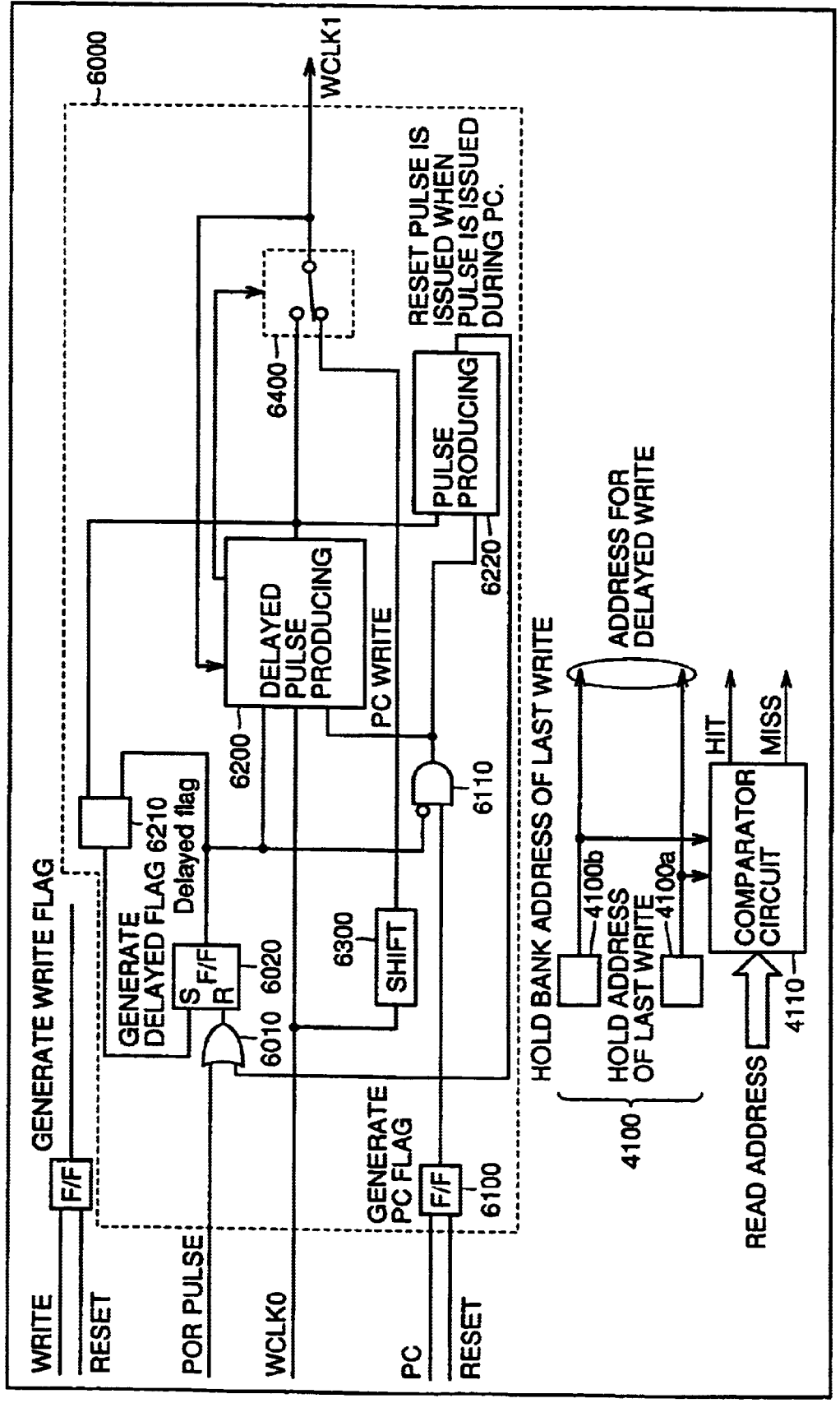
FIG. 25 is a schematic block diagram showing a structure of a write clock converting circuit 6000.

FIG. 25 is a schematic block diagram of a structure of a write clock converting circuit 6000, which allows the above operation by converting internal write clock signal WCLK in the embodiments 1 and 2 (which is indicated by a reference "WCLK0" in this embodiment) into a clock signal WCLK1.

In the structure of the embodiment 2, the value of the address which was used in the operation immediately before the write operation is held, and the value thus held is used for operating the registers arranged in the data I/O portion as the cache memories.

The embodiment 3 utilizes the fact that the address value of the immediately preceding write operation is held. By using the address value thus held, the operation is performed to shift the timing for writing the data in the burst operation, and particularly, the timing for writing the data in the last clock cycle to the later timing. The write operation according to the timing thus shifted will be referred to as a "delayed write operation" hereinafter. Thereby, the time required before the application of the READ command after the WRITE command can be reduced even in the case where the read operation is to be performed immediately after the write operation.

In the embodiment 3, it is assumed that the YS pulse is produced in accordance with write pulse WCLK1.

Thus, the structure of the embodiment 3 corresponds to the structure in which write clock converting circuit 6000 is added to the structure of the SDRAM of the embodiment 2.

Referring to FIG. 25, write clock converting circuit 6000 includes an OR circuit 6010 which receives on one of its input nodes a power-on reset signal POR, which attains "H" level upon power-on, a flip-flop circuit 6020 which receives the output of OR circuit 6010 as a reset signal, and produces a delayed flag, a flip-flop circuit 6100 which is set by precharge command PC, is set by the reset signal and produces the PC flag, a logic gate 6110 which produces the PC write signal in accordance with the PC flag issued from flip-flop circuit 6100 and an inverted signal of the delayed flag, a delayed pulse producing circuit 6200 which produces a delayed write signal in accordance with write clock signal WCLK0, delayed flag and PC write signals a flip-flop circuit 6210 which receives the output of delayed pulse producing circuit 6200 and the delayed flag, and produces the set signal for flip-flop circuit 6020 upon receipt of the output of delayed pulse producing circuit 6200 when the delayed flag is at "L" level, a pulse producing circuit 6220 which receives the output of delayed pulse producing circuit 6200 and the PC write signal, and issues the reset pulse to the other input node of the OR circuit in response to the fact that the pulse signal is once issued from delayed pulse producing circuit 6200 in such a state that the precharge command is designated and the PC write signal is activated, a shift circuit 6300 which receives write clock signal WCLK0, and shifts the same by predetermined clocks, and a switching circuit 6400 which is controlled by delayed pulse producing circuit 6200, and selects the output of shift circuit 6300 or the output of delayed pulse producing circuit 6200 for outputting the selected output as signal WCLK1.

In the example shown in FIG. 25, address latch circuit 4100 includes an address latch 4100a for holding the address used in the immediately preceding write operation and a latch circuit 4100b for holding the bank address used in the immediately preceding write operation, similarly to the example shown in FIG. 17. Comparator circuit 4110 compares the outputs of address latch 4100a and latch circuit 4100b with the designated read address for activating either a hit signal HIT or a mis-hit signal MISS.

When signal HIT is activated, the data which is already transferred to the register in the output portion from the register in the input portion is issued to the data I/O terminal, similarly to the operation already described with reference to FIG. 17, and at the same time, the array operation itself is deactivated. Deactivation of the array operation means that the data already read from the memory cell array to receivers 2142 and 2143 is not transmitted to registers 2146 and 2148 for reading.

When signal MISS is activated, the usual operation of reading data from the memory cell array is performed.

The address and the bank address, which were used in the last write operation and are held in latch circuits 4100a and 4100b, are used as the addresses for the write operation in the delayed write operation, as will be described later.

Figure 26:
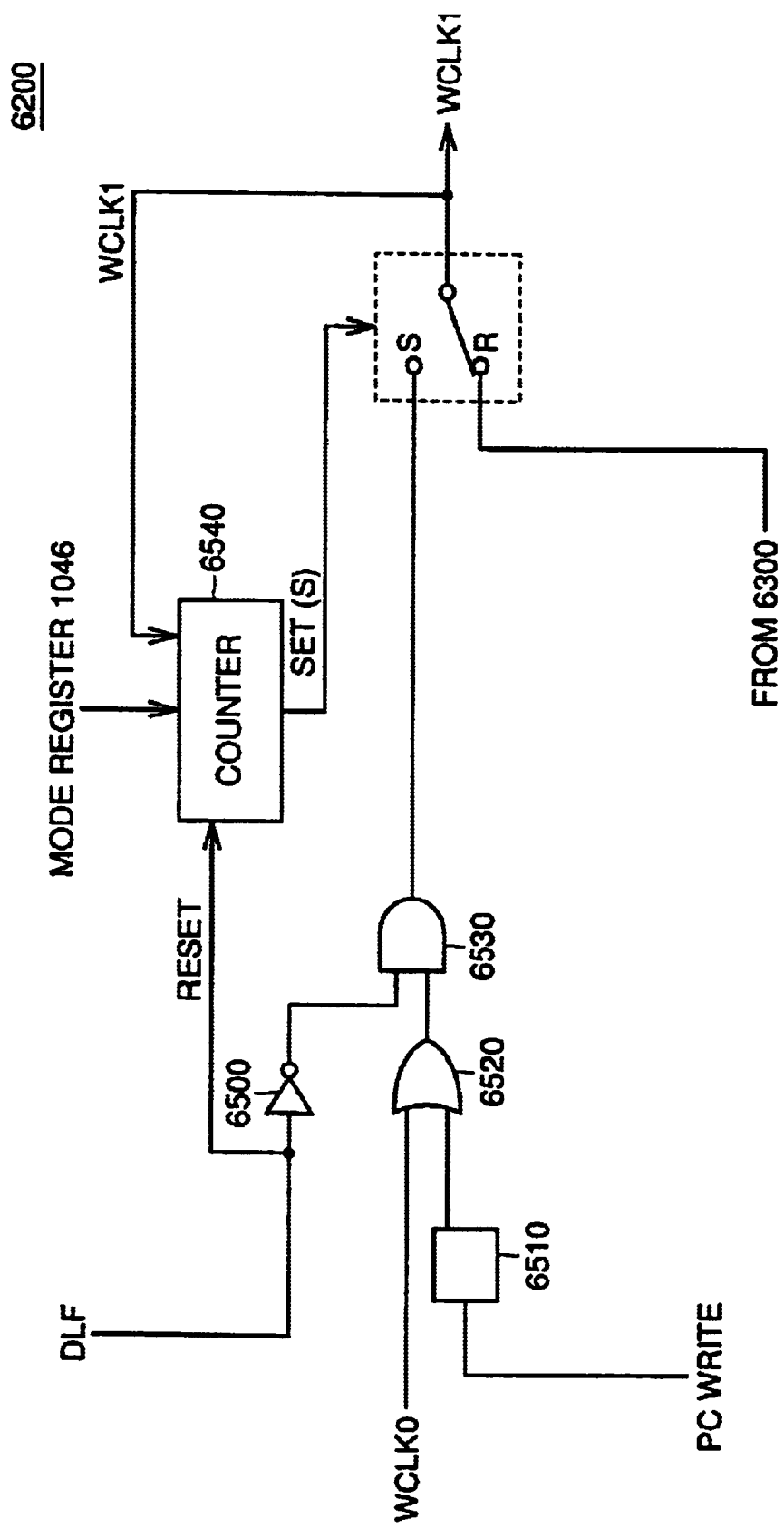
FIG. 26 is a schematic block diagram showing more specifically a structure of a delayed pulse producing circuit 6200.

FIG. 26 is a schematic block diagram for showing more specifically the structure of delayed pulse producing circuit 6200.

Delayed pulse producing circuit 6200 includes an inverter 6500 which receives a delayed flag DLF from delayed flag producing circuit 6020, a pulse producing circuit 6510 which receives the PC write signal, and produces a pulse signal, an OR circuit 6520 which receives the output of pulse producing circuit 6510 and signal WCLK0, an AND circuit 6530 which receives the outputs of OR circuit 6520 and inverter 6500, and a counter 6540 which counts the times of activation of clock signal WCLK1 until the last clock of the burst operation by one clock is activated (and thus stops the counting after the clock signal preceding the above last clock by one clock is activated).

Counter 6540 is reset in response to activation of delayed flag DLF, and sets the output signal in response to ending of the counting operation. Switching circuit 6400 issues the signal, which is sent from AND circuit 6530, as signal WCLK1 in response to the set state of the output of counter 6540, and issues the signal, which is sent from shift circuit 6300, as signal WCLK1 in response to the reset state ("L" level) of the signal sent from counter 6540.

Owing to the above structure, when signal POR pulse is activated in response to power-on, the output of flip-flop circuit 6020, i.e., delayed flag. DLF is reset to "L" level.

Switching circuit 6400 has been set to the side for issuing the output of shift circuit 6300 as signal WCLK1

In the case where the write operation starts, and the burst writing of the write data of 8 bits is completed in a period of, e.g., 4 clocks, the output signal of counter 6540 attains the set state when the operation for three clocks is completed, and switching circuit 6400 is switched to the side for issuing the output of AND circuit 6530 as signal WCLK1.

At this point of time, delayed flag DLF is at "L" level, and the output of inverter 6500 is at "H" level. However, clock pulses corresponding to four clocks are already applied as signal WCLK0 to delayed pulse producing circuit 6200. Therefore the write clock WCLK1 will not be issued until signal WCLK0 or signal PC write becomes active.

When signal WCLK0 or PC WRITE is activated subsequently to the above state, the write clock is produced, and the data to be written in the last clock of the burst operation is written into the currently corresponding memory cell array in accordance with the write clock thus produced and the address signal held in address latch 4100.

Figure 27:
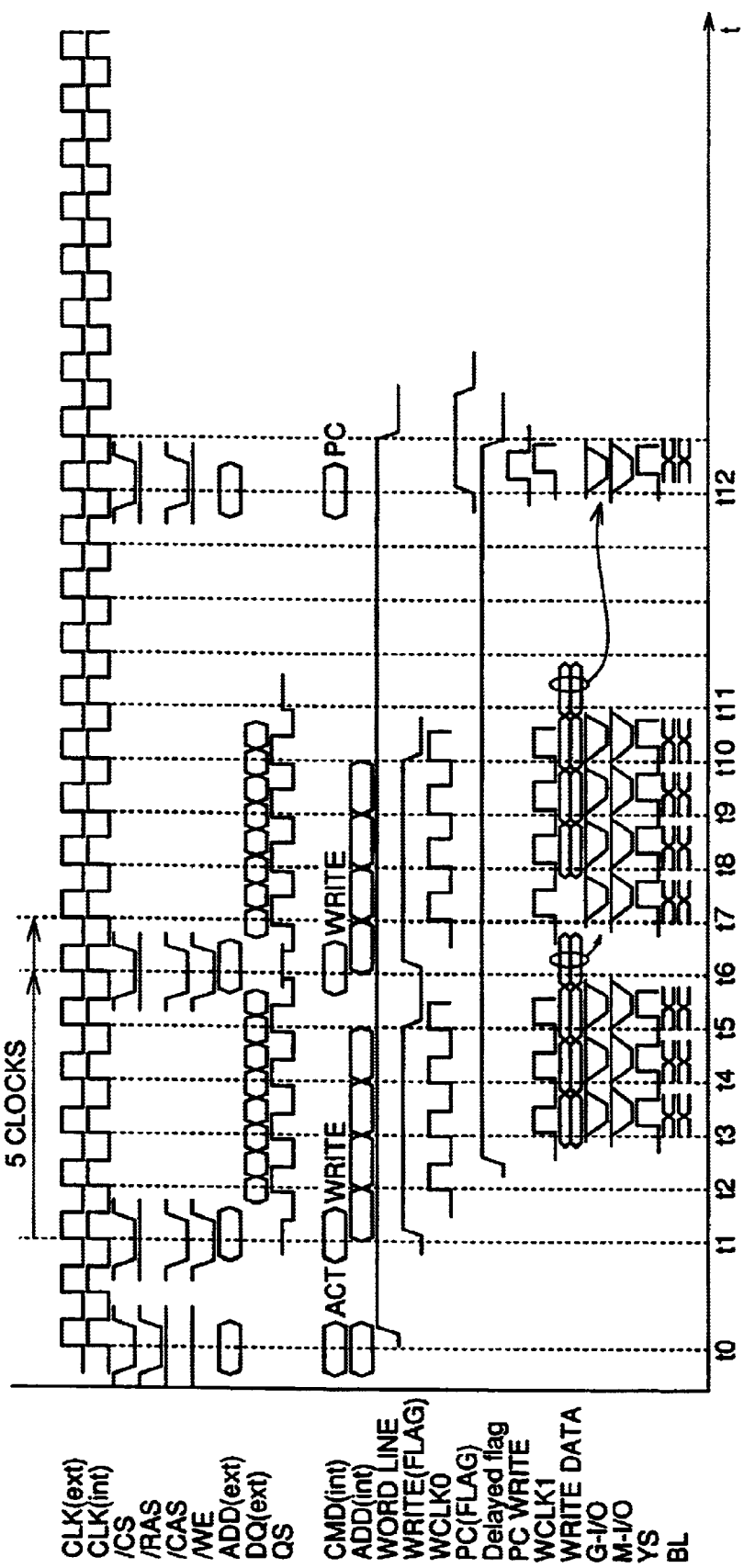
FIG. 27 is a timing chart showing an operation in a delayed write mode.

FIG. 27 is a timing chart for showing the operations in such a case that, in the delayed write mode described above, the write operation is performed immediately after the last write operation, and the precharge operation will be performed immediately after the same.

At time t0, activation of the SDRAM is instructed, and WRITE command is applied in subsequent time t1.

At time t3 after two clocks from time t1, the data is written into the memory cell array in response to write clock WCLK1. However, the data is actually written into the memory cell array for a period of three clocks starting at times t3, t4 and t5, respectively. In this state, therefore, only six data are written through one data I/O terminal into the memory cell array.

At subsequent time t6 after five clocks from time t1, WRITE command for instructing the write operation is applied again. In response to this, write clock converting circuit 6000 is supplied with write clock signal WCLK0 again.

At this point of time, switching circuit 6400 is in the state for receiving the output from AND circuit 6500. Therefore, signal WCLK1 is activated in response to signal WCLK0 activated at time t7, and the data of last two bits in the last cycle is written.

In response to the activation of signal WCLK1, the delayed flag attains the active level so that counter 6540 is reset, and switching circuit 6400 is switched to the side for outputting the output of shift circuit 6300 as signal WCLK1.

Data of 8 bits is applied in accordance with the write operation which is designated at time 6. Data of 6 bits among the data thus applied is written into the corresponding memory cells in response to activation of write clock signal WCLK1 at times t8, t9 and t10. In this case, the data of last two bits likewise remains in write register circuits 2154 and 2156 without being written.

At subsequent time t12, precharge command PC is applied for instructing the precharge operation. In response to this, write clock converting circuit 6000 issues signal WCLK1 for one clock, and thereby the data of last two bits is written.

Therefore, the structure using write clock converting circuit 6000 already described with reference to FIG. 25 can operate normally even when WRITE command instructing the write operation is applied after five clocks from issuance of WRITE command.

Figure 28:
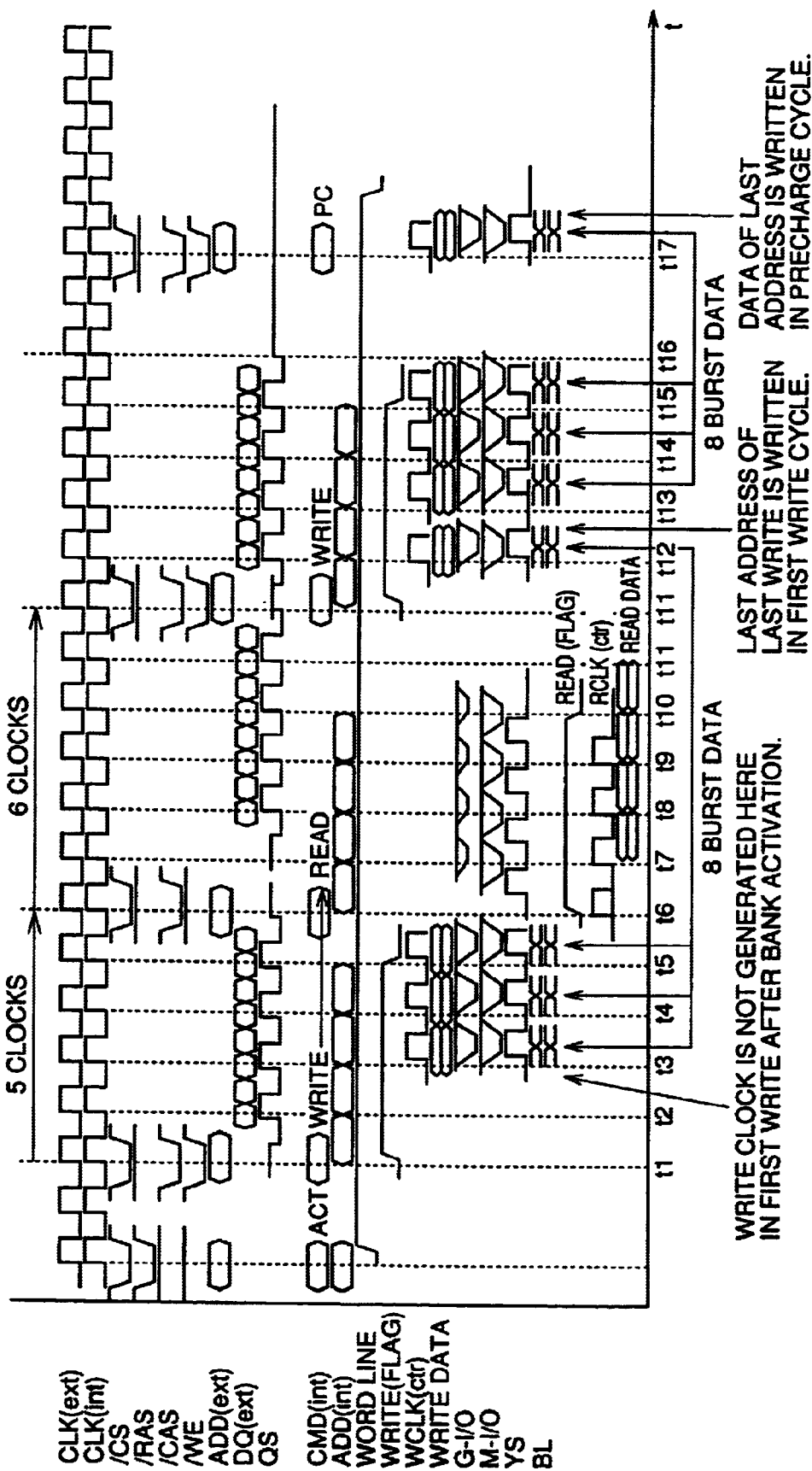
FIG. 28 is a timing chart showing operations for continuously performing writing, reading, writing and precharging.

FIG. 28 is a timing chart showing the operations of the structure which uses write clock converting circuit 6000 already described with reference to FIG. 25, and particularly the operations in the case where the writing, reading, writing and precharging are continuously performed.

Activation of the SDRAM is instructed at time t0. WRITE command is applied at time t1, and data writing is performed for a period from time t2 to time t3. These operations are the same as those in FIG. 27.

In the example shown in FIG. 28, however, READ command for instructing the read operation is applied at time t6. In this case, main I/O line pair M-I/O and global I/O line pair G-I/O are not used for the write operation at time t6 after five clocks from time t1. Therefore, READ command can be applied at time t6.

At time t8, i.e., when two clocks designated by CAS latency elapses after time t6, the read operation starts, and data of eight bits will be output.

At time t11, WRITE command is applied, and the remaining data of two bits which was not written for a period from time t3 to time t6 is written in response to signal WCLK0 which is generated at time t12.

For a subsequent period from time t13 to time t16, data of six bits in data of eight bits is written.

The data of last two bits in the data of eight bits is written in the selected memory cells when precharge command PC is applied at time t17.

Owing to the above structure, the read operation can be performed in an intended manner immediately after the write operation in the case where the write latency is present, and more specifically, can be performed in such a manner that the number of clocks between application of WRITE command and subsequent application of READ command is similar to the number of clocks in the case where the write operation is performed subsequently to the last write operation.

This allows reduction in time required for transferring the data between the memory controller and the SDRAM.

Figure 29:
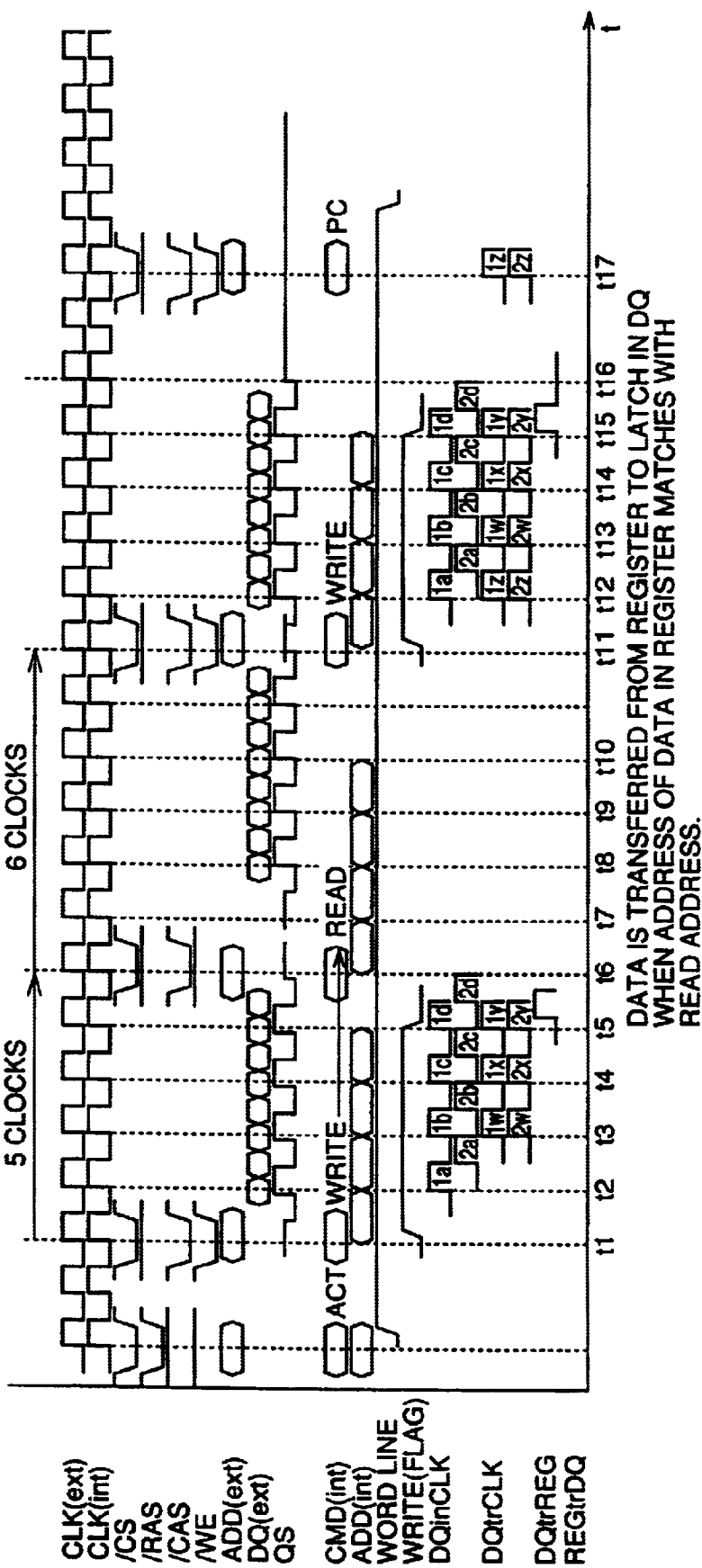
FIG. 29 is a timing chart showing operation timing of switches 1 W through 2 Z.

FIG. 29 is a timing chart showing operations of switches 1a–2d for writing the data to write registers 2154 and 2156 shown in FIG. 17 as well as operations of switches 1W–2Z for applying the data from registers 2154 and 2156 to the memory cell array.

At time t0, ACT command is applied, and WRITE command is applied at time t1. Switch circuits 1a–2d are alternately turned on in accordance with the clock signals, which are alternately activated in response to the edges of activation and deactivation of signal QS starting from time t2. Thereby, the continuously applied data of eight bits is stored in write registers 2154 and 2156. Also, at and after time t3, switch circuits 1w–2y, which can switch the data output from register circuits 2154 and 2156 to the memory cell side, are activated in response to write clock signal WCLK1 in such a manner that switch circuits 1w and 2w are simultaneously activated, switch circuits 1x and 2x are simultaneously activated and switch circuits 1y 2y are simultaneously activated. Thereby, the data is written in parallel into the memory cell array.

At time t12, switch circuits 1z and 2z are simultaneously activated in response to the activation of clock signal. Thereby, the remaining data OF two bits is written into the memory cell array.

At and after time t12, switch circuits 1a and 2a are alternately turned on so that the data is written into register circuits 2154 and 2156.

Thereafter, writing of data of six bits is performed similarly to the operation between times t2 and t6.

At time t17, precharge command PC is applied. Thereby, the clock signals which can turn on switch circuits 1z and 2z, respectively, are simultaneously activated so that the remaining data of two bits is written.

By performing the delayed write operation as described above, the DDR-SDRAM operating with the double data rate can reduce the time margin between the application of the write command and the subsequent application of the read command, even if the read operation is performed immediately after the write operation. Therefore, fast reading and fast writing of the data can be performed.

Although this embodiment has been described in connection with the DDR-SDRAM operation mode, the invention is not restricted to this, and can be likewise applied to other forms of chip. One of distinctive features of the invention is that the write data is transmitted to the memory cell array during a period not impeding the data read cycles.

In the above embodiment, the delayed write operation is performed when the next write command and the precharge command are applied. Other commands may be allocated for the delayed write operation. Further, a cycle in which no command is input and no internal operation is executed may be detected on the chip side, and the delayed write operation may be performed in this detected cycle.

In this embodiment, the delayed write is executed in the cycle following the write command if it is to be performed in response to the input of next write command. However, the delayed write can be executed in the same cycle as the input of write command.

[Embodiment 4]

An embodiment 4 will now be described below. The following description is given on another example of the structure of the synchronous semiconductor memory device, in which the operation can be switchable between the SDR-SDRAM operation mode and the DDR-SDRAM operation mode.

Figure 30:
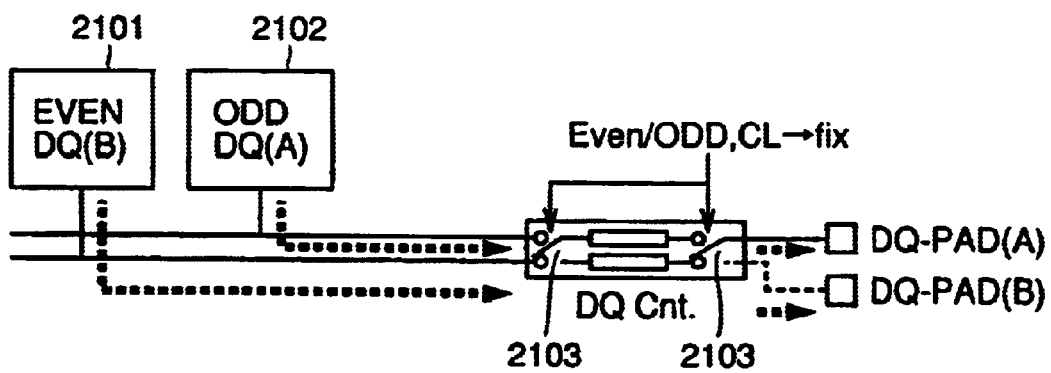
FIG. 30 conceptually shows an example of a first structure of a synchronous semiconductor memory device which can operate with a data rate switchable between the single data rate and the double data rat.

FIG. 30 conceptually shows an example of a first structure of the data output portion of the synchronous semiconductor memory device allowing switching between the SDR-SDRAM and DDR-SDRAM.

A memory array 2101 stores data of even addresses when the device operates as the DDR-SDRAM, and performs input/output of data for a certain data pin DQ(A) when the device operates as the SDR-SDRAM.

A memory array 2102 stores data of odd addresses when the device operates as the DDR-SDRAM, and performs input/output of data for a data pin DQ(B) other than data pin DQ(A) corresponding to memory array 101.

In the DDR-SDRAM operation mode, switch circuit 2103 selectively connects memory arrays 101 and 102 to data I/O pins DQ(A) and DQ(B) under control by the output control circuit. In the SDR-SDRAM operation mode, switch circuit 2103 is fixed to achieve a predetermined connection relationship between the data I/O pins and the memory array.

In one access operation, both memory arrays 2101 and 2102 are accessed, and the read data is sent through the data bus and is held in the output registers. The output registers are set by a select circuit to a state for sending the outputs to one external pad in the case of the DDR-SDRAM, but are fixed in the state for sending the outputs to independent data I/O pads DQ(A) and DQ(B), respectively.

Although the output portion has been described, a similar structure may be employed in the input portion so that switch circuits can similarly select the connection relationships between the DQ pads, input registers and memory arrays.

The structures described above can provide on the same chip the synchronous semiconductor memory device, in which both the DDR-SDRAM operation mode and the SDR-SDRAM operation mode are allowed using the common structures for the arrays, data buses and I/O portions.

Figure 31:
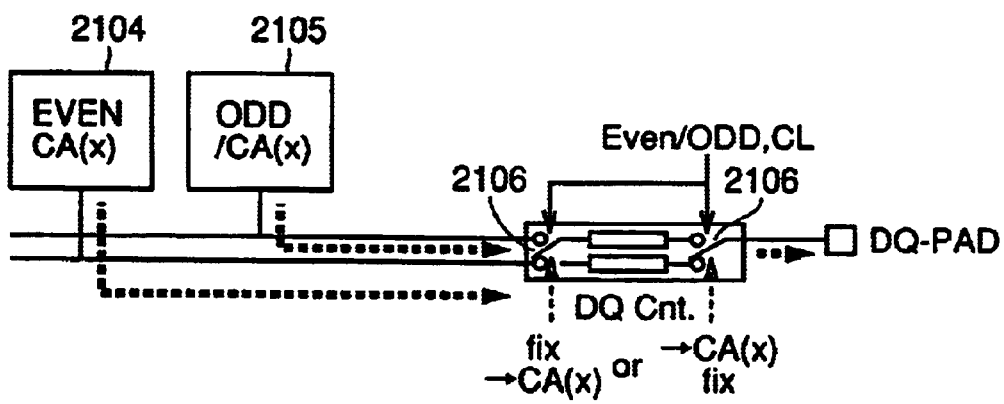
FIG. 31 conceptually shows an example of a second structure of the synchronous semiconductor memory device which can operate with a data rate switchable between the single data rate and the double data rat.

FIG. 31 conceptually shows another embodiment of the data output portion.

In FIG. 31, a memory array 2104 is assigned even addresses in the case of the DDR-SDRAM operation mode, but is assigned a certain column address CA(X) in the case of the SDR-SDRAM operation mode.

Further, a memory array 2105 is assigned odd addresses in the case of the DDR-SDRAM operation mode, but is assigned a column address /CA(X) in the case of the SDR-SDRAM operation mode. In one read operation, one of memory arrays 2104 and 2105 is accessed, and the read data is sent through the data bus and is held in the output register. In the DDR-SDRAM operation mode, a selector switch 2106 selects the transmission path depending on whether the address is an even address or an odd address. In the SDR-SDRAM operation mode, it selects the path in accordance with column address CA(X).

Although the structure of the data output portion has been described, the data input portion differs from the above data output portion only in that the data flows in the reverse direction between the DQ pads, input registers and memory arrays, and therefore can employ a similar structure.

The structure described above can provide on the same chip the synchronous semiconductor memory device, in which the DDR-SDRAM operation mode and the SDR-SDRAM operation mode are switchable for operation using the common structures for the arrays, data buses and I/O portions.

Figure 32:
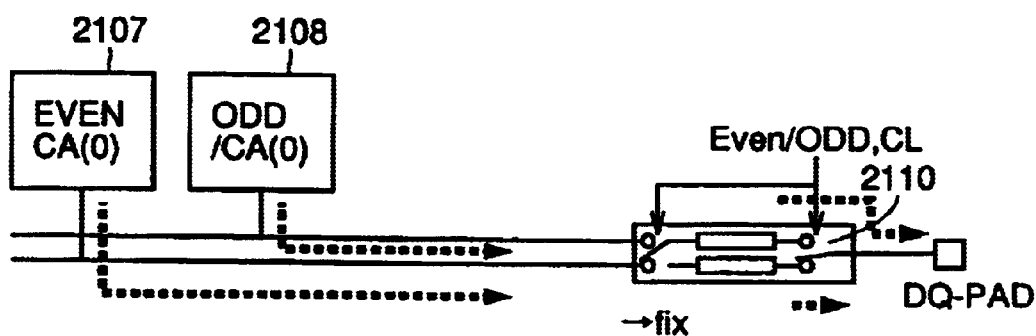
FIG. 32 conceptually shows an example of a third structure of the synchronous semiconductor memory device which can operate with a data rate switchable between the single data rate and the double data rat.

FIG. 32 conceptually shows further another structure of the data I/O portion.

Referring to FIG. 32, a memory array 2107 is assigned even addresses in both the DDR-SDRAM and SDR-SDRAM operation modes. A memory array 2108 is assigned odd addresses in both the DDR-SDRAM and SDR-SDRAM operation mode.

In the DDR-SDRAM operation mode, a selector 2110 in the output portion changes its state in response to the rising and falling of the external clock. In the SDR-SDRAM operation mode, however, selector 2110 changes its state only in response to the rising of the external clock.

In the one access operation, both memory arrays 2107 and 2108 are accessed, and the data is sent through the data bus, and is held in the output registers.

In the case of the SDR-SDRAM operation mode, the memory arrays are accessed one time at every two clocks.

Although the structure of the data output portion has been described, the data input portion differs from the data output portion only in that the data flows in the reverse direction, and therefore can employ a similar structure for the relationships between the DQ pads, input registers and memory arrays.

The structure described above can provide on the same chip the synchronous semiconductor memory device, in which the DDR-SDRAM operation mode and the SDR-SDRAM operation mode are switchable for operation using the common structures for the arrays, data buses and I/O portions.

Figure 33:
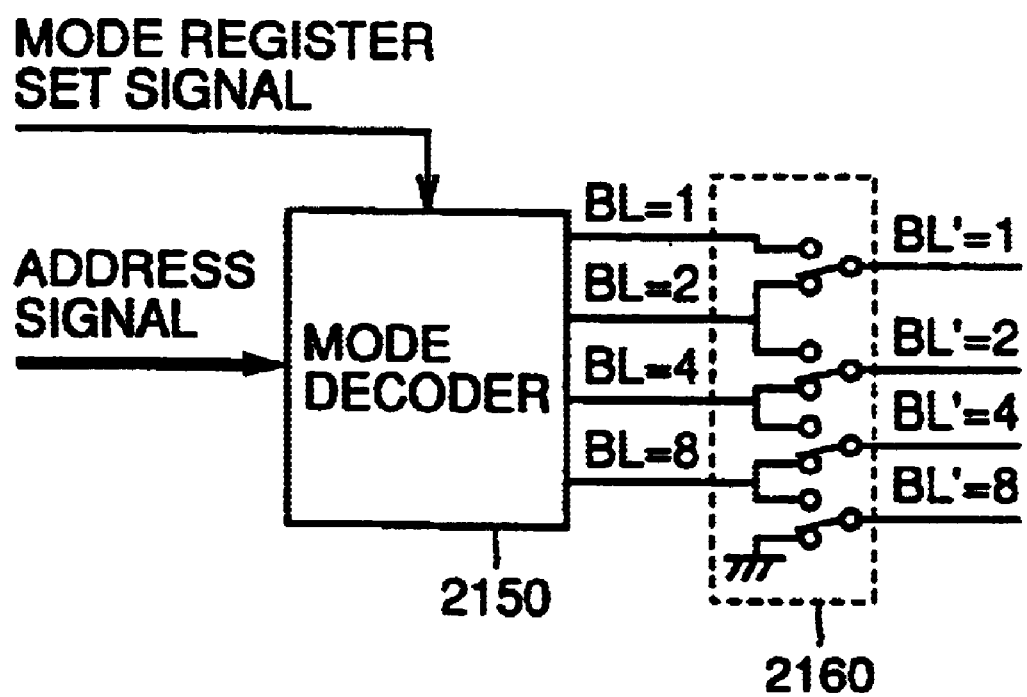
FIG. 33 conceptually shows a structure for switching a mode register signal for setting a burst length.

FIG. 33 conceptually shows a structure for switching the mode register signal which sets the burst length.

In the DDR-SDRAM operation mode, two data are input/output in one clock because of the double data rate. From the viewpoint of the internal processing of the synchronous semiconductor memory device, therefore, the burst length in the SDR-SDRAM operation mode corresponds to half the burst rate in the DDR-SDRAM operation mode.

For achieving the SDR-SDRAM operation mode and the DDR-SDRAM operation mode by switching the operation mode in the same chip, therefore, such as structure shown in FIG. 33 is employed that a selector group 2160 makes switching between the internal signal representing the burst length and the decode signal of a mode register 2150. In FIG. 33, a signal BL is the decoded signal of mode register 2150, and is transmitted to the internal circuit of the synchronous semiconductor memory device as it is when the operation is in the DDR-SDRAM operation mode.

A signal BL' is an internal signal in the SDR-SDRAM operation mode.

Owing to the above structure, the internal signals, which represent the burst lengths and differ from each other depending on the DDR-SDRAM and SDR-SDRAM operation modes, can be switched by a simple structure on the same chip.

Figure 34:
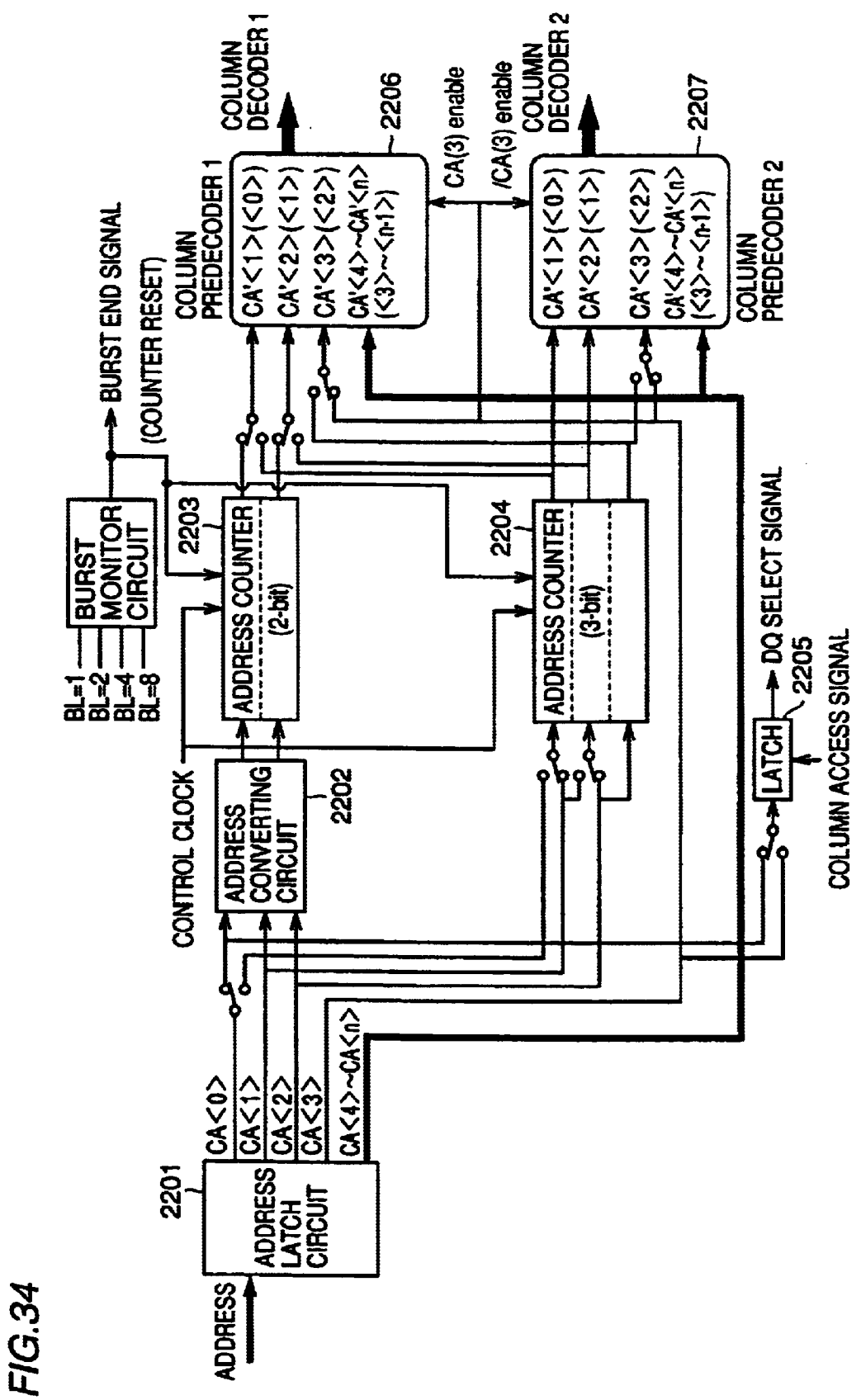
FIG. 34 is a schematic block diagram showing a structure of a column address counter in the synchronous semiconductor memory device based on the conceptual diagram of FIG. 31.

FIG. 34 is a schematic block diagram showing a structure of a column address counter in a synchronous semiconductor memory device based on the same conception shown in FIG. 31.

Each switch shown in FIG. 34 is in a state for the DDR-SDRAM operation mode.

Referring to FIG. 34, an externally applied address signal is held in an address latch circuit 2201, and the address signal except for the lower one bit is sent from address latch circuit 2201 to an address counter 2203 for the memory array corresponding to the even addresses and an address counter 2204 for the memory array corresponding to the odd address, when the operation is in the DDR-SDRAM operation mode.

When the address signal passes through an address converting circuit 2202 toward address counter 2203, it is converted depending on whether the start address is even or odd.

The address counter performs the address counting two bits at a time in accordance with the sequential mode and the interleave mode.

The counted address is sent to the predecoder of each memory array. At this time, the lowest bit of the column address is held in a latch circuit 2205 for utilizing the same in switching between the data I/O portions.

In the SDR-SDRAM operation mode, all the latched addresses are sent to address counter 2204. Address counter 2204 counts the addresses, and the address signal thus generated are sent to column predecoders 2206 and 2207. In this structure, switching between memory arrays 2104 and 2105 shown in FIG. 31 is performed based on a signal CA(3). Therefore, signal CA(3) forms a signal controlling the output of predecode signal to each memory array.

More specifically, when signal CA(3) is at "H" level, the signal is sent to first column predecoder 2206. When signal CA(3) is at "L" level, the signal is sent to second column predecoder 2207.

The operation of the memory array is performed based on the predecode signal, and is not performed when the corresponding predecode signal is not issued. Signal CA(3) is held in latch circuit 2205, and is also used for control of input/output.

Since address counter 2204 is used in both the SDR-SDRAM and DDR-SDRAM operation modes, the counter of the bit number meeting the specifications of the SDR-SDRAM is required.

In the above structure, the burst length of 8 is the maximum, and the three-bit counter is employed. In the case where the full-page mode for accessing all the addresses is employed, the structure requires a counter or the bit number which allows counting of all the addresses.

Since address counter 2205 is used only in the case of the DDR-SDRAM, it is formed of only a two-bit counter which can change only the addresses of the second and third bits.

According to the above structure, data is read from both the memory arrays relating to column decoders 2206 and 2207.

For example, the data is read from both the array relating to the even addresses and the array relating to the odd addresses. In the DDR-SDRAM operation mode, therefore, signal CA(0) is latched as the signal for DQ-selection between the data read from the even address array and the data read from the odd addresses array.

In the SDR-SDRAM operation mode, signal CA(0) is used as the minimum bit of the burst address. Further, the column decoder corresponding to the even array and the column decoder corresponding to the address array are operated without a distinction between them. If this manner were employed as it is, the data which is twice as larger in number as the required data would be issued in the SDR-SDRAM operation mode. Therefore, signal CA3 is used for selecting the array so that only the column decoder on one side can operate.

Signal BL indicating the burst length is supplied to a burst monitor circuit. When the cycles corresponding to the burst length are completed, a burst end signal is issued to reset the address counter.

In the DDR-SDRAM operation mode, burst of 2 bits is performed in one cycle of the normal clock so that a signal is issued to perform the burst with half the cycle number in the SDR mode.

Figure 35:
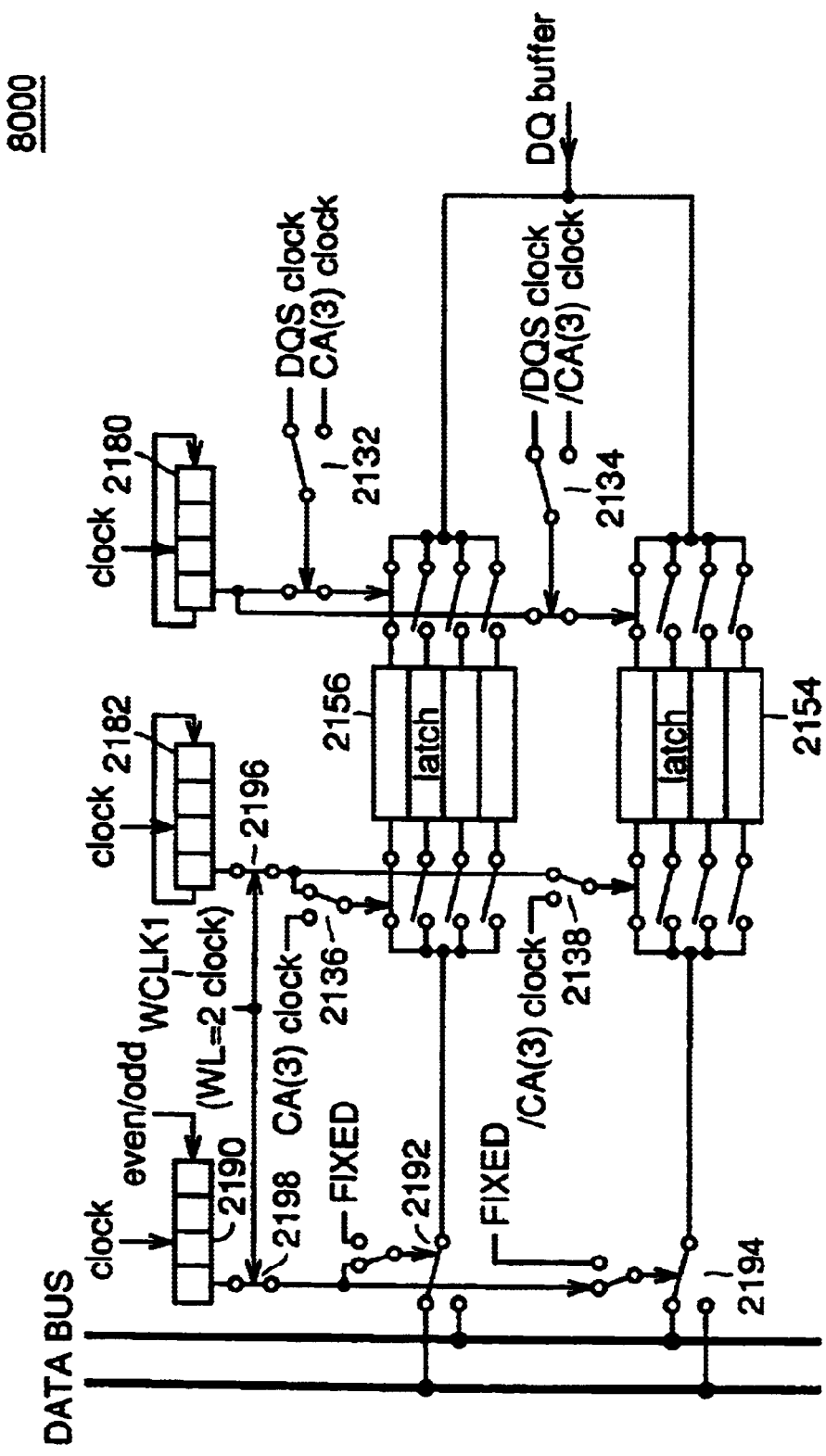
FIG. 35 is a schematic block diagram showing a structure of an I/O portion 8000.

FIG. 35 is a schematic block diagram showing a structure of an I/O portion 8000, which allows switching between the DDR-SDRAM and SDR-SDRAM operation modes for the operation using the foregoing architecture shown in FIG. 31. FIG. 35 is comparable to FIG. 9 showing I/O portion 2000 of the embodiment 1.

In the embodiment 1 described before, selection between registers 2154 and 2156 for input depends on resume bit CA(0) in the column address signal. In this embodiment, however, the selection depends on signal CA(3) of the fourth bit from resuming of the column address signal as will be apparent from the following description. Except for this difference, the structure of this embodiment is basically the same as that of data I/O portion 2000 shown in FIG. 10.

Referring to FIG. 35, when the device operates as the DDR-SDRAM, the externally applied data is temporarily held in input registers 2154 and 2156 depending on the rising and falling of the DQS clock, respectively. A shift register 2180 in this embodiment issues a signal which selects the latch circuit for the data input operation in register 2154 or 2156.

After the predetermined latency, data is issued from input registers 2154 and 2156 onto the data bus in synchronization with write clock signal WCLK. In this case, the latency changes depending on the value set in the mode register, and corresponds, e.g., to two clocks.

A shift register 304 in this embodiment is a shift register circuit which produces a signal for selecting input register 2154 or 2156, which is to be operated to issue data from its latch circuit.

A shift register circuit 2190 is a circuit producing a signal for controlling switch circuits 2192 and 2194, which are provided for changing the connections of registers 2154 and 216 to the data bus, depending on whether the array signal is even or odd.

In the SDR-SDRAM operation mode, the externally supplied signal is sent to register circuit 2154 or 2156, which is selected in accordance with column address signal CA(3). More specifically, input register 2154 or 2156 for receiving the signal is selected in accordance with CA(3) clock sent through switch circuit 2132 and inverted signal /CA(3) of column address signal CA(3) sent through switch circuit 2134.

Output of data from input registers 2154 and 2156 is performed in accordance with column address signal CA(3). More specifically, register circuit 2154 or 2156 which issues the data is selected in accordance with signals CA(3) and /CA(3) sent through switch circuits 2136 and 2138.

In the SDR-SDRAM operation mode, switch circuits 2192 and 2194 are fixed at the predetermined connection states, respectively. More specifically, switch circuit 2192 is set to the side of the data bus connected to the memory cell portion corresponding to signal CA(3), and switch circuit 2194 is set to the side of the data bus connected to the memory cell portion designated by signal /CA(3).

According to the above structure of data I/O portion 8000 shown in FIG. 35, the synchronous semiconductor memory device allowing both the DDR-SDRAM and SDR-SDRAM operation modes can be achieved on the same chip.

Figure 36:
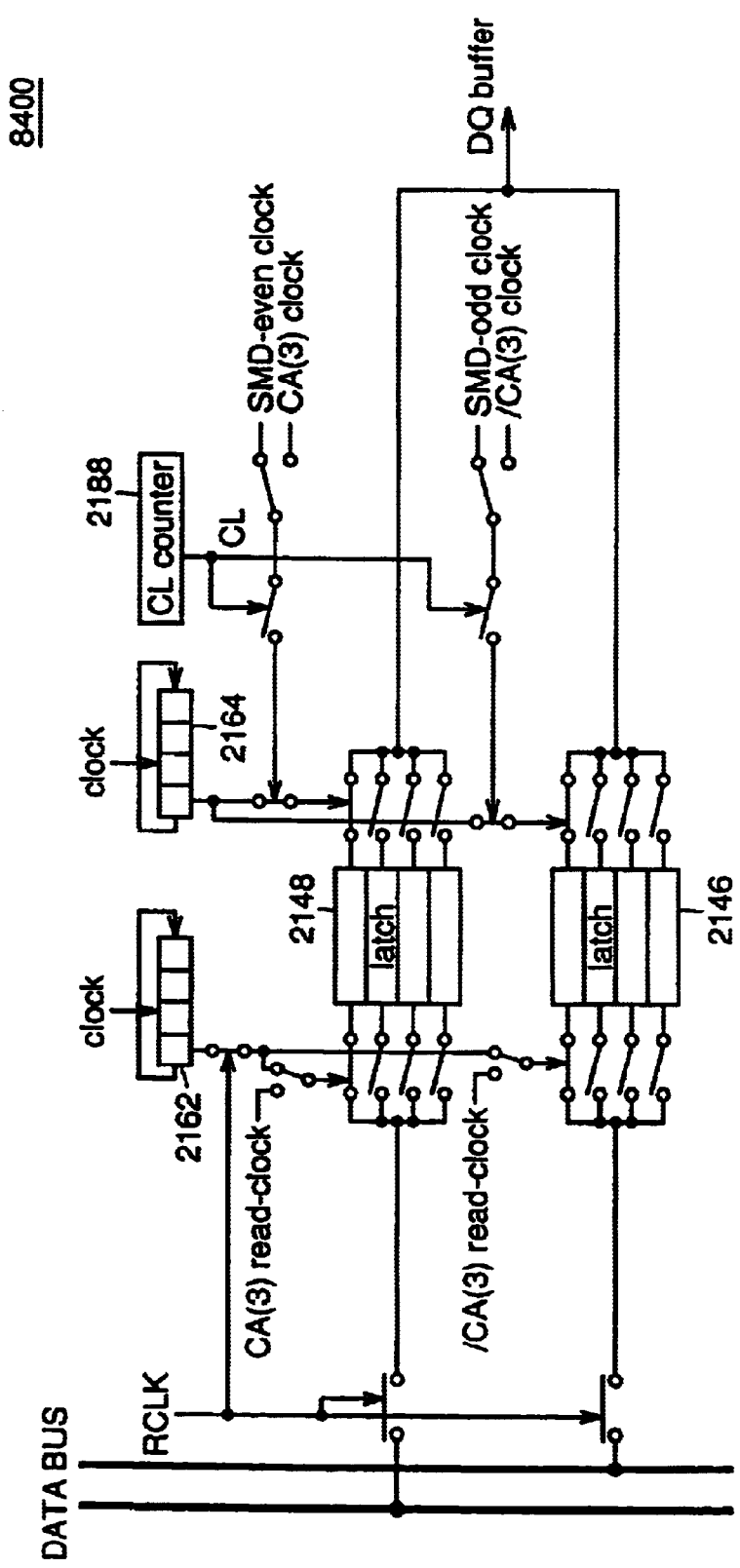
FIG. 36 is a schematic block diagram showing a structure of a data output portion 8400.

FIG. 36 is a schematic block diagram showing a structure of a data output portion 8400 provided for the structure shown in FIG. 35.

Data output portion 8400 shown in FIG. 36 can likewise select the data for output in accordance with column address signal CA(3).

In the DDR-SDRAM operation mode, the signal sent from the memory array through the data bus to data output portion 8400 is temporarily held in output registers 2146 and 2148 in synchronization with the read clock signal. The output data held therein is output in synchronization with the internally produced clock after the CAS latency already set. This internally produced clock signal is set, e.g., such that a difference between the DQ clock and the external clock meets the specifications, and is produced by a clock guarantee circuit (not shown).

In the example shown in FIG. 36, a synchronous mirror delay circuit produces clock signals, which are synchronized with the rising and falling edges of the external clock, respectively, and are independent of each other, and these signals are applied as signals SMD-even and SMD-odd, respectively.

More specifically, in accordance with the internal clock signal, shift register 2164 shifts the data therein. In accordance with this, selection is made between output register 2146 or 2148 which outputs the data from its latch circuit. The signal sent from shift register 2164 is applied to the data I/O buffer in accordance with the timing controlled by foregoing signals SDM-even and SMD-odd, which are input in accordance with the timing controlled by a CAS latency counter 2188.

In the SDR-SDRAM operation mode, the memory array is connected to one of output registers 2146 and 2148 selected in accordance with the value of signal CA(3). In the operation of outputting the data from output registers 2146 and 2148, one of output registers 2146 and 2148 is likewise selected in accordance with signal CA(3), and is connected to the I/O terminal of data. In accordance with the CAS latency already set, CAS latency counter 2188 sets the timing, according to which signals CA(3) and /CA(3) are applied to the data output portions of registers 2146 and 2148, respectively, so that timing of data output is controlled.

Owing to the above structure, the data output portion having the structures for different operation modes, i.e., the DDR-SDRAM and SDR-SDRAM operation modes can be achieved on the same chip.

Figure 37:
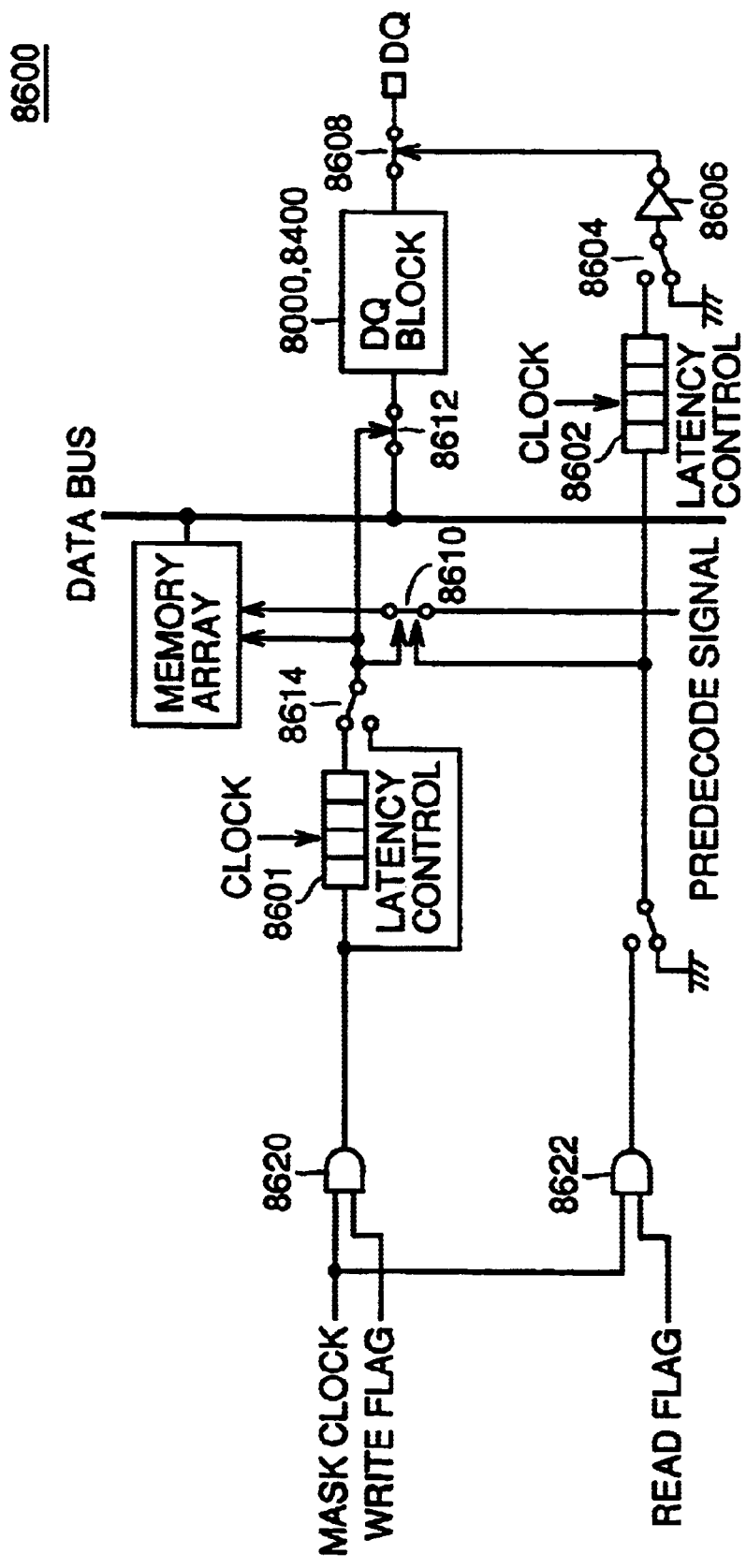
FIG. 37 is a schematic block diagram showing a structure of a mask clock control circuit 8600.

FIG. 37 is a schematic block diagram showing a structure of a mask clock control circuit 8600.

Switches shown in FIG. 37 are in the states which are selected for the DDR-SDRAM operation.

In the DDR-SDRAM operation mode, the mask clock is issued only during the write operation, and the masking is not performed during the read operation.

When the mask clock is input, a logical AND is performed between the write flag, which indicates that the write operation is being performed, and the mask signal, and the result is temporarily held in a shift register 8601. After the data is shifted by the clocks corresponding to the latency in the write operation, switch circuit 8610 is controlled to interrupt the transmission of the predecode signal to the memory array in accordance with the data sent from shift register 8601.

The signal sent from shift register 8601 controls a switch circuit 8612 to interrupt the connection between the data I/O portion and the data bus. Since transmission of the predecode signal to the memory array is interrupted, the operation of memory array stops.

At the same time, the data is also sent from shift register 8601 to the memory array portion. Therefore, when the predecode signal cannot be interrupted at or before the intended time, the output signal sent from shift register 8601 to the memory array stops the operation of writing data from the data bus to the memory array. In either case, the device stops the operation of writing the data, which is transmitted through the data bus, into the memory array.

Since the connections of the data bus to DQ blocks 8000 and 8400 are interrupted, it is not necessary to charge and discharge the data bus so that the power consumption can be reduced.

In the SDR-SDRAM operation mode, since the mask in the write operation does not include the latency, a connection state of a switch 8614 is changed so that the predecode signal can be turned off without passing through shift register 8601.

In accordance with the mask signal sent from switch 8614, transmission of the predecode signal to the memory array is interrupted for stopping the write operation in the memory array, and switch circuit 8612 interrupts the connection of the data bus to DQ portions 8000 and 8400.

In the SDR-SDRAM operation mode, the mask clock is also applied to the read operation. Therefore, a logical AND is performed between the read signal and the mask clock. Based on the signal representing the result, switch circuit 8610 interrupts the transmission of the predecode signal to stop the output from the memory array, similarly to the write operation, or switch circuit 8612 interrupts the connection between the DQ block and the data bus.

The output data must be kept in the interrupted state. Therefore, the value of logical AND between the mask clock signal and the read signal is temporarily latched in shift register 8602, and will be issued therefrom with a delay by clocks corresponding to the latency in the read operation. This output from shift register 8602 is applied to a switch circuit 8608 through switch circuit 8604 and an inverter 8606 for interrupting the connection of DQ blocks 8000 and 8400 to data I/O terminal DQ.

The value of the latency in this state is set, e.g., by the mode register, and corresponds to, e.g., two clocks.

In FIG. 37, shift register 8601 has the structure in which only one set of latencies is determined. However, a structure allowing selection from several values of latency can be employed as shown in FIG. 16.

According to the above structure, it is possible to provide the synchronous semiconductor memory device allowing switching between the DDR-SDRAM and SDR-SDRAM operation modes, which employ different data masking manners, respectively, on the same chip.

[Embodiment 5]

In the foregoing embodiment 4 shown in FIG. 37, the write mask clock controls supply of the predecode signal to the memory array, e.g., in the DDR-SDRAM operation mode. In view of a margin of the control operation time in the above operation, it is desired that the phase of write mask clock MSCLK precedes the phase of write clock WCLK1 controlling the write operation to a certain extent.

Figure 38:
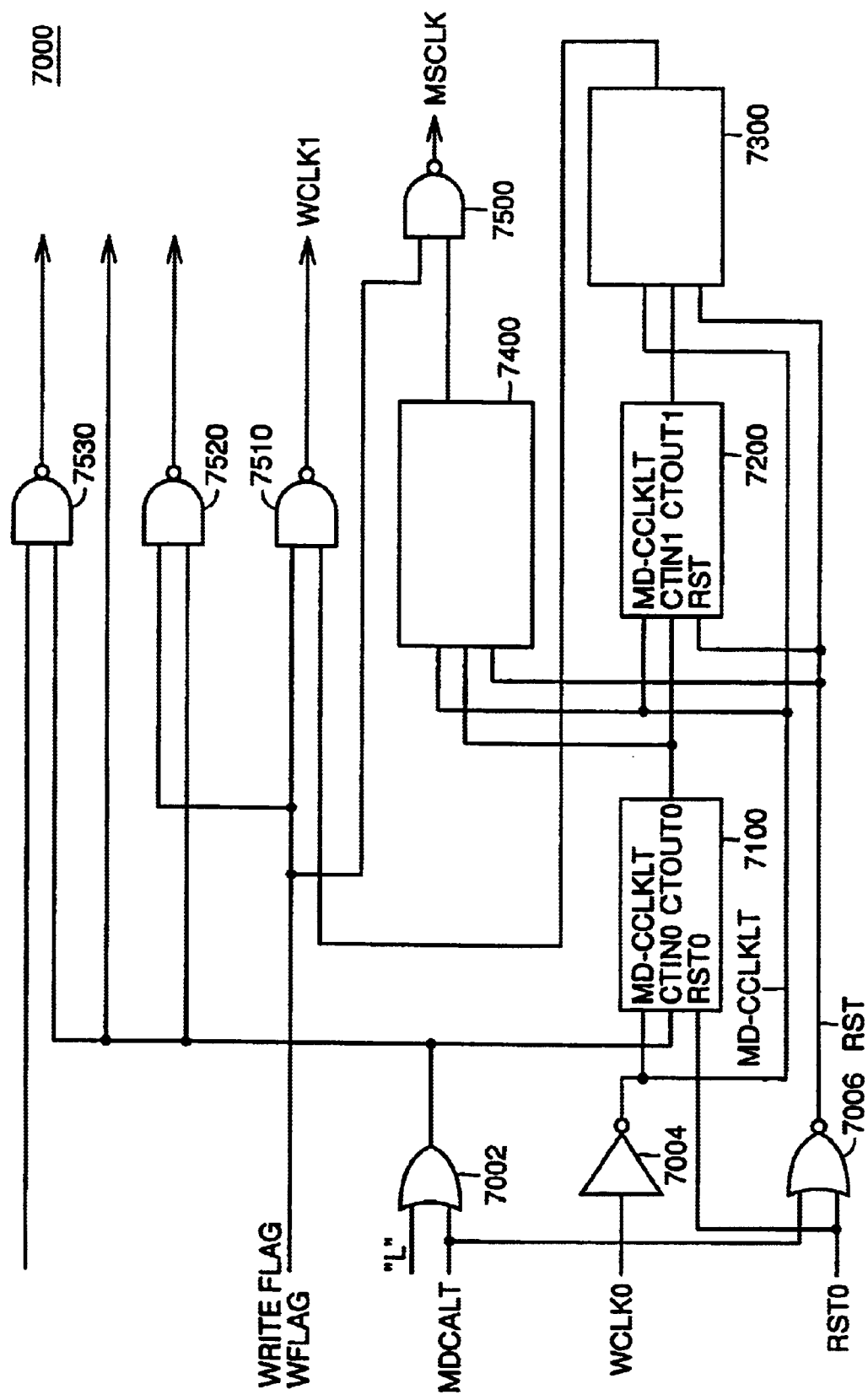
FIG. 38 is a schematic block diagram showing a structure of a write clock control circuit 7000.

FIG. 38 is a schematic block diagram showing a structure of a write clock control signal 7000, which is controlled in accordance with the timing of the same reference write clock WCLK0, and thereby produces write clock WCLK1 and mask clock MSCLK which has the phase preceding write clock WCLK1.

Write clock control circuit 7000 includes an OR circuit 7002 which receives on one of its inputs an access instructing signal MD-CALT produced in accordance with an externally supplied control signal, an inverter circuit 7004 which receive signal WCLK0, and issues clock signal MD-CCLKLT, an NOR circuit 7006 which receives on one and the other of its inputs a signal MD-CALT and a reset signal RST0, respectively, and issues a reset signal RST, a shift circuit 7100 which is controlled by clock signal MD-CCLKLT and reset signal RST, and shifts the output signal of NOR circuit 7002, a first timing control circuit 7300 which issues clock signal MD-CCLKLT in accordance with the output of shift circuit 7200, an NAND circuit 7510 which receives the output of first timing control circuit 7300, and issues signal WCLK1, a second timing control circuit 7400 which delays clock signal MD-CCLKLT by a predetermined time, and issues the same in accordance with the output of shift circuit 7100, and an NAND circuit 7510 which receives the output of second timing control circuit 7400 and write flag WFLAG, and issues signal WCLK1.

Figure 39:
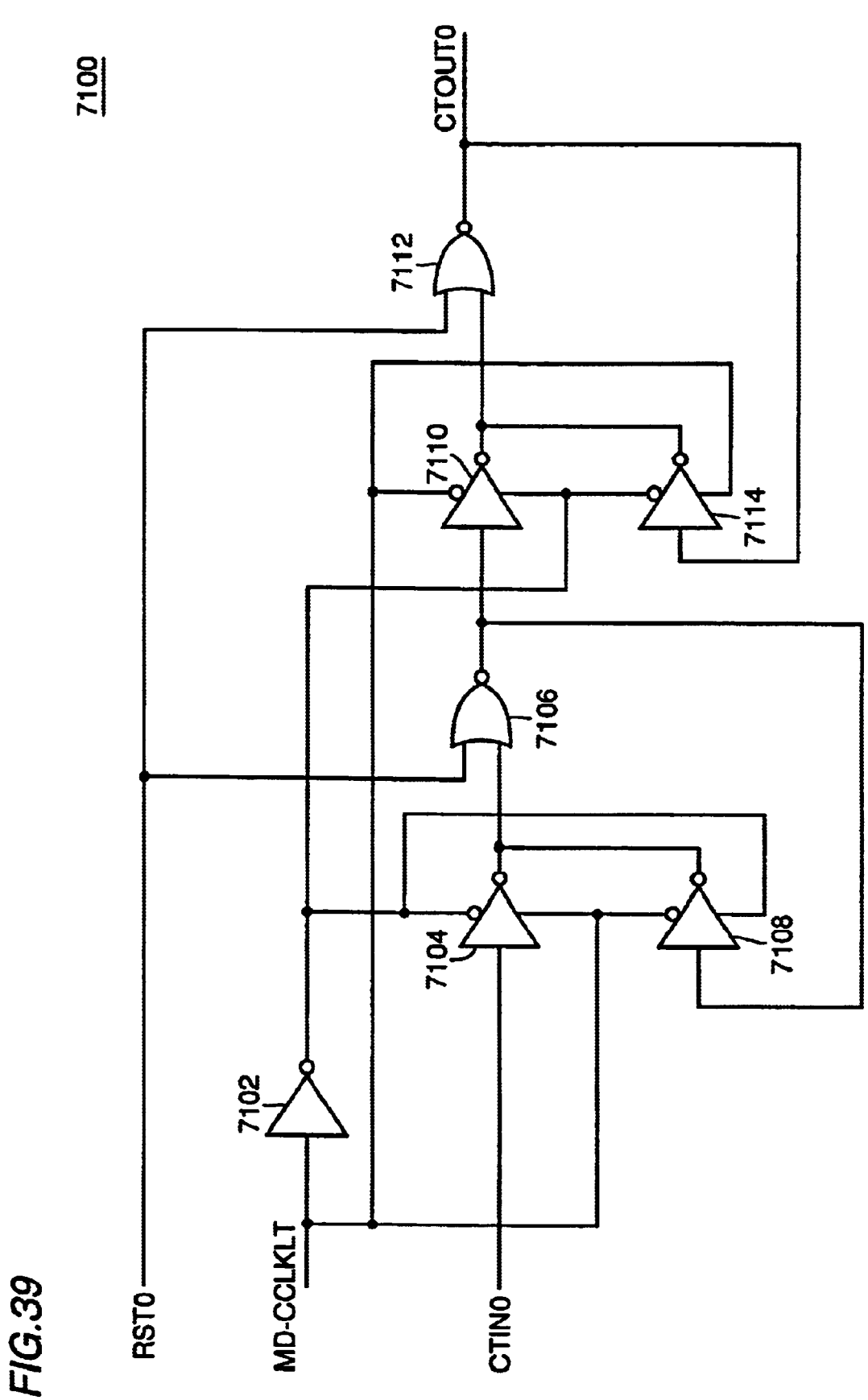
FIG. 39 is a circuit diagram showing a structure of a shift circuit 7100.

FIG. 39 is a circuit diagram showing a structure of shift circuit 7100 shown in FIG. 38.

Shift circuit 7100 includes an inverter 7102 receiving clock signal MD-CCLKLT, a clocked inverter 7104 which receives, as a signal CTIN0, the output of NOR circuit 7002, and is controlled by clock signal MD-CCLKLT and the output of inverter 7102, the output of clocked inverter 7104, an NOR circuit 7106 which receives on one and the other of its inputs the output of clocked inverter 7104 and reset signal RST0, respectively, a clocked inverter 7108 which receives the output of NOR circuit 7106, is controlled by clock signal MD-CCLKLT and the output of inverter 7102, and sends its output to the one of input nodes of NOR circuit 7106, a clocked inverter 7110 which receives the output of NOR circuit 7106, and is controlled by clock signal MD-CCLKLT and the output of inverter 7102, an NOR circuit 7112 which receives on one and the other of its inputs the output of clocked inverter 7110 and reset signal RST0, respectively, and issues a signal CTOUT0, and an inverter 7114 which receives the output of NOR circuit 7112, and sends its output to the one of inputs of NOR circuit 7112 under the control by clock signal MD-CCLKLT and the output of inverter 7102.

The structure of shift circuit 7200 is similar to that of shift circuit 7100 except for signals received thereby, and therefore will not be described below.

Figure 40:
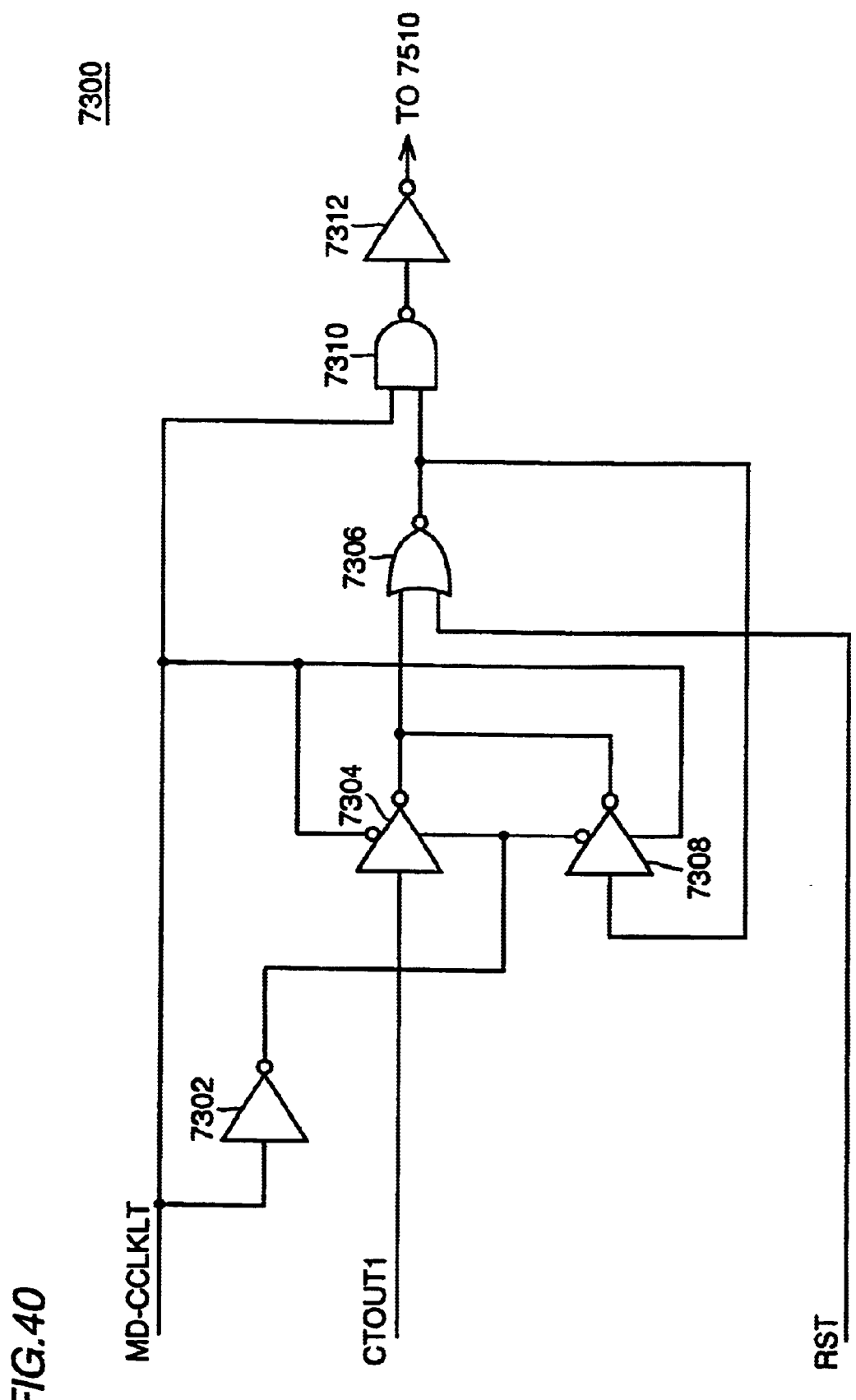
FIG. 40 is a circuit diagram showing a structure of a first timing control circuit 7300.

FIG. 40 is a circuit diagram showing a structure of first timing control circuit 7300 shown in FIG. 38.

First timing control circuit 7300 includes an inverter 7302 receiving clock signal MD-CCLKLT, a clocked inverter 7304 which receives an output signal CTOUT1 of shift circuit 7200, and is controlled by clock signal MD-CCLKLT and the output of inverter 7302, an NOR circuit 7306 which receives on one and the other of its inputs the output of clocked inverter 7304 and reset signal RST, respectively, a clocked inverter 7308 which receives the output of NOR circuit 7306, and sends its output to the one of inputs of NOR circuit 7306 under the control by clock signal MD-CCLKLT and the output of inverter 7302, an NAND circuit 7310 which receives clock signal MD-CCLKLT on one of its input, and also receives the output of NOR circuit 7366 on the other input, and an inverter 7312 which receives the output of NAND circuit 7310, and applies an inverted signal thereof to NAND circuit 7510.

Figure 41:
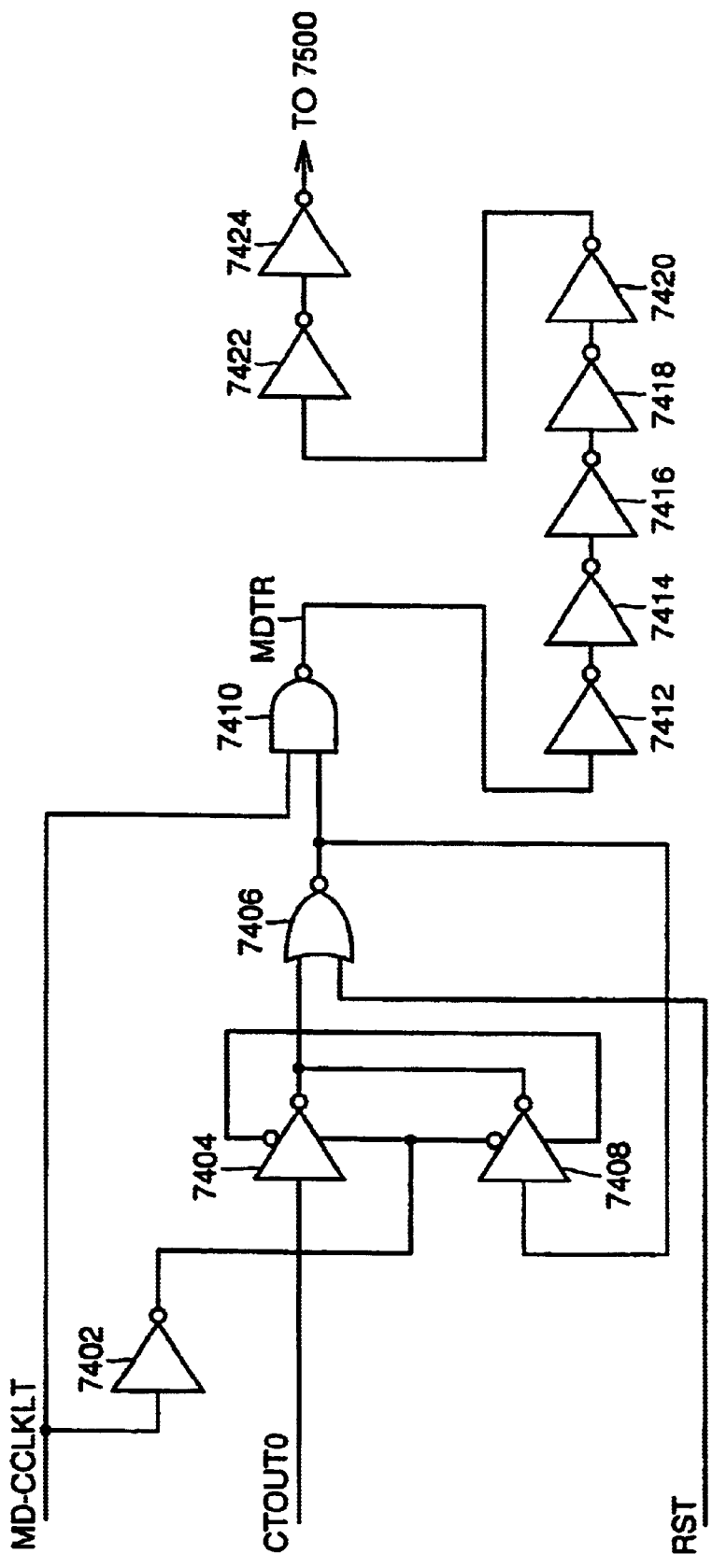
FIG. 41 is a circuit diagram showing a structure of a second timing control circuit 7400.

FIG. 41 is a circuit diagram showing a structure of second timing control circuit 7400 shown in FIG. 38.

Second timing control circuit 7400 includes an inverter 7402 receiving clock signal MD-CCLKLT, a clocked inverter 7404 which receives output signal CTOUT0 of shift circuit 7100, and is controlled by clock signal MD-CCLKLT and the output of inverter 7402, an NOR circuit 7406 which receives on one and the other of its inputs the output of clocked inverter 7404 and reset signal RST, respectively, a clocked inverter 7408 which receives the output of NOR circuit 7406, and sends its output to the one of inputs of NOR circuit 7406 under the control by clock signal MD-CCLKLT and the output of inverter 7402, an NAND circuit 7410 which receives clock signal MD-CCLKLT on one of its input, and also receives the output of NOR circuit 7406 on the other input, and seven inverters 7412–7424 connected in series such that an output signal MDTR of NAND circuit 7410 is received by first internal voltage 7412, is successively inverted by the following inverters, and is supplied to an NAND circuit 7500 from last inverter 7424.

Figure 42:
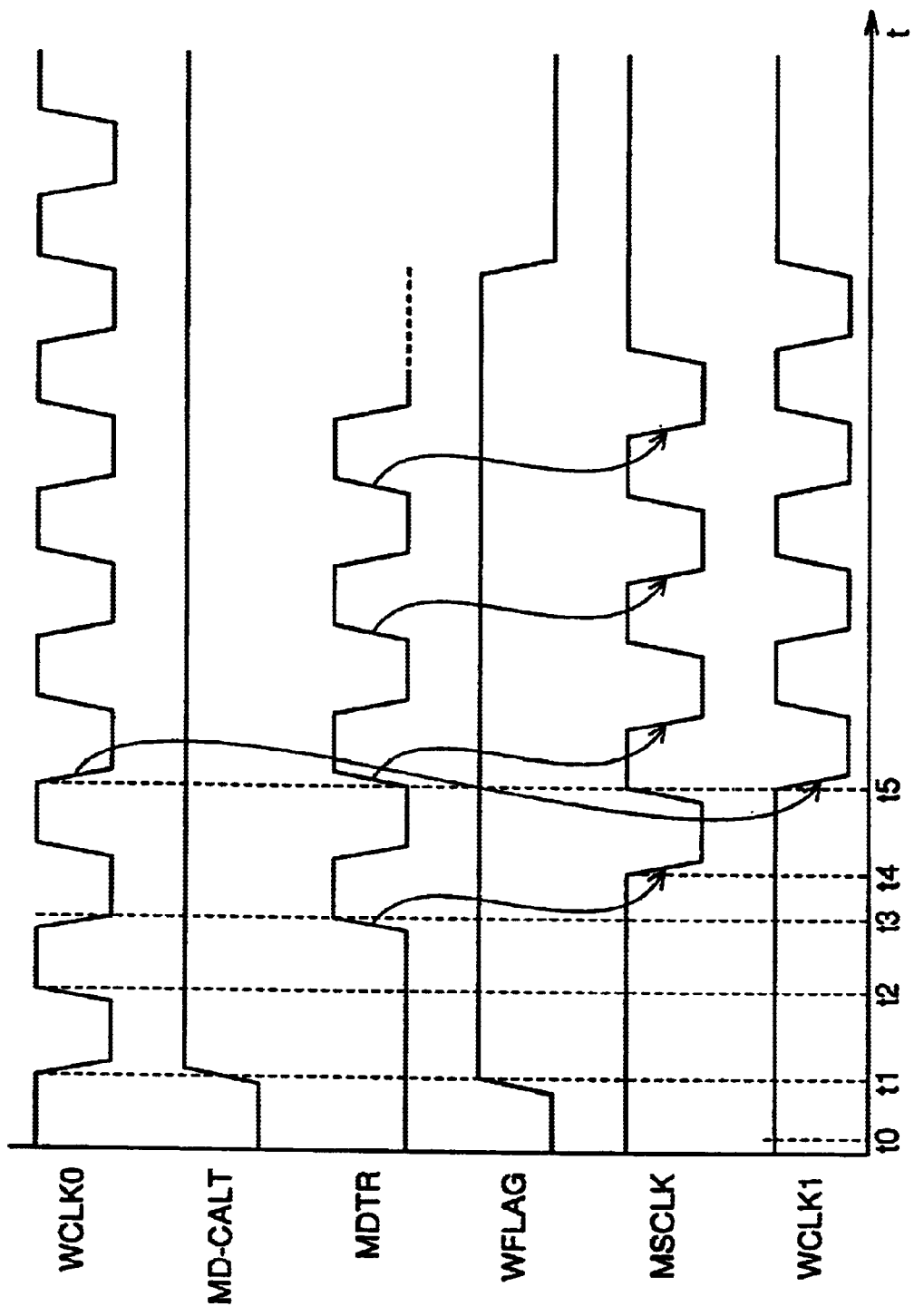
FIG. 42 is a timing chart showing an operation of the write clock control circuit 7000.

FIG. 42 is a timing chart showing the operation of write clock control circuit 7000 shown in FIG. 38.

Before time t0 in FIG. 42, signal RST0 was active (at "H" level) and thereby reset the outputs of NOR circuits 7106 and 7112 in shift circuit 7100. At time t0, signal RST0 is at "L" level. Signal MD-CALT is inactive (at "L" level) at time t0. In response to this, the output of NOR circuit 7006 attains "H" level, and shift circuit 7200 as well as first and second timing control circuits 7300 and 7400 are reset.

More specifically, in first timing control circuit 7300, the output level of NOR circuit 7306 is reset to "L" level, and thereby the output level of NAND circuit 7310 is reset to "H" level. Thereby, the output level of NAND circuit 7510 is reset to "H" level.

In second timing control circuit 7400 the output level of NOR circuit 7406 is reset to "L" level, and thereby the output level of NAND circuit 7410 is reset to "H" level. Thereby, the output level of NAND circuit 7500 is reset to "H" level.

At time t1, write flag WFLAG becomes active ("H" level), and signal MD-CALT also becomes active ("H" level). In response to this, reset signal RST of the output of NOR circuit 7006 attains "L" level. On the other hand, the output of OR circuit 7002 attains "H" level, and the output signal of inverter 7004, i.e., clock signal MD-CCLKLT attains "H" level. Thereby, the output of clocked inverter 7104 in shift circuit 7100 attains "L" level, and the output of NOR circuit 7106 attains "H" level. However, clocked inverter 7110 is inactive. Therefore, the input level of NOR circuit 7112 does not change even when the output level of NOR circuit 7106 changes.

At time t2, clock signal WCLK0 attains "H" level, and clock signal MD-CCLKLT attains "L" level. In response to this, clocked inverter 7110 in shift circuit 7100 becomes active, and the output of NOR circuit 7112, i.e., signal CTOUT0 attains "H" level. In response to signal CTOUT0, the output of clocked inverter 7404 in second timing control circuit 7400 attains "L" level, and the output of NOR circuit 7406, which was reset to "L" level at time t0, is set to "H" level. At this point of time, the output of NAND circuit 7410 is at "L" level.

At time t3, signal WCLK0 changes to "L" level. In response to this, signal MDTR, i.e., the output of NAND circuit 7410 in second timing control circuit 7400 attains "H" level. In response to this, mask clock signal MSCLK attains "L" level at time t4. Thereafter, an inverted signal of clock signal MD-CCLKLT is issued as signal MDTR, and mask clock signal MSCLK is issued while write flag WFLAG is active.

The number of inverters 7412–7424 is determined such that the phase of mask clock signal MSCLK precedes the phase of clock signal WCLK1, e.g., by 0.5 clocks.

At time t5 when clock signal WCLK0 attains "L" level, the output of inverter 7312 changes to "H" level in response to the fact that the output level of NOR circuit 7306 in first timing control circuit 7300 is at "H" level. In response to this change, write clock signal WCLK1 which is the output of NAND circuit 7510 attains "L" level.

Thereafter, write clock signal WCLK1 is issued in accordance with clock signal MD-CCLKLT, i.e., signal WCLK0 while write flag WFLG is active. Owing to the above structure, it is possible to produce mask clock signal MSCLK having the phase preceding that of clock signal WCLK1 controlling the write operation.

By using mask clock signal MSCLK described above, more reliable write mask operation can be ensured, e.g., in the DDR-SDRAM operation.

[Embodiment 6]

A following structure may be employed for operation in the mode switchable between the SDR-SDRAM and DDR-SDRAM operation modes.

Figure 43:
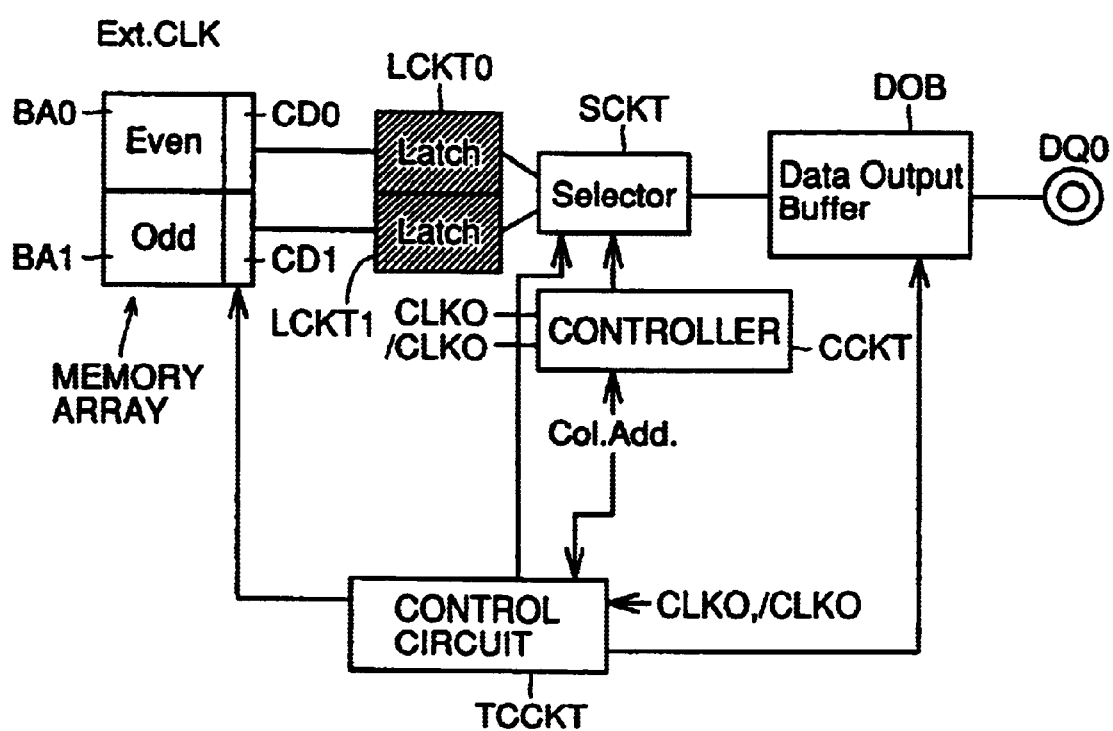
FIG. 43 conceptually shows a structure of an SDRAM which can operate with a switchable operation mode.

FIG. 43 shows a structure of an SDRAM which can operate in the switchable operation mode.

It is assumed that one data I/O terminal DQ0 corresponds to two banks BA0 and BA1. It is also assumed that the data read from bank BA0 is held in a latch circuit LCKT0, and the data read from bank BA1 is held in a latch circuit LCKT1.

The data held in latch circuits LCKT0 and LCKT1 is selectively applied to data output buffer DOB by a selector circuit SCKT, which is controlled by a controller CCKT, and is sent from data output buffer DOB to corresponding data I/O terminal DQ0. The structure shown in FIG. 43 is provided for each of the plurality of data I/O terminals.

Each of latch circuits LCKT0 and LCKT1 has a capacity of, e.g., 4 bits. By one select operation, therefore, data of 4×2 bits is read from memory cells of (4+4) in number selected by column decoders CD0 and CD1 which are provided correspondingly to banks BA0 and BA1, respectively.

The whole operation of the SDRAM is controlled by a control circuit TCCKT.

Figure 44:
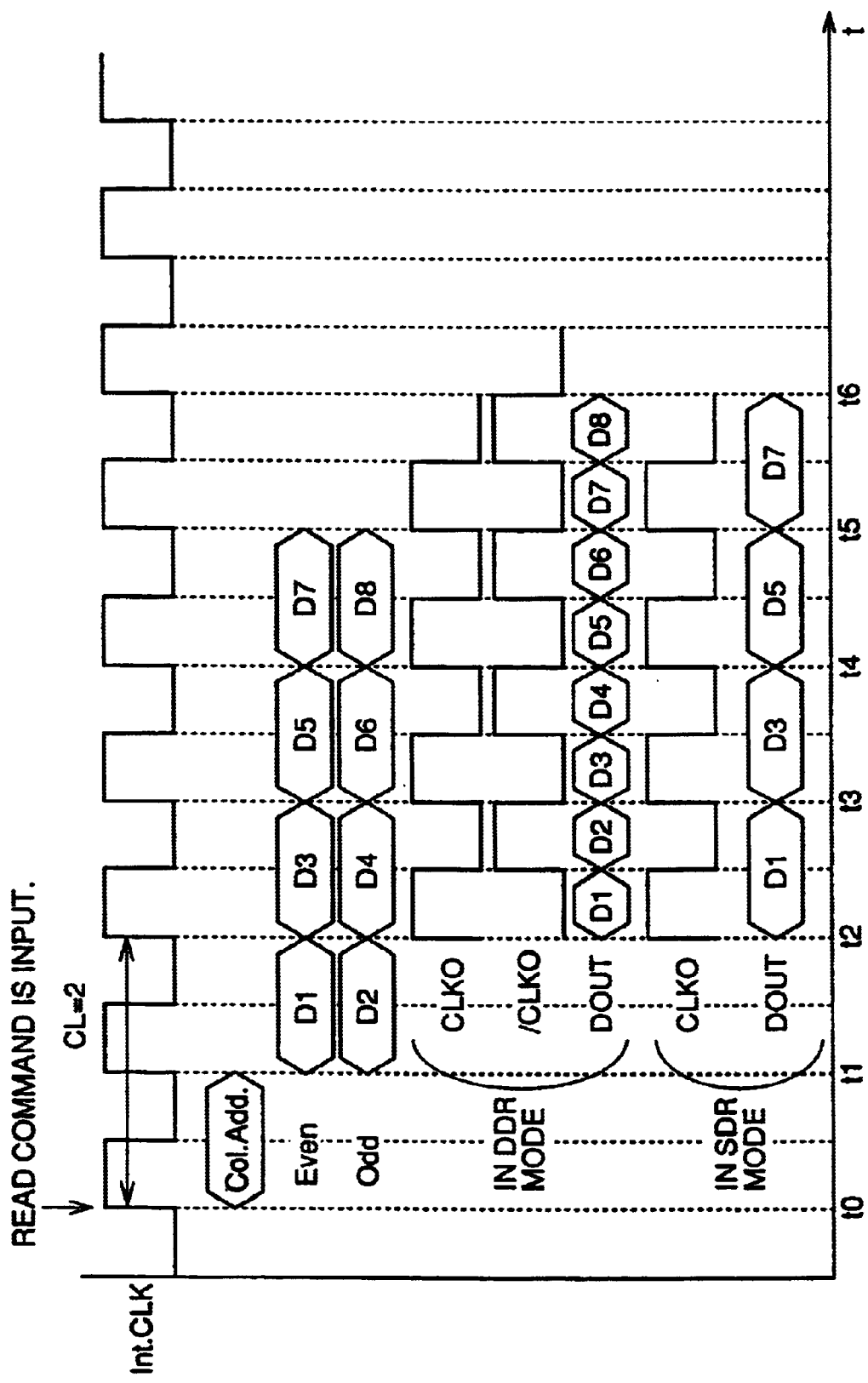
FIG. 44 is a timing chart showing the operation of the SDRAM shown in FIG. 43.

FIG. 44 is a timing chart showing the operation of the SDRAM shown in FIG. 43.

At time t0, the read command is applied. Since the latency in the read operation is 2, the data output starts at time t2.

In this case, data is read from each of banks BA0 and BA1 at time t1.

In the DDR-SDRAM operation mode, controller CCKT operates in synchronization with the activation edges of complementary clock signals CLK0 and /CLK0 and therefore with double the frequency of the clock signal, and controls select circuit SCKT to select alternately the data held in latch circuits LCKT0 and LCKT1 in accordance with the order corresponding to address signal Col.Add.

In the SDR-SDRAM operation mode, controller CCKT operates in synchronization with the activation edge of one (i.e., clock signal CLK0) of complementary clock signals CLK0 and /CLK0 and therefore with the same frequency as the clock signal, and controls the select circuit SCKT to select the data held in one of latch circuits LCKT0 and LCKT1 in accordance with the bank selected between two banks by address signal Col.Add.

Figure 45:
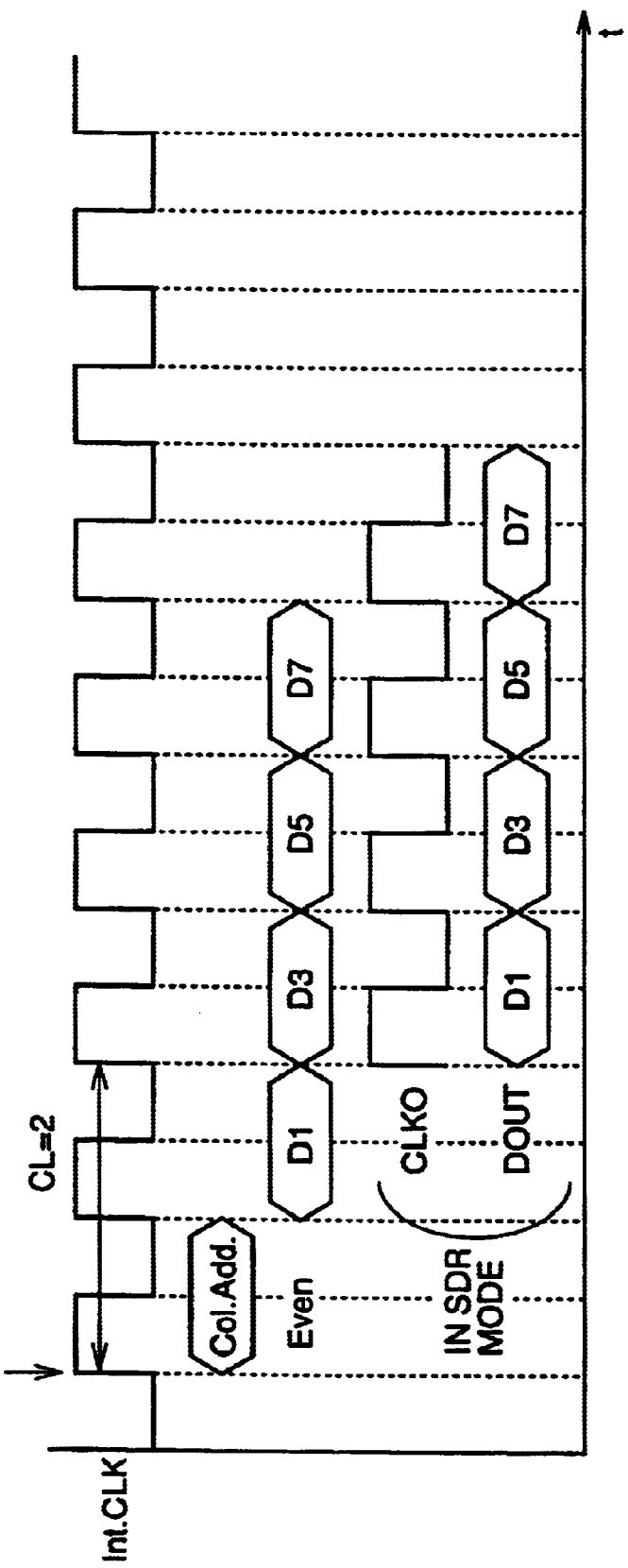
FIG. 45 is a timing chart showing another manner of operation control in the SDR-SDRAM operation mode.

FIG. 45 is a timing chart showing another operation control in the SDR-SDRAM operation mode of the SDRAM shown in FIG. 43. In the example shown in FIG. 44, the read data which will not be output is transmitted to one of latch circuits LCKT0 and LCKT1, when the device operates as the SDR-SDRAM. However, transmission of the data, which will not be output, to the latch circuit consumes the power, and therefore is not preferable from the viewpoint of reduction in power consumption of the circuits. In the operation shown in FIG. 45, therefore, the column decoder CD0 or CD1 of the bank, which is not selected in accordance with the address signal, is not activated in the SDR-SDRAM operation mode. For example, such a structure may be employed that control circuit TCCKT in FIG. 43 selectively activates column decoders CD0 and CD1 in accordance with address signal Col.Add.

Figure 46:
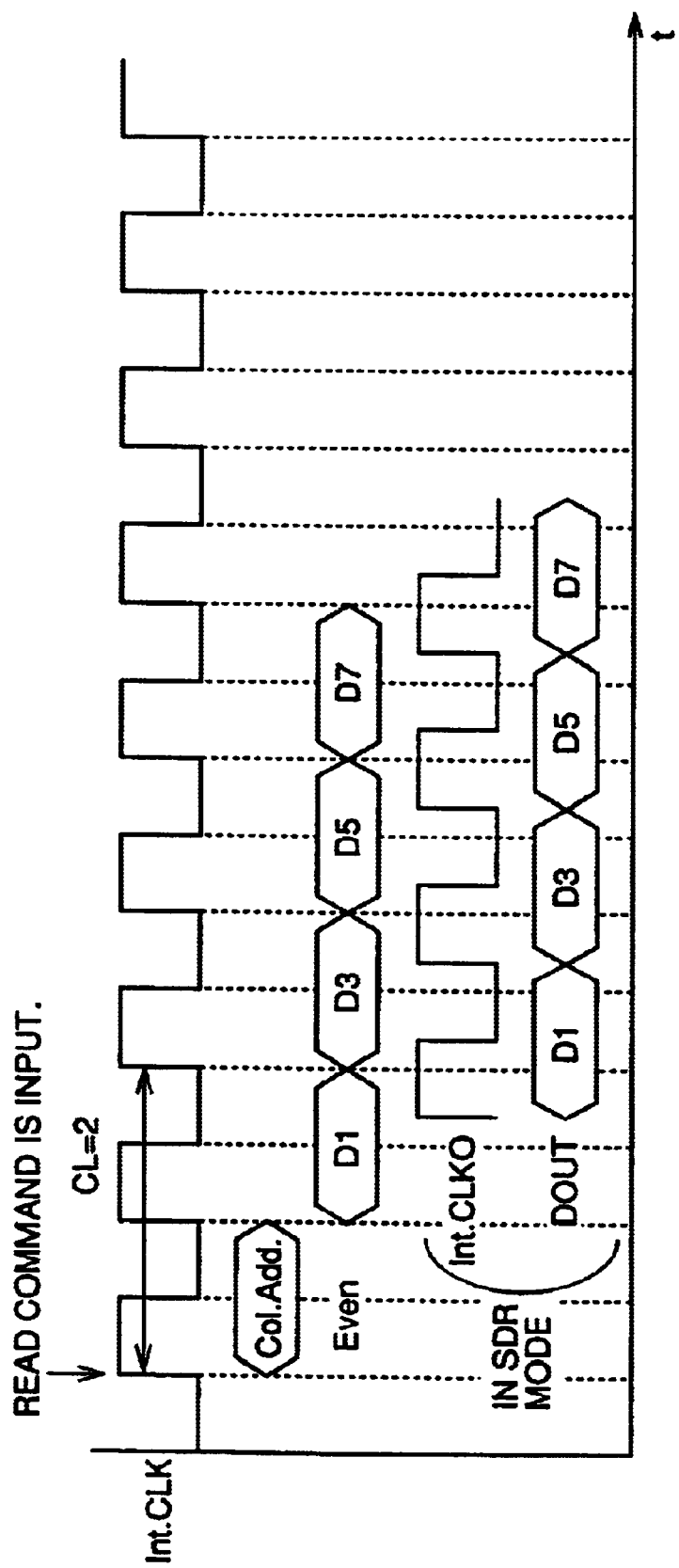
FIG. 46 is a timing chart showing timing of data output.

FIG. 46 is a timing chart showing still another example of the timing of data output. According to the structure for this operation, control circuit TCCKT internally produces an internal clock signal int.CLK0 having a phase slightly preceding clock signal CLK0, and select circuit SCKT controls data output buffer DOB so that the data is already sent to the data input terminal at the time of CAS latency of 2.

Figure 47:
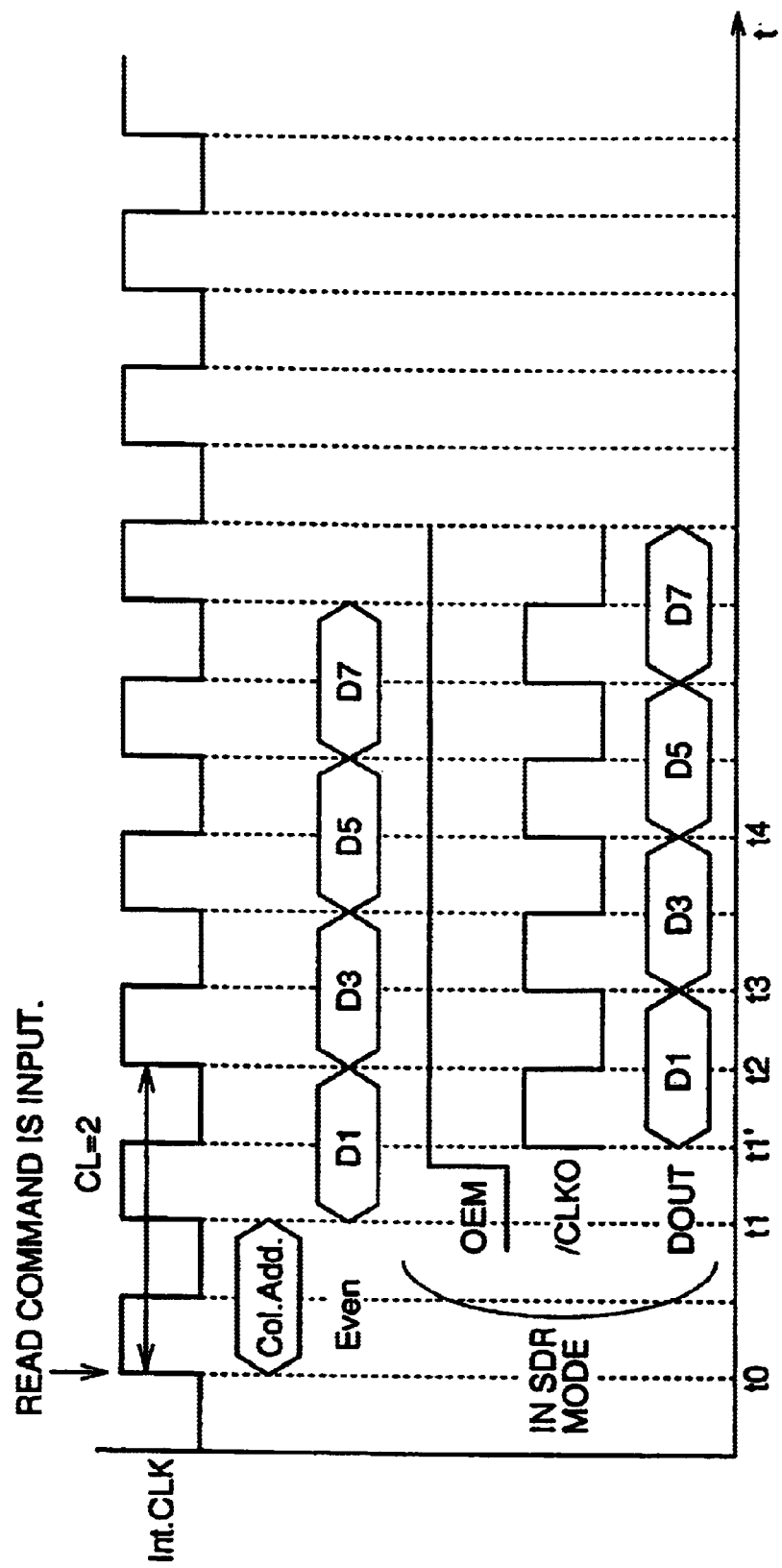
FIG. 47 is a timing chart showing another example of timing of data output.
Figure 48:
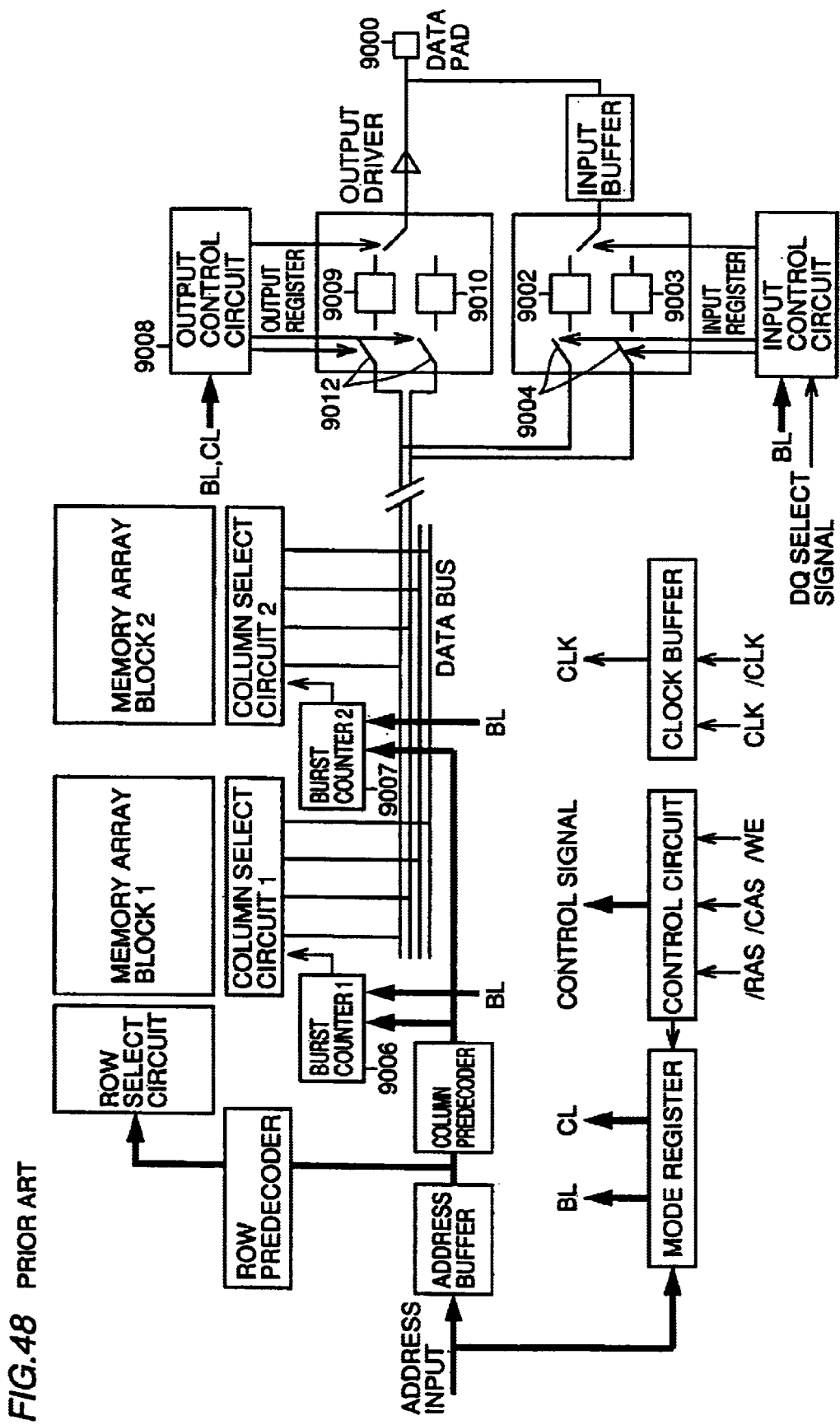
FIG. 48 is a block diagram showing by way of example a DDR-SDRAM in the prior art.

FIG. 47 is a timing chart showing yet another example of data output timing. According to the structure for this operation, clock signal /CLK0 is used as the clock signal for controlling select circuit SCKT within control circuit TCCKT, and data output starts at time t1' so that the data is already sent to the data input terminal at the time of CAS latency of 2. In this operation, a signal OEM which activates data output buffer DOB is activated half a clock or more before time t2.

Thus, the operation of reading the data from memory cells starts at time t1 in synchronization with clock signal CLK0, and the operation of outputting the data to the data I/O terminal starts at time t1' in synchronization with clock signal /CLK0.

The above structures can likewise allow the operation with the mode switchable between the SDR-SDRAM operation mode and the DDR-SDRAM operation mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array having a plurality of memory cells arranged in rows and columns;
   a clock input circuit having clock input terminal for receiving an external clock signal;
   a control circuit for controlling read/write operation timing of said semiconductor memory device by outputting a column selection control signal, said control circuit selecting one of delay periods and delaying activation of said column selection control signal by the selected delay period from activation of write command;
   a column select circuit, in response to said column selection control signal, for selecting one of memory cell columns according to an address signal;
   a gate circuit for transmitting data to/from the selected memory cell column;
   a data input circuit for receiving write data to transmit said write data to said gate circuit; and
   a data output circuit for receiving data from said gate circuit and outputting read data in synchronization with an output of said clock input circuit.

2. The semiconductor memory device according to claim 1, wherein said delay periods respectively correspond to multiples of a period of said external clock signal and multiples of half the period of said external clock signal.

3. The semiconductor memory device according to claim 1, further comprising a mode register for holding information on write delay, wherein
   said control circuit selects one of said delay periods based on the information held in said mode register.

4. The semiconductor memory device according to claim 1, wherein
   said memory cell array includes
   a plurality of bit lines respectively provided corresponding to said memory cell columns, and
   a plurality of data lines for transmitting data to/from said bit lines, and
   said gate circuit includes a transmission circuit for selectively connecting one of said bit line to one of said data line according to said column selection control signal.

* * * * *